United States Patent
Takafuji et al.

(10) Patent No.: US 7,508,034 B2
(45) Date of Patent: Mar. 24, 2009

(54) SINGLE-CRYSTAL SILICON SUBSTRATE, SOI SUBSTRATE, SEMICONDUCTOR DEVICE, DISPLAY DEVICE, AND MANUFACTURING METHOD OF SEMICONDUCTOR DEVICE

(75) Inventors: Yutaka Takafuji, Nara (JP); Takashi Itoga, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/668,186

(22) Filed: Sep. 24, 2003

(65) Prior Publication Data

US 2004/0061176 A1 Apr. 1, 2004

(30) Foreign Application Priority Data

Sep. 25, 2002 (JP) ............................. 2002-280078
Oct. 11, 2002 (JP) ............................. 2002-299577
Mar. 12, 2003 (JP) ............................. 2003-067109

(51) Int. Cl.
*H01L 21/00* (2006.01)
(52) U.S. Cl. ............................. 257/347; 257/66; 257/59
(58) Field of Classification Search ................. 257/347, 257/66, 59
See application file for complete search history.

(56) References Cited

U.S. PATENT DOCUMENTS

| | | | | | |
|---|---|---|---|---|---|
| 4,081,290 | A | * | 3/1978 | Bachmann et al. | 136/258 |
| 4,396,690 | A | * | 8/1983 | Gordon et al. | 429/111 |
| 4,400,451 | A | * | 8/1983 | Gordon | 429/111 |
| 5,374,564 | A | | 12/1994 | Bruel | |
| 5,605,598 | A | * | 2/1997 | Greiff | 438/50 |
| 5,637,187 | A | | 6/1997 | Takasu et al. | |
| 5,663,099 | A | * | 9/1997 | Okabe et al. | 438/642 |
| 5,725,729 | A | * | 3/1998 | Greiff | 438/50 |
| 5,760,305 | A | * | 6/1998 | Greiff | 73/514.15 |
| 5,909,627 | A | | 6/1999 | Egloff | |
| 5,969,250 | A | * | 10/1999 | Greiff | 73/514.38 |

(Continued)

FOREIGN PATENT DOCUMENTS

JP  4-362924  12/1992

(Continued)

OTHER PUBLICATIONS

Salemo, Conference Recors of the 1994 Int'l Display Research Conf. & Int'l Workshops on Active-Matrix LCDs & Display Materials, pp. 39-44 (19940.

(Continued)

*Primary Examiner*—Laura M Menz
(74) *Attorney, Agent, or Firm*—Birch, Stewart, Kolasch & Birch, LLP

(57) ABSTRACT

A semiconductor device of the present invention is arranged in such a manner that a MOS non-single-crystal silicon thin-film transistor including a non-single-crystal silicon thin film made of polycrystalline silicon, a MOS single-crystal silicon thin-film transistor including a single-crystal silicon thin film, and a metal wiring are provided on an insulating substrate. With this arrangement, (i) a semiconductor device in which a non-single-crystal silicon thin film and a single-crystal silicon thin-film device are formed and high-performance systems are integrated, (ii) a method of manufacturing the semiconductor device, and (iii) a single-crystal silicon substrate for forming the single-crystal silicon thin-film device of the semiconductor device are obtained.

24 Claims, 17 Drawing Sheets

U.S. PATENT DOCUMENTS

| | | | |
|---|---|---|---|
| 6,067,062 A | 5/2000 | Takasu et al. | |
| 6,140,210 A | 10/2000 | Aga et al. | |
| 6,157,421 A | 12/2000 | Ishii | |
| 6,191,007 B1 | 2/2001 | Matsui et al. | |
| 6,245,645 B1 | 6/2001 | Mitani et al. | |
| 6,247,369 B1 * | 6/2001 | Chapman et al. | 73/726 |
| 6,613,678 B1 | 9/2003 | Sakaguchi et al. | |
| 6,646,287 B1 * | 11/2003 | Ono et al. | 257/66 |
| 7,119,365 B2 * | 10/2006 | Takafuji et al. | 257/59 |
| RE39,484 E | 2/2007 | Bruel | |
| 2001/0016401 A1 | 8/2001 | Mitani et al. | |
| 2002/0100941 A1 | 8/2002 | Yonehara et al. | |
| 2002/0102758 A1 | 8/2002 | Yonehara et al. | |
| 2003/0183876 A1 * | 10/2003 | Takafuji et al. | 257/347 |
| 2004/0053451 A1 * | 3/2004 | Ono et al. | 438/151 |
| 2004/0061176 A1 * | 4/2004 | Takafuji et al. | 257/347 |
| 2005/0202595 A1 | 9/2005 | Yonehara et al. | |
| 2006/0113597 A1 * | 6/2006 | Ono et al. | 257/347 |
| 2007/0063281 A1 * | 3/2007 | Takafuji et al. | 257/347 |

FOREIGN PATENT DOCUMENTS

| | | | |
|---|---|---|---|
| JP | 5-211128 A | | 8/1993 |
| JP | 5-211128 A | | 8/1993 |
| JP | 06-011729 | * | 1/1994 |
| JP | 6-268183 A | | 9/1994 |
| JP | 6-268183 A | | 9/1994 |
| JP | 7-320994 A | | 12/1995 |
| JP | 10-293322 A | | 11/1998 |
| JP | 11-024106 | | 1/1999 |
| JP | 11-163363 A | | 6/1999 |
| JP | 2000-30996 A | | 1/2000 |
| JP | 2000-30996 A | | 1/2000 |
| JP | 2001-028354 A | | 1/2001 |
| JP | 2001-210832 A | | 8/2001 |
| JP | 2001-255559 | | 9/2001 |
| JP | 2002-217417 A | | 8/2002 |
| JP | 2002-229473 A | | 8/2002 |
| JP | 2002-231909 | | 8/2002 |
| JP | 2002-244587 | | 8/2002 |
| KR | 1999-030065 A | | 4/1999 |
| KR | 1999-0088324 A | | 12/1999 |
| WO | 93-15589 A1 | | 8/1993 |
| WO | WO 93/15589 | * | 9/1993 |

OTHER PUBLICATIONS

Tong et al., "Semiconductor Wafer Bonding: Science and Technology", pp. 234-237 (1999).

Warner et al., 2002 IEEE Int'l SOI Conference Proceedings, pp. 123-125 (2002).

Allen et al., 2002 IEEE Int'l SOI Conference Proceddings, pp.192-193 (2002).

Landau et al., "Theory of Wlasticity (Landau0Lifshitz Curriculm for Theoretical Physics0", pp. 62-63.

* cited by examiner

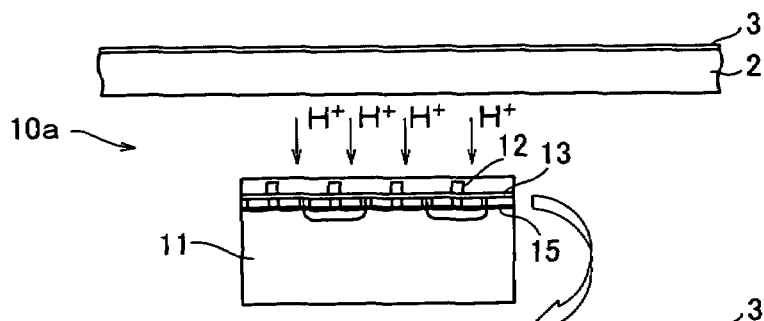
FIG. 1 (a)
FIG. 1 (b)
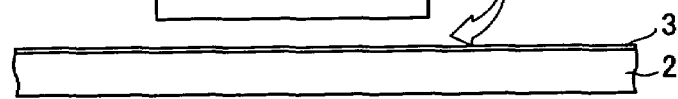
FIG. 1 (c)
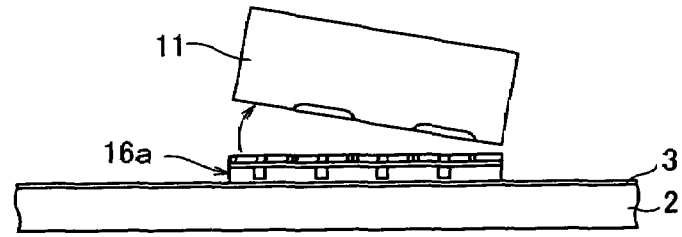
FIG. 1 (d)
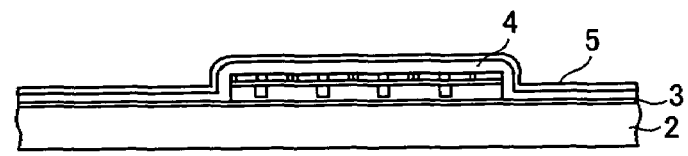
FIG. 1 (e)
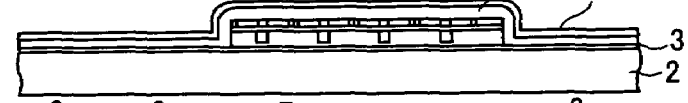
FIG. 1 (f)
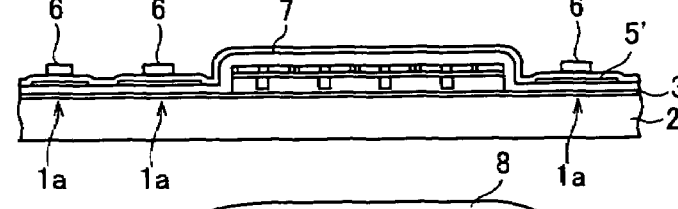
FIG. 1 (g)
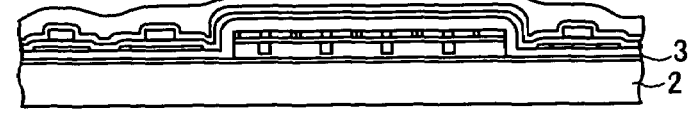
FIG. 1 (h)
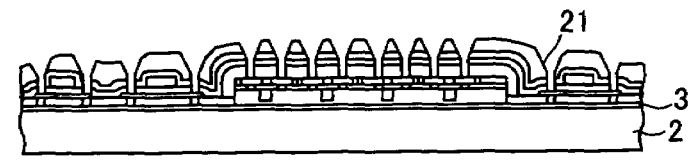
FIG. 1 (i)
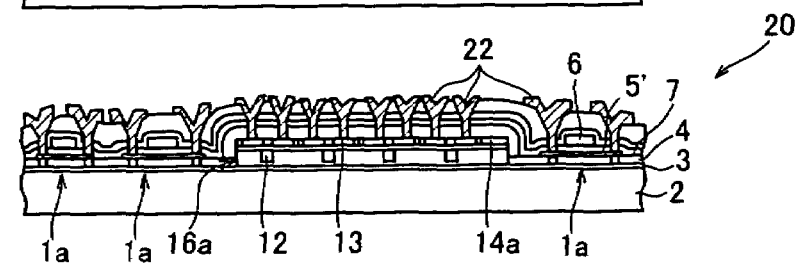

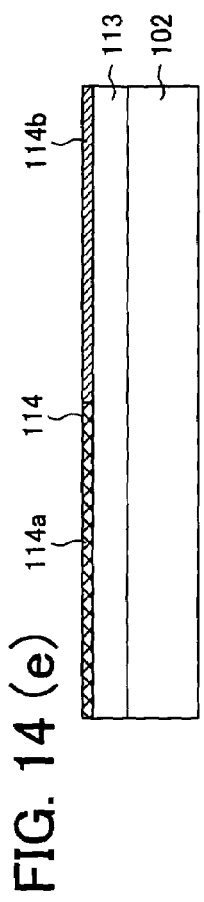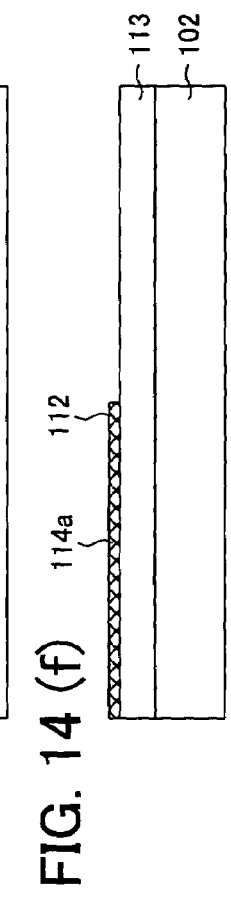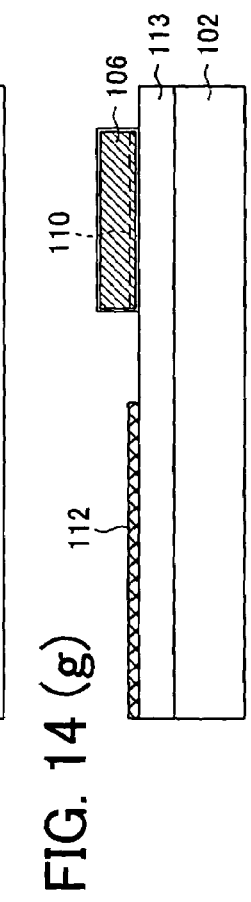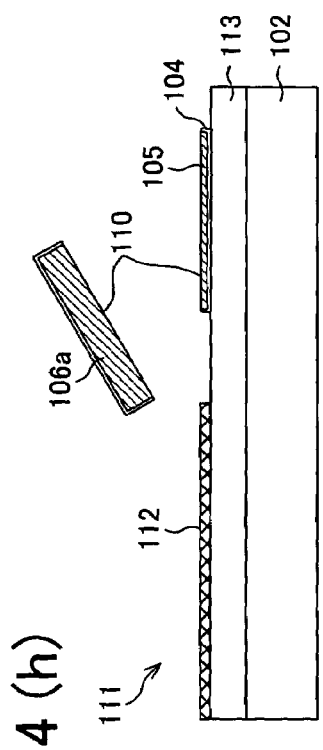
FIG. 14 (e)
FIG. 14 (f)
FIG. 14 (g)
FIG. 14 (h)
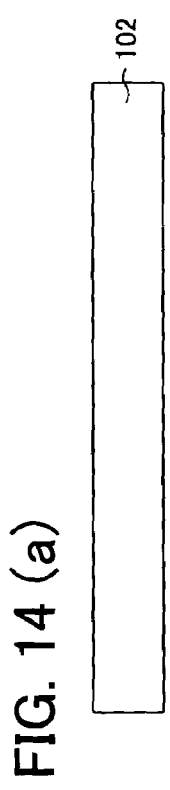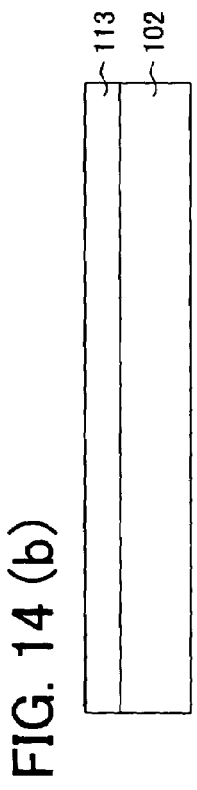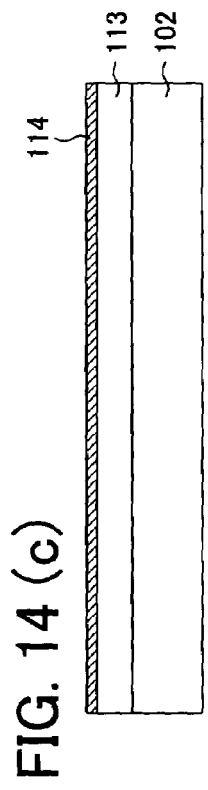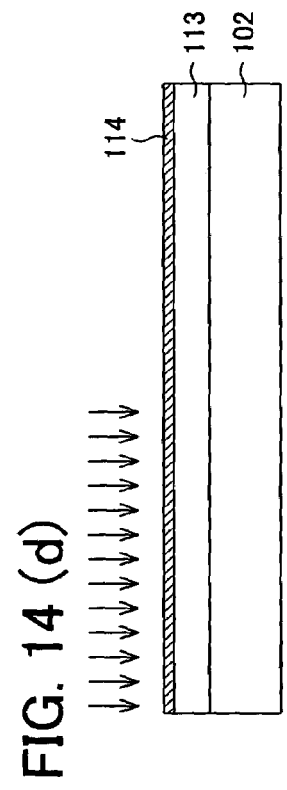
FIG. 14 (a)
FIG. 14 (b)
FIG. 14 (c)
FIG. 14 (d)

SINGLE-CRYSTAL SILICON SUBSTRATE, SOI SUBSTRATE, SEMICONDUCTOR DEVICE, DISPLAY DEVICE, AND MANUFACTURING METHOD OF SEMICONDUCTOR DEVICE

FIELD OF THE INVENTION

The present invention relates to a semiconductor device for improving circuit performances of devices such as an active matrix liquid crystal display device driven by TFT, in which a peripheral drive circuit and a control circuit are integrated on a single substrate, a manufacturing method of the semiconductor device, and a single-crystal silicon substrate used in the process of manufacturing the semiconductor device. Further, the present invention relates to an SOI (Silicon On Insulator) substrate, a display device, and a manufacturing method of a semiconductor device, and particularly relates to (i) an SOI substrate including a single-crystal silicon thin film which is obtained by bonding a single-crystal silicon piece, to which hydrogen ions are implanted, with a substrate, and dividing the substrate with the single-crystal silicon piece at a layer to which the hydrogen ions are implanted, (ii) a display device using the SOI substrate, and (iii) a method of manufacturing a semiconductor device using the SOI substrate.

BACKGROUND OF THE INVENTION

There have been conventional liquid crystal display devices in which a thin-film transistor (hereinafter, TFT) made of amorphous silicon (hereinafter, a-Si) or polycrystalline silicon (hereinafter, P-Si) is formed on a glass substrate, which are used for driving liquid crystal display panels and organic EL panels, i.e. for performing active matrix drive.

In particular, liquid crystal display devices in which peripheral drives are integrated using p-Si that has high mobility and operates at a high speed have recently been used. Even so, a silicon device with improved performance is required for realizing system integration of devices such as an image processor and a timing controller which are required to have performance better than the above-mentioned peripheral devices.

This is because, when adopting P-Si, the mobility is decreased and an S (subthreshold) factor is increased due to localized states in a gap caused by the incompleteness of crystallinity and the deficiency around a grain boundary, so that the transistor does not have sufficient performance to form a high-performance silicon device.

Thus, to form a silicon device having higher performance, research has been done in which a device such as a thin-film transistor made of single-crystal silicon thin film is formed in advance, and then a semiconductor device is manufactured by bonding this thin-film transistor on an insulating substrate (e.g. WO93/15589 (published on Aug. 5, 1993), J. P. Salerno, "Single Crystal Silicon AMLCDs", Conference Record of the 1994 International Display Research Conference(IDRC) P. 39-44(1994), and Q.-Y. Tong & U. Gesele, "SEMICONDUCTOR WAFER BONDING: SCIENCE AND TECHNOLOGY", John Wiley & Sons, New York (1999)).

WO93/15589 teaches that, using a semiconductor device in which a single-crystal silicon thin-film transistor formed in advance using an adhesive is printed on a glass substrate, a display of a display panel of an active matrix liquid crystal display device is manufactured.

However, according to this conventional semiconductor device and the manufacturing method thereof, since the adhesive is used for bonding the single-crystal silicon thin-film transistor, which has high performance, with the glass substrate, the bonding operation is cumbersome and hinders the improvement of productivity. Further, being bonded using the adhesive, the semiconductor device has low heat resistance, and it is not possible to form high-quality members such as an inorganic insulating film and a TFT in the subsequent process. For this reason, on the occasion of manufacturing an active matrix substrate, it is necessary to form a device including a TFT array before bonding the device to a substrate, and this has been a great disadvantage in terms of a cost/size ratio and formation of a wiring.

Moreover, WO93/15589 only teaches that a single-crystal silicon thin film device is formed on a glass substrate, and according to this arrangement, it is not possible to manufacture a high-performance/high-quality semiconductor device which has been sought after.

K. Warner, et al., 2002 IEEE International SOI Conference: October, pp. 123-125 (2002) teaches that an aligning mark is detected over a silicon substrate by means of infrared light so that aligning is performed. However, with this arrangement, it is not possible to increase resolution due to long wavelength of the light, and hence high-precision aligning cannot be performed.

Further, L. P. Allen et al., 2002 IEEE International SOI Conference: October, pp. 192-193 (2002) teaches that a silicon on a BOX (Buried Oxide) is evenly etched by a halogen gas cluster ion beam (GCIB) made of about 1500 atoms, and a high-frequency component of surface roughness on the surface of the silicon is removed by GCIB using oxygen.

Now, another problem which has conventionally been known will be discussed. A thin-film transistor (TFT) technology relates to manufacture of a transistor by forming a semiconductor film such as a silicon film on, for instance, a light-transmitting amorphous material such as a glass substrate. This TFT technology has been developed in line with the diffusion of personal intelligent communicators using liquid crystal display panels.

In the TFT technology, a polysilicon (polycrystalline) film is formed by, for instance, melting an amorphous silicon film on a substrate by applying laser thereto. Then from this polysilicon film or amorphous silicon film, a MOS TFT as a switching element is manufactured.

In this manner, using a device (MOS TFT) made from a silicon film, display panels such as a liquid crystal display panel and organic EL panel are manufactured.

Then pixels of the display panel are driven in an active matrix manner by the MOS TFT.

This arrangement has been used for devices such as a TFT liquid crystal display (LCD) device, a TFT organic electroluminescence (OLED: Organic Light Emitting Diode) display device.

To drove the switching elements in an active matrix manner, a silicon device with higher performance is required and system integration of devices such as a peripheral driver and a timing controller is necessary.

However, it is not possible to obtain the required high performance when a conventionally-used amorphous silicon film or a polycrystal film is adopted.

This is because, in the polycrystal silicon film and the like, there are localized states in a gap caused by the incompleteness of crystallinity and the deficiency around a grain boundary. The existence of the localized states decreases the mobility. Further, due to the increase of a subthreshold (S) factor, the performance of the transistor is caused to be insufficient so that a high-performance silicon device cannot be formed.

Moreover, when the crystallinity of the silicon film is insufficient, a fixed charge tends to be formed at the interface between silicon and a gate insulating film. On this account, it is difficult to control a threshold voltage of the thin-film transistor, thereby being impossible to obtain a required threshold voltage.

In the case of the TFT liquid crystal display, a polycrystalline silicon film is formed from an amorphous silicon film by means of methods such as heating using laser light. In this process, since the energy of the laser causes a certain degree of fluctuation, the particle size of the obtained polycrystalline silicon film is not consistent. On this account, the mobility and threshold voltage greatly vary.

When an amorphous silicon film formed by methods such as a plasma CVD (Chemical Vapor Deposition) is heated by laser light and then crystallized, a temperature of a surrounding area of the film promptly rises to be nearly a melting point of silicon. Thus, when a non-alkali high strain point glass is adopted as a substrate, substances such as alkaline metal are diffused into the silicon through the glass. For this reason, the characteristics of the transistor to be obtained deteriorate.

To solve this problem, a device using single-crystal silicon has been developed, in parallel with research for further homogenization and improvement of crystallinity of polycrystalline silicon.

An SOI substrate is an example of devices using such single-crystal silicon (SOI is an abbreviation of Silicon on Insulator). SOI technology for the SOI substrate mainly relates to formation of a single-crystal semiconductor thin film on an amorphous substrate. This term, SOI technology, is not frequently used in respect of formation of a polycrystalline silicon film. SOI technology has been actively developed since 1980s.

As an example of the SOI substrate, there is a SIMOX (Separation by Implanted Oxygen) substrate which has been commercially available. This SIMOX substrate is formed by implanting oxygen into a silicon wafer. In this process, since oxygen, which is a relatively heavy element, is implanted to a predetermined depth, a crystalline structure of the silicon wafer is seriously damaged due to an accelerating voltage involved in the implantation. Thus, the SIMOX substrate has such a problem that the characteristics of single-crystal on the substrate are not sufficient. Further, the insulation performance is inadequate due to non-stoichiometry of a silicon dioxide film layer, and since a large amount of oxygen is required for the implantation, the costs for the ion implantation is high.

In response to this, Japanese Laid-Open Patent Application No. 5-211128/1993 (Tokukaihei 5-211128; published on Aug. 20, 1993) discloses a method of manufacturing a thin semiconductor film, which is arranged such that a single-crystal silicon piece is bonded on a silicon base substrate covered with an oxidized silicon film, and the resultant substrate with the silicon piece is manufactured to be a thin film.

According to this technology, a single-crystal silicon thin film can be formed on a single-crystal silicon base substrate on which an oxidized film has been formed in advance.

Japanese Laid-Open Patent Application No. 2000-30996 (Tokukai 2000-30996; published on Jan. 28, 2000) discloses a standard deviation of thickness of an oxidized film on a silicon wafer, regarding an SOI wafer and a manufacturing method thereof.

Also, Japanese Laid-Open Patent Application No. 6-268183/1994 (Tokukaihei 6-268183; published on Sep. 22, 1994) discloses a method of manufacturing a semiconductor device, in which method a thinly-manufactured substrate on which a semiconductor device has been formed is transferred to another supporting substrate.

In this method, after a semiconductor element is formed on one side of a semiconductor layer, the semiconductor layer manufactured as a thin layer is bonded with a supporting substrate, by means of cold anode connection.

However, in this arrangement, micro-roughness of the oxidized silicon film on the substrate weakens the adhesive power so that film stripping occurs.

That is to say, according to Japanese Laid-Open Patent Application No. 5-211128/1993, the thickness of the oxidized film is significantly irregular when the film on the silicon base substrate is thickly formed. Thus, the irregularity of the surface becomes noticeable and the adhesiveness of the bonding and the characteristics of the SOI substrate deteriorate.

Note that, although Japanese Laid-Open Patent Application No. 2000-30996 includes the description regarding uniformity of the thickness of the single-crystal silicon thin film on occasions when the standard deviation of the thickness is large. However, the document does not mention the problems such as the formation of voids on the occasion of bonding and the stripping of the silicon film on the occasion of separation and stripping.

Further, Japanese Laid-Open Patent Application No. 6-268183/1994 does not describe the micro-roughness and flatness of the thinned semiconductor layer and the supporting substrate.

In this manner, the micro-roughness of the oxidized silicon film by which a light-transmitting substrate is covered weakens the adhesive power. On this account, separation and stripping occur so that the yield decreases due to reasons such as the film stripping after forming a silicon film on a substrate.

SUMMARY OF THE INVENTION

To solve the above-described problem, the objective of the present invention is to provide (i) a semiconductor device in which a single-crystal silicon thin-film device can be easily formed on an insulating substrate without using an adhesive, a non-single-crystal silicon thin film and a single-crystal silicon thin-film device are formed, and high-performance systems are integrated, (ii) a method of manufacturing the semiconductor device, and (iii) a single-crystal silicon substrate for forming the single-crystal silicon thin film of the semiconductor device. Another objective of the present invention is to provide a method of manufacturing an SOI substrate in which an adhesive strength is enhanced, a display device, and a semiconductor device.

To achieve the foregoing objectives, the single-crystal silicon substrate of the present invention is characterized in that an oxidized film, a gate pattern, and an impurity ion implanted interface on a surface of the single-crystal silicon substrate, and the surface is planarized after forming the oxidized film, the gate pattern, and the impurity ion implanted interface, and a dense position of implanted hydrogen ions, to which a predetermined concentration of hydrogen ions is implanted for a predetermined depth.

According to this arrangement, the side of the single-crystal silicon substrate, where the oxidized film is formed, is bonded with a member such as the insulating substrate, and owing to the heat treatment, the substrates are bonded with siloxane bond so that the substrates become tightly bonded, and also, since the cleavage stripping at the dense position is conducted by heating, it is possible to obtain a MOS single-crystal silicon thin-film transistor with ease, even if an adhesive is not used.

That is to say, the single-crystal silicon substrate of the present invention is arranged so that, on the surface thereof, the oxidized film, gate pattern, and impurity ion implanted interface are formed as parts of the MOS single-crystal silicon thin-film transistor, and the dense position of implanted hydrogen ions is provided at a predetermined depth from the surface.

According to this arrangement, a single-crystal silicon substrate (in which the impurity doping for the gate electrode and for the source and drain, and the impurity doping for the base, collector and emitter are carried out, a predetermined concentration of hydrogen ions is implanted for a predetermined depth, and the surface is planarized and caused to be hydrophilic) is bonded on an insulating substrate, and then heating is carried out so that a temperature is increased to be not less than the temperature of hydrogen dissociation from silicon. Thus, it is possible to increase the adhesive strength with respect to the insulating substrate, and since the cleavage stripping at the dense position is carried out, it is possible to easily form a MOS single-crystal silicon thin-film transistor, without using an adhesive.

On this account, for instance, on an insulating substrate on which a non-single-crystal (e.g. polycrystalline) silicon thin-film transistor is formed, the single-crystal silicon substrate of the present invention is bonded so that a MOS single-crystal silicon thin-film transistor is formed. With this arrangement, it is possible to easily obtain a semiconductor device in which a transistor made of non-single-crystal silicon and a transistor made of single-crystal silicon are formed on different areas of a single substrate.

To achieve the above-mentioned objectives, the SOI substrate of the present invention, in which a single-crystal thin film is provided on an insulating substrate, is characterized by comprising: a bonded interface at which an insulating film formed on the insulating substrate is bonded with a covering film (note that, in the present invention, the term "covering film" indicates either a covering film or a thermally oxidized film) with which the single-crystal silicon substrate is covered, the single-crystal silicon substrate being separated at the dense position so that the single-crystal silicon thin film is formed, the insulating substrate being a light-transmitting substrate, and the single-crystal silicon substrate being separated by means of heat treatment.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture transistors which can meet strict demands for the variation and performance.

Also, since the insulating substrate is a light-transmitting substrate, the SOI substrate can be adopted as an active matrix substrate of a display device.

Also, since hydrogen ions which are much lighter than oxygen ions are implanted, the implantation does not significantly change the crystalline on the entire surface of the single-crystal silicon substrate, and hence such a problem of the degradation of the crystalline of the silicon due to the implantation of hydrogen ions can be resolved.

Also, by the heat treatment, the condition of the crystalline of the single-crystal silicon thin film is recovered to be the level before the implantation of the hydrogen ions. The heat treatment is carried out at a temperature about, for instance, 600° C. This treatment does not deteriorate the bonding characteristics at the bonded interface.

To achieve the above-mentioned objectives, the SOI substrate of the present invention, in which a single-crystal silicon thin film is provided on an insulating substrate, is characterized by comprising: a bonded interface at which an insulating film formed on the insulating substrate is bonded with a covering film with which a single-crystal silicon substrate is covered, the single-crystal silicon thin film being formed by separating the single-crystal silicon substrate at a dense position of implanted hydrogen ions by means of heat treatment, and at the bonded interface, the insulating film is arranged to satisfy that a $\tan \theta$ is not more than 0.06, where $\theta$ is the angle between (i) a maximum slope curve of micro-roughness, the micro-roughness being measured in a 1-5 μm square and not more than 5 nm in height, and (ii) an average surface plane.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture transistors which can meet strict demands for the variation and performance.

Note that, the tangent in the present case is an absolute value of the tangent. For this reason, in the arrangement above, the absolute value of the tangent is not less than 0 and not more than 0.06. The foregoing insulating film has micro-roughness on its surface, and the tangent of the maximum slope of micro-roughness on the surface of the insulating film to the surface plane of the insulating substrate, measured in a 1-5 μm square, is not more than 0.06, More specifically, for instance, the tangent of the maximum slope of micro-roughness on the surface of the insulating film to the surface plane of the insulating substrate, measured in a 1-5 μm square, is not more than 0.06, the micro-roughness being not more than 5 nm in height.

By restraining the micro-roughness to be small as above, it is possible to enhance the adhesive strength between the insulating film and the covering film with which the single-crystal silicon substrate is covered.

Further, the tangent is more preferably not more than 0.04. This arrangement makes it possible to further enhance the adhesive strength between the insulating film and the covering film with which the single-crystal silicon substrate is covered.

Thus, it is possible to solve such a problem that the bonding characteristics between a light-transmitting substrate and a single-crystal silicon substrate are degraded due to the micro-roughness on the surface of the light-transmitting substrate.

Note that, in the SOI substrate, the condition of the surface of the insulating film used for bonding the insulating substrate with the single-crystal silicon substrate can be evaluated by performing an AFM method with respect to, for instance, the micro-roughness of the surface which is caused by the separation of the insulating substrate from the single-crystal silicon substrate.

To achieve the above-mentioned objectives, the semiconductor device of the present embodiment is characterized in that a non-single-crystal silicon device and a single-crystal silicon thin-film device are formed in different areas of the insulating substrate.

The non-single-crystal silicon thin-film device is made by a non-single-crystal silicon thin film provided on the insulating substrate. The single-crystal silicon thin-film device is provided on the single-crystal silicon substrate, and then this single-crystal silicon substrate is separated so that a single-crystal silicon thin film is provided on the insulating film, and consequently the single-crystal silicon thin-film device is provided on the insulating film. Alternatively, the single-crystal silicon thin-film device may be made from a single-crystal silicon thin film provided on the insulating substrate.

According to the above, for instance, a single-crystal silicon thin-film device such as a single-crystal silicon thin-film transistor is adopted to devices which have to be highly functional, such as a timing controller, while a non-single-crystal silicon thin-film device such as a non-single-crystal silicon thin-film transistor is adopted to other devices. With this arrangement, it is possible to obtain a semiconductor device in which high-performance and highly-functional circuit systems are integrated.

That is to say, by adopting a single-crystal silicon thin-film device, devices such as a fast and low-power-consumption logic circuit and timing generator and a fast DAC (current buffer) from which variation has to be eliminated can be formed. Meanwhile, although the performance and characteristics of a non-single-crystal silicon (e.g. polycrystalline silicon) thin-film device are inferior to the performance and characteristics of the single-crystal silicon thin-film device, it is possible to form a large and cheap semiconductor device by adopting the non-single-crystal silicon thin-film device.

Thus, according to the present invention, it is possible to form a semiconductor device having the advantages of the both silicon thin-film devices, on a single substrate.

On this account, high-performance and highly-functional circuit systems which can be realized only by adopting single-crystal silicon can be integrated on a single substrate. For instance, a semiconductor device for a display device in which high-performance systems are integrated, such as a liquid crystal panel and an organic EL panel, can be manufactured with significantly lower costs, compared to a case when all devices are made by single-crystal silicon.

The shape of the single-crystal silicon substrate by which the single-crystal silicon thin film of the semiconductor device of the present invention is formed has to be a disk which is sized 6, 8, or 12 inch in diameter. Note that, the disk which is sized 6, 8, or 12 inch in diameter is a typical wafer for manufacturing LSI. However, since the non-single-crystal silicon thin-film device and the single-crystal silicon thin-film device coexist on the insulating substrate of the semiconductor device of the present invention, it is possible to manufacture, for instance, a large semiconductor device which can be adopted to a large liquid crystal display panel and a large organic EL panel.

To achieve the foregoing objectives, the display device of the present invention is characterized by comprising the above-mentioned SOI substrate in which a semiconductor device structure is formed. This SOI substrate is a semiconductor device in which a semiconductor device structure is formed.

Further, to achieve the foregoing objectives, the display device of the present invention includes any one of the foregoing semiconductor devices, and the semiconductor device is adopted as an active matrix substrate for a display panel.

In the SOI substrate, since an insulating substrate is a light-transmitting substrate, forming a semiconductor device structure on the insulating substrate makes it possible to suitably use the semiconductor device as an active matrix substrate for a display panel.

Also, since a high-performance transistor with no variation can be obtained by adopting the SOI substrate, it is possible to obtain a high-performance display device by adopting this transistor.

In this manner, by adopting the single-crystal silicon, the characteristics of the transistor can be caused to be uniform, stabilized, and high-performance, and hence it is possible to manufacture, for instance, a high-performance MOS field effect transistor device. On this account, using this transistor device, it is possible to manufacture a high-performance TFT-LCD display device, TFT-OLEDL display device, and IC.

Note that, the semiconductor device structure is, for instance, a structure as a switching element for displaying. Also, it is possible to manufacture an image processor by forming a semiconductor device structure on an SOI substrate.

To achieve the foregoing objective, the method of manufacturing the semiconductor device of the present invention, in which a single-crystal silicon thin-film device manufactured from a single-crystal silicon thin film and a non-single-crystal silicon thin film are formed on an insulating substrate, is characterized in that, after a circuit including the single-crystal silicon thin-film device is formed on the insulating substrate, the non-single-crystal silicon thin film is formed.

According to this method, the single-crystal silicon thin-film device is formed on an insulating substrate which is the most flattened, and then the non-single-crystal silicon thin film is formed. Thus, it is possible to manufacture semiconductor devices in which defects due to the bonding error are rarely found, with good production yields.

To achieve the foregoing objectives, the method of manufacturing the semiconductor device of the present invention, in which a single-crystal silicon thin-film device manufactured from a single-crystal silicon thin film and a non-single-crystal silicon thin film are formed on an insulating substrate, is characterized in that, after the non-single-crystal silicon thin film is formed on the insulating substrate, the single-crystal silicon thin-film device is formed.

According to this method, contrary to the arrangement that the non-single-crystal silicon thin-film device is formed after forming the single-crystal silicon thin film, the non-single-crystal silicon thin film is formed before the formation of the single-crystal silicon thin-film device and hence it is possible to prevent the contamination and damage of the single-crystal silicon thin film.

To achieve the foregoing objectives, the method of manufacturing the semiconductor device of the present invention, comprising the step of: (a) bonding an insulating film formed on an insulating substrate with a covering film with which a single-crystal silicon substrate is covered, is characterized by further comprising the step of: (b) before the step (a), regulating a tangent of a maximum slope of micro-roughness on a surface of the insulating film to a surface plane of the insulating substrate, measured in a 1-5 μm square, is not more than 0.06, the micro-roughness being not more than 5 nm in height.

The SOI substrate is manufactured in such a manner that, after the bonding step, the single-crystal silicon substrate is separated and stripped at the dense position and thus the single-crystal silicon thin film is formed. That is to say, the above-described manufacturing method is also a method of manufacturing an SOI substrate. According to the manufacturing method, a semiconductor device is manufactured either by forming a semiconductor device structure on a single-crystal silicon thin film on the SOI substrate, or manufacturing a single-crystal silicon thin film from a single-crystal silicon substrate in which a semiconductor device structure is formed.

According to the manufacturing method, after the micro-roughness on the surface of the insulating film is arranged so that the tangent of the maximum slope of the micro-roughness to the surface of the insulating substrate is not more than 0.06, the insulating film is bonded with the covering film with which the single-crystal silicon substrate is covered. With this arrangement, the bonding characteristics are good so that the adhesive strength is improved. Thus, the peeling of the film does not occur when the single-crystal silicon substrate is separated and stripped in order to form the single-crystal silicon thin film, after the bonding step.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) is a cross section indicating a manufacturing process of one embodiment of a semiconductor device in accordance with the present invention.

FIG. 1(b) is a cross section indicating another manufacturing process of the semiconductor device of FIG. 1(a).

FIG. 1(c) is a cross section indicating a further manufacturing process of the semiconductor device of FIG. 1(a).

FIG. 1(d) is a cross section indicating yet another manufacturing process of the semiconductor device of FIG. 1(a).

FIG. 1(e) is a cross section indicating still another manufacturing process of the semiconductor device of FIG. 1(a).

FIG. 1(f) is a cross section indicating still another manufacturing process of the semiconductor device of FIG. 1(a).

FIG. 1(g) is a cross section indicating still another manufacturing process of the semiconductor device of FIG. 1(a).

FIG. 1(h) is a cross section indicating still another manufacturing process of the semiconductor device of FIG. 1(a).

FIG. 1(i) is a cross section indicating still another manufacturing process of the semiconductor device of FIG. 1(a).

FIG. 14(a) is a cross section of an insulating substrate included in the above-mentioned SOI substrate.

FIG. 14(b) is a cross section illustrating the state of depositing an insulating film on the insulating substrate.

FIG. 14(c) is a cross section illustrating the state of depositing an amorphous silicon film on the insulating substrate of FIG. 14(b).

FIG. 14(d) is a cross section illustrating the melting of the amorphous silicon film caused by applying excimer laser.

FIG. 14(e) is a cross section illustrating the state that a polysilicon film is formed.

FIG. 14(f) is a cross section illustrating the state that an area on which the single-crystal silicon substrate is mounted is formed by means of photolithography.

FIG. 14(g) is a cross section illustrating the state that the single-crystal silicon substrate is mounted.

FIG. 14(h) is a cross section illustrating the manufacture of the SOI substrate by separating and stripping the single-crystal silicon substrate.

DESCRIPTION OF THE EMBODIMENTS

First Embodiment

Figure 2:
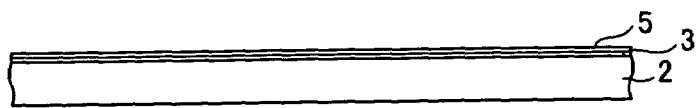
FIG. 2(a) is a cross section indicating a manufacturing process of another embodiment of a semiconductor device in accordance with the present invention.
FIG. 2(b) is a cross section indicating another manufacturing process of the semiconductor device of FIG. 2(a).
FIG. 2(c) is a cross section indicating a further manufacturing process of the semiconductor device of FIG. 2(a).
FIG. 2(d) is a cross section indicating yet another manufacturing process of the semiconductor device of FIG. 2(a).
FIG. 2(e) is a cross section indicating still another manufacturing process of the semiconductor device of FIG. 2(a).
FIG. 2(f) is a cross section indicating still another manufacturing process of the semiconductor device of FIG. 2(a).
FIG. 2(g) is a cross section indicating still another manufacturing process of the semiconductor device of FIG. 2(a).
FIG. 2(h) is a cross section indicating still another manufacturing process of the semiconductor device of FIG. 2(a).
FIG. 2(i) is a cross section indicating still another manufacturing process of the semiconductor device of FIG. 2(a).
Figure 2:
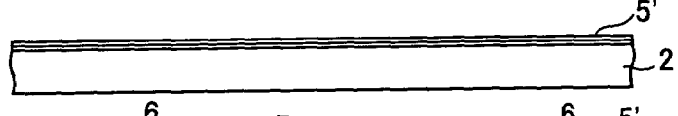
Figure 2:
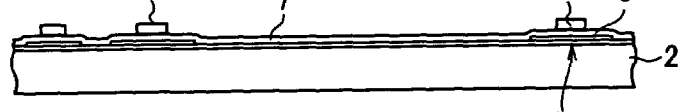
Figure 2:
Figure 2:
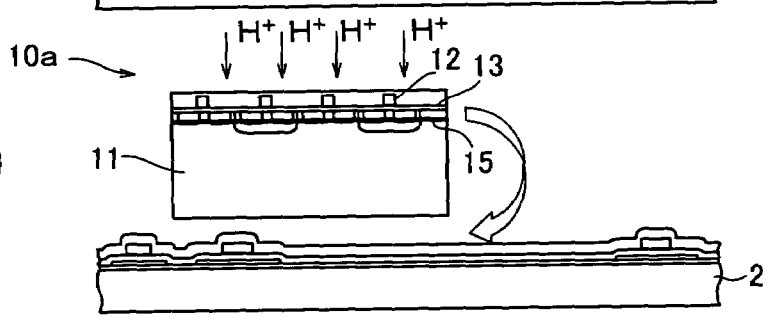
Figure 2:
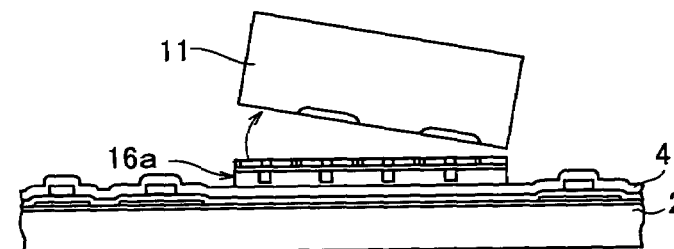
Figure 2:
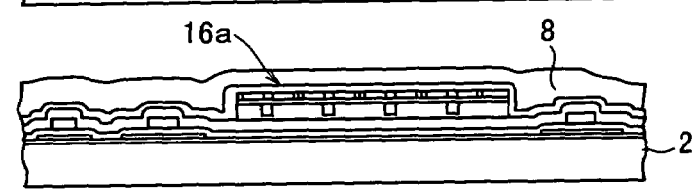
Figure 2:
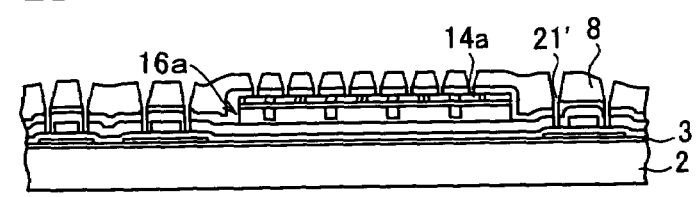
Figure 2:
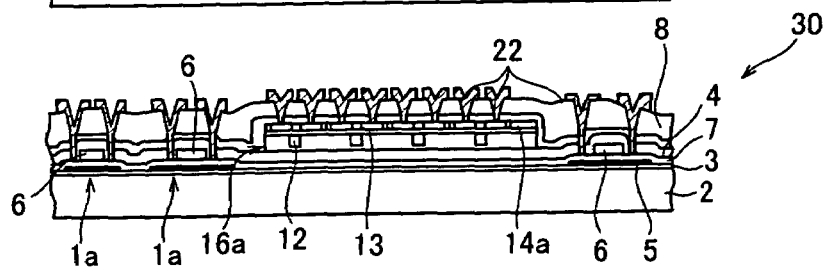

The following will describe a single-crystal silicon substrate, a semiconductor device, and a manufacturing method thereof in accordance with an embodiment of the present invention. FIGS. 1(a)-1(i) are cross sections illustrating a manufacturing process of a semiconductor device of the present embodiment. The semiconductor device of the present embodiment is a high-performance and highly-functional semiconductor device in which a MOS non-single-crystal silicon thin-film transistor and a MOS single-crystal silicon thin-film transistor are formed on different areas of the surface of an insulating substrate, the semiconductor device being formed on a TFT active matrix substrate.

The MOS thin-film transistor includes an active semiconductor layer, gate electrodes, a gate insulating film, and high-concentration impurity doped sections (source and drain electrodes) formed on the both sides of the gate. The MOS thin-film transistor is a typical transistor in which the gate electrodes modulate the carrier density of a semiconductor layer below the gate so that the current running between the source and drain is controlled.

When the MOS transistor adopts a CMOS (Complementary MOS) structure, since the power consumption is low and the output can swing up to the power-supply voltage, the MOS transistor is suitable for the logic of low-power-consumption type.

As FIG. 1(i) illustrates, a semiconductor device 20 of the present embodiment is arranged in such a manner that, on an insulating substrate 2, a $SiO_2$ (oxidized Si) film (insulating film) 3, a MOS non-single-crystal silicon thin-film transistor 1a including a non-single-crystal silicon thin film 5' made of polycrystalline silicon, a MOS single-crystal silicon thin-film transistor (single-crystal silicon thin-film device) 16a including a single-crystal silicon thin film 14a, and a metal wiring 22 are provided.

As the insulating substrate 2, code 1737 (alkaline-earth alumino-borosilicate glass) of Corning®, which is a high strain point glass is adopted.

The $SiO_2$ film 3, which is about 50 nm thick, is formed so as to cover the entire surface of the insulating substrate 2.

In the MOS non-single-crystal silicon thin-film transistor 1a including the non-single-crystal silicon thin film 5', the non-single-crystal silicon thin film 5', a $SiO_2$ film 7 as a gate insulating film, and gate electrodes 6 are formed on a $SiO_2$ film 4 which functions as an interlayer insulating film.

Although the gate electrodes 6 are made of polysilicon silicon and W silicide, the gate electrodes 6 may be made of substances such as polycrystalline Si, other types of silicide, and polycide.

The MOS single-crystal silicon thin-film transistor 16a including the single-crystal silicon thin film 14a is provided with a planarizing layer including gate electrodes 12, a $SiO_2$ film 13 as a gate insulating film, and the single-crystal silicon thin film 14a.

Although the gate electrodes 12 are made of a heavily-doped polysilicon silicon film and W silicide, the gate electrodes 12 may be solely made of polycrystalline silicon or made of other types of high melting point metal or silicide, and the materials are selected in accordance with a required level of electrical resistance and heat resistance.

The single-crystal silicon thin-film transistor 16a is formed on the single-crystal silicon substrate before being bonded to the insulating substrate 2. Areas to be formed as the gate electrodes 12 are bonded to the insulating substrate 2, and on this occasion, the areas include a gate insulating film 13 and the single-crystal silicon thin film 14a. Thus, when the formation of the gate electrodes and the implantation of impurity ions to the source and drain are performed on the single-crystal silicon substrate 10a, micro-fabrication is easily conducted, compared to a case when the formation of the thin-film transistor is carried out after the formation of the single-crystal silicon thin film on the insulating substrate 2.

As described above, the semiconductor device 20 of the present embodiment is a high-performance and highly-functional semiconductor device in which a plurality of circuits having different characteristics are integrated, which is realized by causing the MOS non-single-crystal silicon thin-film transistor 1a to be coexistence with the MOS single-crystal silicon thin-film transistor 16a on the single insulating substrate 2. Moreover, the present arrangement makes it possible to obtain a high-performance and highly-functional semiconductor device with low costs, compared to a case of forming a transistor which is entirely made of a single-crystal silicon thin film on a single insulating substrate 2.

Note that, the distance between an area of the non-single-crystal silicon thin film 5' an area of the single-crystal silicon thin film 14a is at least 0.3 μm, preferably not less than 0.5 μm. With this arrangement, it is possible to prevent metal elements such as Ni, Pt, Sn, and Pd from being diffused to the crystal silicon thin film 14a, thereby stabilizing the characteristics of the single-crystal silicon thin-film transistor 16a.

Further, in the semiconductor device 20 of the present embodiment, a $SiO_2$ film 4 is formed as an interlayer insulating film between the non-single-crystal Si thin-film transistor 1a and the single-crystal silicon thin-film transistor 16a. With this arrangement, it is possible to prevent the contamination of the single-crystal silicon thin film 14a.

For instance, in the case of an active matrix substrate of the liquid crystal display device including the semiconductor device 20 of the present invention, $SiN_x$ (silicon nitride), resin planarized film, a via hole, and a transparent electrode are provided for the sake of liquid crystal displaying. Also, in the area of the non-single-crystal silicon thin film 5', TFTs for the driver section and display section are formed, while in the area of the single-crystal silicon thin film 14a which can accommodate high-performance devices, a timing controller is formed. The driver section may be made of single-crystal Si, provided that it is worthwhile in terms of costs and performance.

In this manner, the functions and purposes of the respective thin-film transistors are determined in accordance with the characteristics of the single-crystal silicon thin film 14a and non-single crystal silicon thin film 5' by which the transistors are formed, and this makes it possible to obtain high-performance and highly-functional thin-film transistors.

Note that, while the mobility of an N-channel TFT formed in the area of a conventional non-single-crystal silicon thin film 5' is about 100 $cm^2/V \cdot sec$, in the active matrix substrate for liquid crystal displaying in which the semiconductor device of the present embodiment is formed, the mobility of the N-channel TFT formed in the area of the single-crystal silicon thin film 14a is about 550 $cm^2/V \cdot sec$. This proves that the semiconductor device 20 of the present embodiment makes it possible to obtain a TFT which can operate faster than conventional TFTs.

Further, in this active matrix substrate for liquid crystal displaying, while devices formed in the area of the non-single-crystal silicon thin film 5', such as the driver, require a signal and power-supply voltage of 7-8V, the timing controller which is formed in the area of the single-crystal silicon thin film 14a stably operates at 2.7V.

In the semiconductor device 20, ICs including a pixel array are formed in areas suitable for required arrangement and characteristics, i.e. formed in either appropriate one of the area of the non-single-crystal silicon thin film 5' and the area of the single-crystal silicon thin film 14a. Further, the ICs in the respective areas can be formed so as to have different characteristics such as working speeds and working power-supply voltages. For instance, it is possible to arrange the semiconductor device 20 in such a manner that, at least one of the gate length, thickness of the gate insulating film, power-supply voltage, and logic level is different between the areas.

With this arrangement, it is possible to form devices having different characteristics in the respective areas, thereby providing a semiconductor device having greater variety of functions.

Further, in the semiconductor device 20, since the ICs are formed in the area of the non-single-crystal silicon thin film 5' and the area of the single-crystal silicon thin film 14a, the ICs formed in the respective areas can be formed in accordance with respective manufacturing rules peculiar to the areas.

This is because, for instance, when the channel length is short, there is no grain boundary in the area of the single-crystal silicon thin film so that the variation of the TFT characteristics rarely increases, while, in the area of the polysilicon silicon thin film, the variation rapidly increases due to the existence of the grain boundary so that the manufacturing rules have to be modified so as to be different in the respective areas. Thus, it is possible to form the respective ICs in suitable areas, in accordance with the manufacturing rules.

Further, in the semiconductor device 20 of the present embodiment, the metal pattern of the MOS single-crystal silicon thin-film transistor 16a can be formed in accordance with a wiring rule which is relaxed in comparison with the wiring rule of the gate pattern.

With this arrangement, at least a part of the metal wiring of the semiconductor device, in which the MOS single-crystal silicon thin-film transistor 16a is formed, can be processed simultaneously with the metal wiring on a large substrate, and this makes it possible to reduce costs and improve processing power. Further, since the connection to an external wiring, other circuit blocks, and the TFT array becomes easy, the alignment failure is reduced so that the rejection rate is improved.

Note that, the size of the single-crystal silicon thin film 14a formed on the semiconductor device 20 is determined in accordance with the size of an wafer of an LSI manufacturing device. For providing devices such as a fast and low-power-consumption logic generator and timing generator and a fast DAC (current buffer) and processor which should be low-variation, which are required to be formed by the single-crystal silicon thin film 14a, a conventional LSI manufacturing device has a sufficient size.

The following will describe a method of manufacturing the semiconductor device 20, with reference to FIGS. 1(a)-1(i).

First, applying a gas in which TEOS is mixed with $O_2$ to the entire surface of the insulating substrate 2, a $SiO_2$ film 3 which is about 5 nm thick is deposited by plasma CVD.

In the method of manufacturing the semiconductor device 20 of the present embodiment, the single-crystal silicon substrate 10a, on which a part to be the single-crystal silicon thin-film transistor 16a when being thinned is formed in advance, is formed on this occasion, and this single-crystal silicon substrate 10a is formed on the insulating substrate 2.

More specifically, after a part of the CMOS process is carried out in advance in a typical IC manufacturing line, i.e. after the gate electrodes 12, gate insulating film 13, protective insulating film, and planarized film (BPSG) are formed and implantation of impurity ions ($BF^{2+}$, $P^+$) to the source and drain is carried out, the planarization is performed by CMP (Chemical-Mechanical Polishing). Subsequently, a $SiO_2$ film which is 10 nm thick is formed, and the single-crystal silicon substrate 10a having a dense position 15 of implanted hydrogen ions, to which hydrogen ions, a dose amount of $5 \times 10^{16}/cm^2$, are implanted with a predetermined energy is formed. Then these members are reshaped so as to have predetermined sizes corresponding to the formation area on the insulating substrate 2. Note that, at the dense position 15 of implanted hydrogen ions, the concentration of hydrogen ions is at the maximum.

Subsequently, as FIG. 1(b) shows, the transparent insulating substrate 2 and the single-crystal silicon substrate having been reshaped are washed using SC-1 and activated, then a side of the single-crystal silicon substrate 10a, the side close being to the dense position 15, is aligned with a predetermined position, and the side and the predetermined position are caused to be intimately in contact with each other so as to be bonded with each other, at room temperatures.

Figure 9:
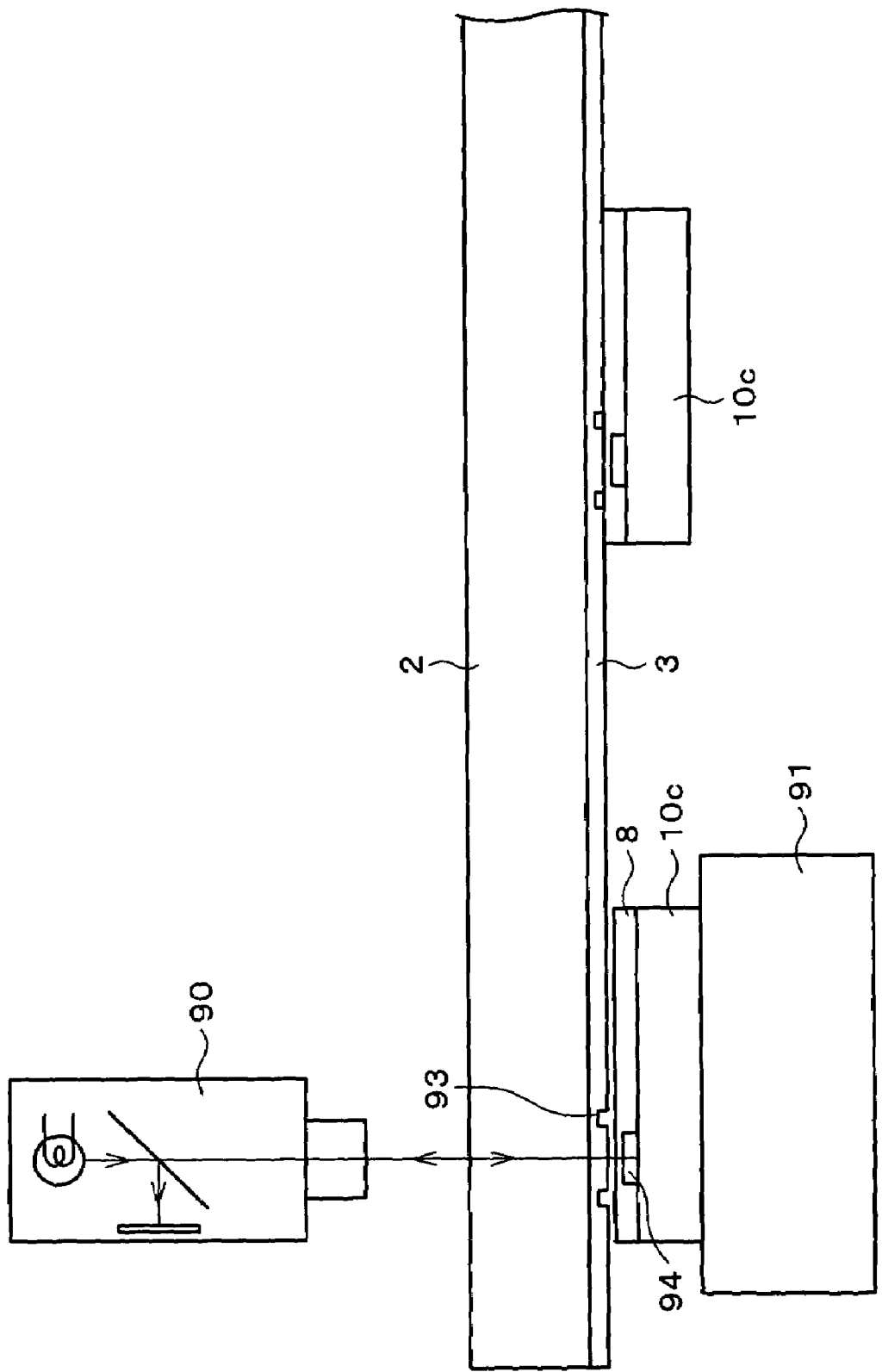
FIG. 9 is a conceptual diagram regarding alignment of a single-crystal silicon with a glass substrate at a room temperature, in a method of manufacturing the semiconductor device of the present invention.

The alignment is, as FIG. 9 illustrates, carried out in such a manner that, an aligning mark 94 on the single-crystal silicon and an aligning mark 93 of the transparent substrate 2 which is code 1737 of Corning® in the present embodiment are detected through the transparent substrate 2, under visible light. In the example of FIG. 9, the aligning mark 94 on the single-crystal silicon on an aligning stage 91 is detected using an aligning CCD camera 90 attached to a microscope in an epi-illumination manner, and the result of the detection is eventually converted to electric signals and processed.

In a conventional method that aligning is carried out by irradiating infrared light over a silicon substrate, since devices such as ICs are not transparent to visible light or UV light, an alignment mark is detected over an silicon wafer having a non-mirror and light-scattering surface in order to prevent sticking, and hence the alignment cannot be precisely carried out.

To solve this problem, the semiconductor device of the present embodiment is arranged in such a manner that, for instance, the aligning marks 93 and 94 are detected through a glass which is transparent to visible light or UV light having wavelengths shorter than infrared light and has a surface which rarely scatter light. With this arrangement, the alignment can be performed more precisely than the conventional arrangement.

Moreover, in the present embodiment, the margin of the alignment carried out using the aligning mark 94 on the single-crystal silicon is smaller than the margin of the alignment of the pattern of the transparent substrate on the whole, the display area, or the device on the whole, and hence the margin of the alignment is carried out more precisely.

Thus, when, in the subsequent step, the metal wiring 22 which is commonly shared by the area of the non-single-crystal silicon (area of the non-single-crystal silicon thin film 5'), it is possible to perforate a contact hole 21 using a more precise exposure system, and using the metal wiring 22, it is possible to easily and effectively connect the area of the single-crystal silicon having a highly precise pattern with the area of the single-crystal silicon having a moderately precise pattern, with a high yield ratio.

The single-crystal silicon is bonded to the glass transparent substrate 2 by Van der Waals force. Subsequently, the reaction of Si—OH+—Si—OH→Si—O—Si+H$_2$O is caused to occur at temperatures of 400-600° C., in this case about 550° C., so that the atoms are caused to be closely bonded. Then, as FIG. 1(c) illustrates, the temperature of the dense position 15 is increased to be not less than the temperature of hydrogen dissociation from the single-crystal silicon, and this makes it possible to carry out cleavage stripping at the dense position 15 as a border.

Here, the single-crystal silicon thin-film transistor 16a is bonded to the insulating substrate 2 via the inorganic insulating film 3. Thus, compared to the case of the bonding using a conventional adhesive, it is possible to prevent the contamination of the single-crystal silicon thin film 14a with more certainty.

Subsequently, an unnecessary part of the single-crystal silicon thin film 14a, the part being left over on the insulating substrate 2 after the stripping, is removed by etching, and the single-crystal silicon is manufactured so as to be island-shaped. Then a damaged layer on the surface is removed by isotropic plasma etching or wet etching. In the present case, the layer is lightly etched for about 10 nm by wet etching using buffer hydrofluoric acid. On this account, as FIG. 1(i) illustrates, a part of the MOS TFT is formed on the single-crystal silicon thin film 14a, which is about 50 nm thick, on the insulating substrate 2.

Then as FIG. 1(d) shows, on the entire surface of the insulating substrate 2, a second SiO$_2$ film 4 which is about 200 nm thick is deposited by plasma CVD using a gas in which SiH$_4$ and N$_2$O are mixed. Then on the entire surface, an amorphous silicon film 5 which is 50 nm thick is deposited by plasma CVD using a SiH$_4$ gas.

By irradiating the amorphous silicon film 5 with excimer laser for heating and crystallization, a polycrystalline silicon layer is developed so that the non-single-crystal silicon thin film 5' is formed and the adhesive strength between the single-crystal silicon thin film 14a and the insulating film 3 is increased.

Next, as FIG. 1(f) illustrates, an unnecessary part of the polycrystalline silicon film 5' is removed in order to cause a part, which becomes an active area of the device, to be left, and consequently an island-shaped pattern is obtained.

Then using a gas in which TEOS is mixed with oxygen, a SiO$_2$ film which is about 350 nm thick is deposited by plasma CVD, and this SiO$_2$ film is etched for about 400 nm by RIE. Subsequently, as a gate insulating film of the non-single-crystal silicon thin-film transistor 1a, a SiO$_2$ film 7 which is about 60 nm thick is formed by plasma CVD using a gas in which SiH$_4$ is mixed with N$_2$O. On this occasion, side walls are formed at the respective end portions of the single-crystal silicon thin film 14a and the non-single-crystal silicon thin film 5'.

Next, as FIG. 1(g) illustrates, as an interlayer planarized insulating film (protective interlayer insulating film), a SiO$_2$ film 8 which is about 350 nm thick is deposited by P-CVD using a gas in which TEOS is mixed with O$_2$ (oxygen).

Then the contact hole 21 is opened as FIG. 1(h) shows, and the metal (AlSi) wiring 22 is formed on the contact hole 21 as FIG. 1(i) illustrates.

As described above, in the method of manufacturing the semiconductor device of the present embodiment, the single-crystal silicon thin-film transistor 16a is formed before the formation of the non-single-crystal silicon thin film (polysilicon silicon thin film) 5'. With this arrangement, it is possible to connect the single-crystal silicon substrate while keeping the flatness of the insulating substrate 2, and hence problems such as alignment failure can be prevented.

Note that, in the present embodiment, when the energy for implanting the hydrogen ions is increased in order to cause the peak position of the hydrogen atoms to be farther from the surface and the thickness of the single-crystal silicon thin film 14a is caused to be thicker, no particular changes are observed when the thickness is increased to be 50 nm-100 nm. However, when the thickness is increased to be 300-600 nm, an S-value of the TFT is gradually increased so that the off-current is greatly increased. Thus, depending on the doping density of the impurities, the thickness of the single-crystal silicon thin film 14a is generally not more than 600 nm, preferably about not more than 500 nm, and more preferably not more than 100 nm.

Here, the energy for implanting the hydrogen ions is arranged in such a manner that, the energy for implanting the hydrogen ions is arranged so that the energy after subtracting the energy corresponding to a projection range of the hydrogen ions in a gate electrode material for a gate electrode thickness from an incident energy of the hydrogen ions is no more than the energy corresponding to a projection range of the heaviest ions of gate constituent materials for a gate oxide thickness.

With this arrangement, for instance, it is possible to prevent the following problem of the dent in characteristics and credibility: in the MOS single-crystal silicon thin-film transistor, the hydrogen ions irradiated to the single-crystal silicon substrate collide with atoms constituting the materials of the gate electrodes and metal wirings, so that the atoms constituting the materials of the gate electrodes are flicked off and pass through the oxidized film, and eventually reach the single-crystal silicon and contaminate the same.

Also, when code 7059 (barium-borosilicate glass) of Corning® is adopted as the insulating substrate 2 instead of code 1737 (alkaline-earth alumino-borosilicate glass) of Corning®, although the bonding itself can be performed, the success rate of the cleavage stripping decreases.

Figure 8:
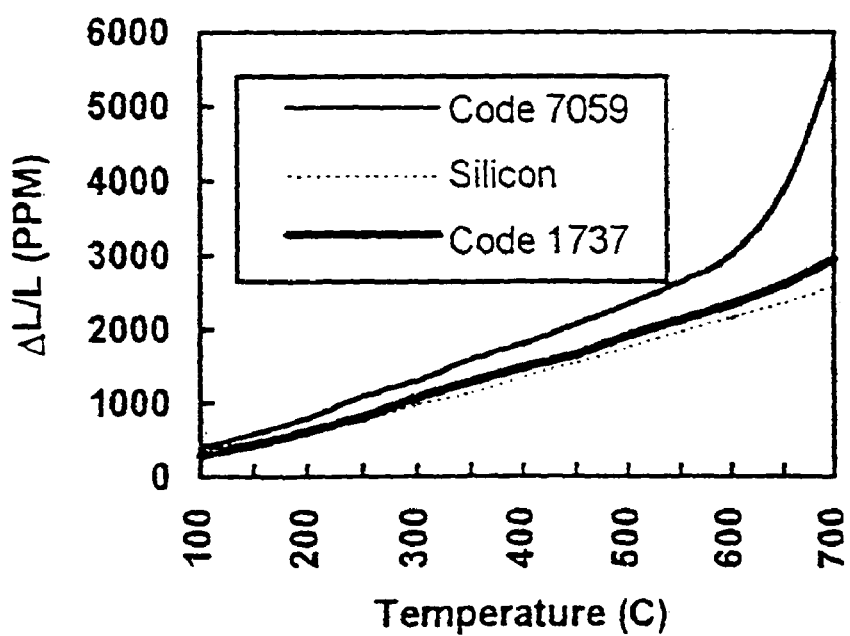
FIG. 8 is a graph, showing the difference of linear expansion of single-crystal silicon and a glass substrate, at temperatures between a room temperature and 600° C.

This is because, as FIG. 8 shows, while the difference of linear expansion between code 1737 and silicon when the temperature is increased from substantially room temperatures to 600° C. is about 250 ppm, the difference of linear expansion between code 7059 and silicon on equal terms is about 800 ppm.

Thus, taking into consideration of the success rate of the cleavage stripping, the difference of linear expansion between the insulating substrate and silicon at temperatures between room temperatures and 600° C. is preferably not more than 250 ppm.

Note that, the single-crystal silicon thin-film transistor 16a is not necessarily limited to the arrangement having been described in the present embodiment. For instance, it is possible to obtain effects similar to the above by adopting a bottom gate MOS thin-film transistor.

Embodiment 2

The following will describe another embodiment of a single-crystal silicon substrate, a semiconductor device, and a method of manufacturing the same, in accordance with the present invention. FIGS. 2(a)-2(i) are cross sections illustrating a manufacturing process of the semiconductor device of said another embodiment of the present invention. By the way, members having the same functions as those described in Embodiment 1 are given the same numbers, so that the descriptions are omitted for the sake of convenience.

Being identical with the above-described semiconductor device 20 of Embodiment 1, a semiconductor device 30 of the present embodiment is arranged in such a manner that, a MOS single-crystal silicon thin-film transistor 16a and a non-single-crystal silicon thin-film transistor 1a are formed in different areas of an insulating substrate 2. Thus, the semiconductor device 30 of the present embodiment is also high-performance and highly functional, as the semiconductor device 20 of Embodiment 1 is.

However, the semiconductor device 30 is different from the semiconductor device 20 to the extent that, in the semiconductor device 30, the single-crystal thin-film transistor 16a is formed after the formation of the non-single-crystal silicon thin-film transistor 1a.

In the semiconductor device 30 of the present embodiment, members such as a $SiO_2$ film 3, the non-single-crystal silicon thin-film transistor 1a, the single-crystal silicon thin-film transistor 16a, and a metal wiring 22 are provided on the insulating substrate 2.

The non-single-crystal silicon thin-film transistor 1a includes a non-single-crystal silicon thin-film 5', a $SiO_2$ film 7 as a gate insulating film, and gate electrodes 6. The single-crystal silicon thin-film transistor 16a is, as described above, formed on the insulating substrate 2 on which the non-single-crystal silicon thin-film 1a is formed, via an interlayer insulating film 7.

A single-crystal silicon substrate 10a for forming the single-crystal silicon thin-film transistor 16a is subjected to a process for forming a MOS single-crystal silicon thin-film transistor, before the substrate 10a is provided on the insulating substrate 2. More specifically, the gate electrodes and gate insulating film are formed, impurity ions are implanted into the source and drain, and channel injection is performed with respect to P-type and N-type channel parts. Since a P-type silicon substrate is adopted in the present case, the channel injection to an N-type TFT is omitted. On the gate electrodes, an interlayer planarized film is formed so as to have a predetermined shape, i.e. in the present case a $SiO_2$ formed by CVD and a BPSG which has been deposited, melted and then planarized by CMP are formed so as to have predetermined shapes. Then the single-crystal silicon substrate 10a on which a MOS single-crystal silicon thin-film transistor 14a is formed is washed using a SC1 cleaning liquid so that particles are removed and the surface is activated. Subsequently, under visible light, an aligning mark on the single-crystal silicon and an aligning mark on the transparent substrate are detected through the glass substrate at room temperatures, and then the single-crystal silicon substrate 10a is bonded to the insulating substrate 2. Here, the gate length is determined to be 0.35 μm, and as to the manufacturing rules of the contact and metal wiring, the line width and space width are determined to be 2 μm (micron) in order to correspond to the precision of photolithography on a large glass substrate and the precision of the alignment on the occasion of the bonding.

In the semiconductor device 30 of the present embodiment, the MOS transistors are formed in both of the area of the non-single-crystal silicon thin film 5' and the area of the single-crystal silicon thin film 14a. Further, in the areas on which the transistors of the same conductive type are formed, at least one of the mobility, subthreshold factor, and threshold value varies from one area to another. Thus, in order to obtain desired characteristics, it is possible to suitably form the transistor either in the area of the single-crystal silicon or in the area of the non-single-crystal silicon thin film.

The following will describe a method of manufacturing the semiconductor device 30, with reference to FIGS. 2(a)-2(i).

First, as the insulating substrate 2, code 1737 (alkaline-earth alumino-borosilicate glass) of Corning® is adopted. Then as FIG. 2(a) shows, on the surface of the insulating substrate 2, a $SiO_2$ film 3 which is about 100 nm thick is deposited by plasma CVD (Plasma Chemical Vapor Deposition; hereinafter, this will be referred to as P-CVD at times) using a gas in which TEOS (Tetra Ethoxy Silane, i.e. $Si(OC_2H_5)_4$) is mixed with O2 (oxygen).

Further, on the surface where the $SiO_2$ film 3 having been deposited, an amorphous silicon film 5 which is about 50 nm thick is deposited by plasma CVD using a $SiH_4$ gas.

Subsequently, as FIG. 2(b) illustrates, excimer laser is applied to the amorphous silicon film 5 in order to heating and crystallizing the same, so that an amorphous silicon layer is developed and the non-single-crystal silicon thin film 5' is formed. Note that, since the heating of the amorphous silicon film 5 is not necessarily carried out by applying the excimer laser, the heating may be carried out by applying other types of laser or using a furnace. Also, to precipitate the development of the crystal, at least one substance selected from the group of nickel, platinum, tin, and palladium may be added to the amorphous silicon film 5'.

Then, as FIG. 2(c) illustrates, a predetermined area of the non-single-crystal silicon thin film 5' is removed by etching.

Next, As FIG. 2(c) shows, for forming a non-single-crystal silicon (in this case polycrystalline silicon or continuous grain silicon) TFT, a $SiO_2$ film 7 as a gate insulating film which is 80-100 nm thick is deposited by plasma CVD using a $SiH_4$ gas and a $N_2O$ gas, and then gate electrodes 6 are formed.

Subsequently, as FIG. 2(d) illustrates, impurity ions for the source and drain are implanted, and then a $SiO_2$ film 4 which is about 250 nm thick is deposited thereon as an interlayer insulating film, by plasma CVD using a gas in which TEOS $Si(OC_2H_5)_4$) is mixed with $O_2$ (oxygen).

Here, as in the case of the semiconductor device 20 of Embodiment 1, the semiconductor device 30 of the present embodiment is arranged in such a manner that the single-crystal silicon substrate 10a, on which a process for manufacturing a transistor to be the MOS single-crystal silicon thin-film transistor 16a is partly completed, is manufactured by performing steps such as the implantation of hydrogen ions.

Then the shape of this single-crystal silicon substrate 10a is cut by dicing or anisotropic etching using KOH so that the size of the single-crystal silicon substrate 10a becomes slightly smaller than the size of the predetermined area of the non-single-crystal silicon thin film 5', from which an unnecessary part has been removed by etching.

The part from which the non-single-crystal silicon thin film has been removed in order to bond crystalline silicon thereto is planarized in advance by GCIB (Gas Cluster Ion Beam) using a gas including low-energy (about 3 keV) halide. To further improve the bonding characteristics, a $SiO_2$ film which is about 10 nm is formed on the part by PECVD using TEOS or TMCTS (Tetramethylcyclotetrasiloxane).

The insulating substrate 2 on which the non-single-crystal silicon thin film 5' is formed and the single-crystal silicon substrate 10a are washed using an SC1 liquid in order to remove particles and activate the surfaces of the substrates, and then, as FIG. 2(e) illustrates, at room temperatures, a side of the single-crystal silicon substrate 10a, the side being close to the dense position 15, is aligned with the area which has been etched as above, and subsequently, the single-crystal silicon substrate 10a and the area are caused to be intimately in contact with each other so as to be bonded with each other, in the way identical with the case of Embodiment 1. Here, the SC1 washing, which is one type of an washing method termed RCA, is carried out using a washing liquid made of ammonia, hydrogen peroxide, and pure water.

By the way, the formation of the single-crystal silicon substrate 10a on the insulating substrate 2 may be carried out after the formation of the $SiO_2$ film 7 as the gate insulating film and before the deposition of the $SiO_2$ film 4 as the interlayer insulating film.

Then the single-crystal silicon substrate 10a is subjected to heat treatment at temperatures of 300-600° C., in this case about 550° C., so that the temperature of the dense position 15 of the single-crystal silicon substrate 10a is increased to be not less than the temperature of hydrogen dissociation from the single-crystal Si. With this arrangement, it is possible to carry out cleavage stripping at the dense position 15 as a border. Incidentally, the heating treatment may be carried out in such a manner that, the temperature of the dense position 15 of the single-crystal silicon substrate 10a is increased by applying laser thereto or by means of lamp annealing in which a peak temperature is not less than 700° C.

Then a damaged layer on the surface of the singe-crystal silicon substrate 10a, which is left on the insulating substrate 2 as a result of the stripping, is removed by lightly etching the same for about 10 nm, by anisotropic plasma etching or wet etching, in the present case wet etching using buffer hydrofluoric acid. As a result, as FIG. 2(f) shows, the non-single-crystal silicon thin film 5' and the single-crystal silicon thin film 14a which are both about 50 nm thick are provided on one single insulating substrate 2. Note that, provided that after the bonding of the single-crystal silicon substrate 10a to the insulating substrate 2 at room temperatures, heat treatment at temperatures of 300-350° C. for about 30 minutes is carried out and then heat treatment at a temperature about 550° C. is carried out, the occurrence of peeling on the occasion of the cleavage stripping decreases.

At this point, the adhesive strength between the silicon and the substrate has already been sufficient. However, to further improve the adhesive strength, lamp annealing at a temperature about 800° C. is performed for one minute. This lamp annealing may be performed simultaneously with the activation of the impurities implanted to the source and drain.

Subsequently, as is the case with Embodiment 1, a $SiO_2$ film 8 is deposited as an interlayer planarized insulating film as FIG. 2(g) illustrates, a contact hole 21 is perforated as in FIG. 2(h), and then a metal wiring 22 is formed as in FIG. 2(i).

As described above, in the method of manufacturing the semiconductor device of the present embodiment, the single-crystal silicon thin-film transistor 16a is formed after the formation of the non-single-crystal silicon thin-film transistor 1a, so that the manufacturing process can be simplified compared with the semiconductor device 20 of Embodiment 1 in which the single-crystal silicon thin-film transistor is formed before the formation of the non-single-crystal silicon thin-film transistor, and hence, according to the present embodiment, the manufacturing process can be simplified and the contamination of the single-crystal silicon thin film can be prevented.

Embodiment 3

The following will describe a further embodiment of a single-crystal silicon substrate, a semiconductor device, and a method of manufacturing the same, in accordance with the present invention. FIGS. 3(a)-3(f) are cross sections illustrating a manufacturing process of the semiconductor device of the present embodiment. By the way, members having the same functions as those described in Embodiments 1 and 2 are given the same numbers, so that the descriptions are omitted for the sake of convenience.

As is the case with Embodiment 1, a semiconductor device 40 of the present embodiment is, as shown in FIG. 3(f), arranged such that a non-single-crystal silicon thin-film transistor and a single-crystal silicon thin-film transistor are formed on a single insulating substrate 2. While the present embodiment is identical with Embodiment 1 to the extent that the single-crystal silicon thin-film transistor is formed before the formation of the non-single-crystal silicon thin-film transistor, these embodiments are different from each other to the extent that, in the present embodiment, the single-crystal silicon thin-film transistor is a bipolar single-crystal silicon thin-film transistor, rather than a MOS single-crystal silicon thin-film transistor.

In this manner, it is possible to obtain the semiconductor device 40 having characteristics different from the characteristics of the semiconductor devices 20 and 30 described in Embodiments 1 and 2, by forming a MOS transistor as a non-single-crystal silicon thin-film transistor and a bipolar transistor as a single-crystal silicon thin-film transistor.

Here, the bipolar thin-film transistor is a transistor which is arranged in such a manner that, a narrow reverse-conducting layer (base) is provided between a collector and emitter of a first conducting-type semiconductor, the number of minority carriers flowing from the emitter to base is controlled by inverting the bias between the emitter and base, and consequently the current caused by the minority carriers flowing into the collector is controlled by changing bias of base.

Unlike MOS transistors, no gate electrodes are formed in the bipolar thin-film transistor so that the structure can be simplified and the production yield can be improved. Further, since the linearity in a saturation area is good and the reaction velocity is quick and hence linear signal processing can be performed, the bipolar thin-film transistor can be adopted to devices such as an analog amplifier, a current buffer, and a power-supply IC.

Note that, in the bipolar single-crystal silicon thin-film transistor, the wiring rule of its contact pattern is more relaxed than the wiring rule of the base pattern.

With this arrangement, at least a part of the metal wiring of the semiconductor device, in which the bipolar single-crystal silicon thin-film transistor is formed, can be processed simultaneously with the metal wiring on a large substrate, and this makes it possible to reduce costs and improve processing power. Further, since the connection to an external wiring, other circuit blocks, and TFT array becomes easy, the connection failure is reduced so that the rejection rate is improved.

As FIG. 3(f) illustrates, the semiconductor device 40 is arranged such that the $SiO_2$ film 3, the non-single-crystal silicon thin-film transistor 1a including the non-single-crystal silicon thin film 5' made of polycrystalline silicon, the bipolar single-crystal silicon thin-film transistor 16b including the single-crystal silicon thin film 14b, and the metal wiring 22 are formed on the insulating substrate 2.

Since the MOS non-single-crystal silicon thin-film transistor 1a and the bipolar single-crystal silicon thin-film transistor 16b are formed on one insulating substrate 2 as described above, it is possible to obtain the semiconductor device 40 by taking advantage of the characteristics of the MOS non-single-crystal silicon thin-film transistor and bipolar single-crystal silicon thin-film transistor, and thus the semiconductor device 40 can be adopted for various uses.

Now, a method of manufacturing the semiconductor device 40 will be described with reference to FIGS. 3(a)-3(f).

First, as the insulating substrate 2, code 1737 (alkaline-earth alumino-borosilicate glass) of Corning® is adopted. Then as FIG. 3(a) shows, on the surface of the insulating substrate 2, a $SiO_2$ film 3 which is about 20 nm thick is deposited by plasma CVD using a gas in which TEOS is mixed with $O_2$.

Here, in the semiconductor device 40 of the present embodiment, as in the cases of the semiconductor devices 20 and 30 in Embodiments 1 and 2, a single-crystal silicon substrate 10b is arranged in advance in such a manner that a bipolar single-crystal silicon thin-film transistor 16b is readily formed when cleavage stripping is performed at a dense position 15 of implanted hydrogen ions as a border, and the single-crystal silicon substrate 10b having been arranged in this manner is bonded to an insulating substrate 2.

More specifically, first, a junction part of the bipolar thin-film transistor, which is for either PNP junction or NPN junction, is formed. Then the surface is oxidized or an oxide film is deposited thereon so that a $SiO_2$ film 13 which is about 200 nm thick is formed. On this account, the bipolar single-crystal silicon thin-film transistor, which has a dense position 15 of implanted hydrogen ions to which hydrogen ions having a doze amount of $5 \times 10^{16}/cm^2$ are implanted for a predetermined depth by a predetermined energy, is formed.

In this manner, the bipolar single-crystal silicon thin-film transistor 16b also has the dense position to which a predetermined concentration of hydrogen ions is implanted for a predetermined depth, as in the case of the MOS transistor.

Subsequently, the single-crystal silicon substrate 10b, which has been properly shaped in advance, is formed on the insulating substrate 2.

After the insulating substrate 2 and properly-shaped single-crystal silicon substrate 10b are washed using a SC1 liquid and activated, as FIG. 3(b) illustrates, a side of the single-crystal silicon substrate 16b, the side being close to the dense position 15, is aligned with an area on the insulating substrate 2, the area having been subjected to the removal of an unnecessary part by etching. After performing this alignment at room temperatures, the single-crystal silicon substrate 16b and the insulating substrate 2 are caused to be closely in contact with each other so as to be bonded with each other at room temperatures.

Figure 4:
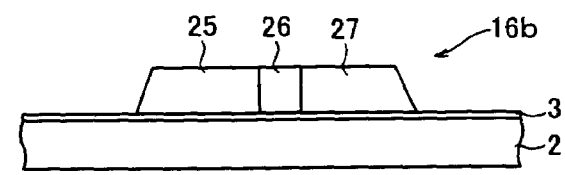
FIG. 4 is a schematic cross section illustrating a bipolar single-crystal silicon thin-film transistor of FIG. 3.

The semiconductor device 40 of the present embodiment adopts, as FIG. 4 shows, a laterally-structured bipolar thin-film transistor in which impurity ions are implanted into P and N areas and a collector 25, a base 26, and an emitter 27 are provided in one plane. However, the semiconductor device 40 may adopt a conventional vertically-structured thin-film transistor. Further, the junction may be formed by diffusing impurities, and instead of the thin-film transistor, a SIT (Static Induction Transistor) or a diode may be adopted in a similar manner.

Note that, however, since the present embodiment forms a laterally-structured bipolar thin-film transistor so as to realize the elimination of a planarizing process performed before the formation of the bipolar thin-film transistor, the manufacturing process can be simplified and the production efficiency can be improved.

Subsequently, heat treatment at temperatures of 400-600° C., in this case at a temperature about 550° C. is carried out so that the temperature of the dense position 15 of the single-crystal silicon substrate 10b is increased to be not less than the temperature of hydrogen dissociation from the single-crystal silicon, and this makes it possible to carry out cleavage stripping of an unnecessary part 11 of the single-crystal silicon substrate 10b, at the dense position 15, thereby manufacturing the bipolar single-crystal silicon thin-film transistor 16b on the insulating substrate 2.

Then a damaged layer on the surface of the singe-crystal silicon substrate 10b, which is left on the insulating substrate 2, is removed by carrying out isotropic plasma etching or wet etching, in this case by lightly etching for about 20 nm by wet etching using buffer hydrofluoric acid. As a result, as FIG. 3(c) shows, the bipolar single-crystal silicon thin-film transistor 16b which is about 80 nm thick is formed on the insulating substrate 2.

Subsequently, as FIG. 3(d) illustrates, a $SiO_2$ film 4 which is about 200 nm thick is formed as an interlayer insulating film on the entire surface of the insulating substrate 2, by plasma CVD using a gas in which $SiH_4$ is mixed with $N_2O$. Further, as FIG. 3(d) illustrates, an amorphous silicon film 5 which is about 50 nm thick is formed over the $SiO_2$ film 4 by plasma CVD using a $SiH_4$ gas.

Next, as FIG. 3(e) illustrates, the amorphous silicon film 5 is crystallized by applying excimer laser thereto so as to heat the film 5, and as a result, a polycrystalline silicon layer is developed and a non-single-crystal silicon thin film 5' is formed. On this occasion, the adhesive strength between the bipolar single-crystal silicon thin-film transistor 16b and the insulating substrate 2 may be enhanced.

Then, as FIG. 3(f) shows, an unnecessary part of the polycrystalline silicon film 5' is removed in order to cause a part, which becomes an active area of the device, to be left, and consequently an island-shaped pattern is obtained. Subsequently, a $SiO_2$ film 7 which is about 350 nm thick is deposited as a gate insulating layer by plasma CVD using a gas in which TEOS is mixed with oxygen. Then after providing a photo-resist as a resin planarized film, which is about 350 nm, on the entire surface, the entire surface of the resin planarized film and a part of the SiO₂ film 4 are etched by RIE (Reactive Ion Etching) which is anisotropic etching using a gas including oxygen and $CF_4$ (this etching step is not illustrated), and after the planarization, a SiO₂ film 7 which is about 60 nm thick is formed as a gate insulating film, by plasma CVD using a gas in which $SiH_4$ is mixed with $N_2O$.

Then gate electrodes 6 are formed on the SiO₂ film 7, and consequently the non-single-crystal silicon thin-film transistor 1a including the gate electrodes 6, the SiO₂ film 7 as a gate insulating film, and the non-single-crystal silicon thin film 5' are provided.

The subsequent steps such as the formation of a SiO₂ film 8 as an interlayer planarized insulating film, the perforation of a contact hole 21, and the formation of a metal wiring 22 are identical with the steps in Embodiments 1 and 2, and thus omitted here.

As described above, the method of manufacturing the semiconductor device 40 of the present embodiment is arranged such that, after the bipolar single-crystal silicon thin-film transistor 16b is formed, the non-single-crystal silicon thin-film transistor 1a made of the polycrystalline silicon thin film is formed. This arrangement makes it possible to readily bond the bipolar single-crystal silicon thin-film transistor 16b with the flat insulating substrate 2, and hence the bonding step can be simplified and the adhesive strength between the bipolar single-crystal silicon thin-film transistor 16b and the flat insulating substrate 2 can be improved.

Further, since the single-crystal silicon thin-film transistor in the present embodiment is bipolar type, the planarization step is unnecessary and thus the manufacturing costs can be reduced. Moreover, as in the case of the MOS transistor, the bipolar single-crystal silicon thin-film transistor may be arranged such that a part of the metal wiring is formed before the planarization step is carried out, and this makes it possible to further increase the degree of integration.

Figure 3:
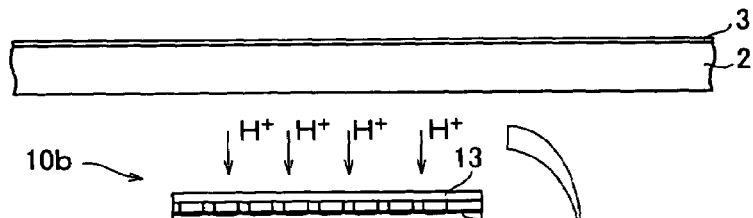
FIG. 3(a) is a cross section indicating a manufacturing process of a further embodiment of a semiconductor device in accordance with the present invention.
FIG. 3(b) is a cross section indicating another manufacturing process of the semiconductor device of FIG. 3(a).
FIG. 3(c) is a cross section indicating a further manufacturing process of the semiconductor device of FIG. 3(a).
FIG. 3(d) is a cross section indicating yet another manufacturing process of the semiconductor device of FIG. 3(a).
FIG. 3(e) is a cross section indicating still another manufacturing process of the semiconductor device of FIG. 3(a).
FIG. 3(f) is a cross section indicating still another manufacturing process of the semiconductor device of FIG. 3(a).
Figure 3:
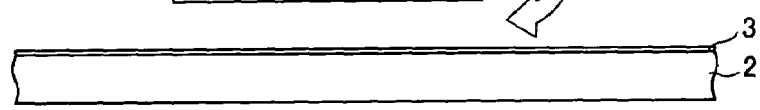
Figure 3:
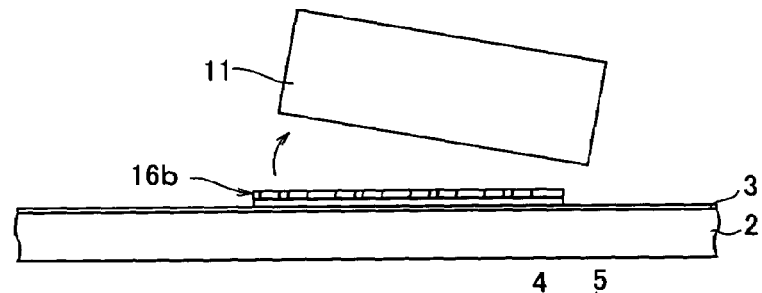
Figure 3:
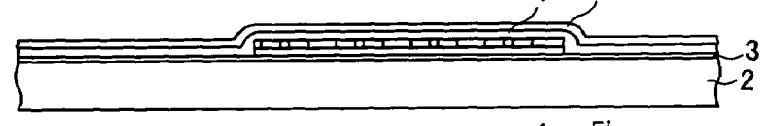
Figure 3:
Figure 3:
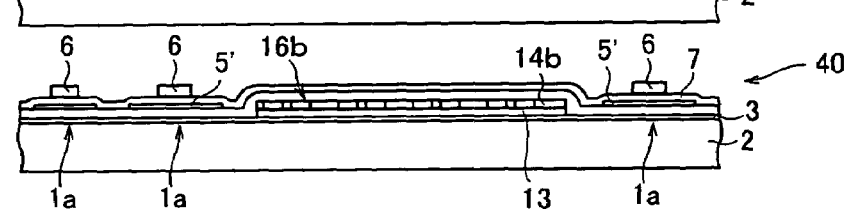

Incidentally, in the semiconductor device 40 of the present embodiment, a group of transistors are not separated from each other, as in FIG. 3(*f*). If problems such as a leak current or the cross talk between the elements occur, it is possible to separate the elements from each other, as a matter of course.

Embodiment 4

Figure 5:
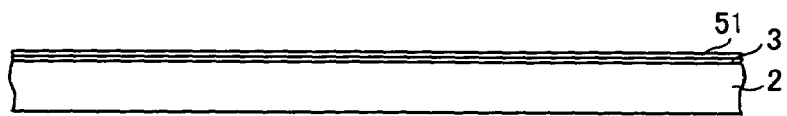
FIG. 5(a) is a cross section indicating a manufacturing process of yet another embodiment of a semiconductor device in accordance with the present invention.
FIG. 5(b) is a cross section indicating another manufacturing process of the semiconductor device of FIG. 5(a).
FIG. 5(c) is a cross section indicating a further manufacturing process of the semiconductor device of FIG. 5(a).
FIG. 5(d) is a cross section indicating yet another manufacturing process of the semiconductor device of FIG. 5(a).
FIG. 5(e) is a cross section indicating still another manufacturing process of the semiconductor device of FIG. 5(a).
FIG. 5(f) is a cross section indicating still another manufacturing process of the semiconductor device of FIG. 5(a).
Figure 5:
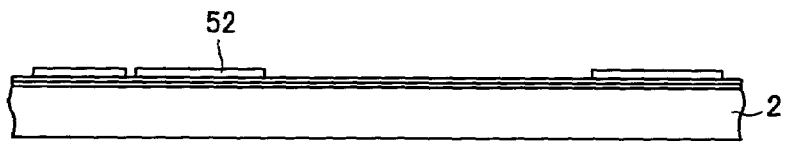
Figure 5:
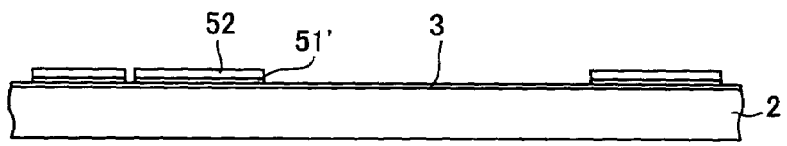
Figure 5:
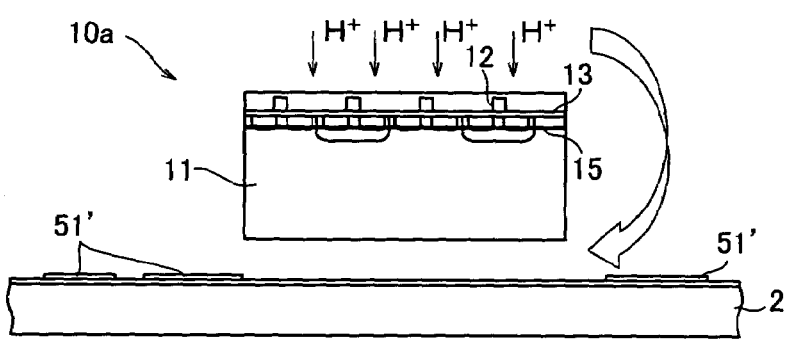
Figure 5:
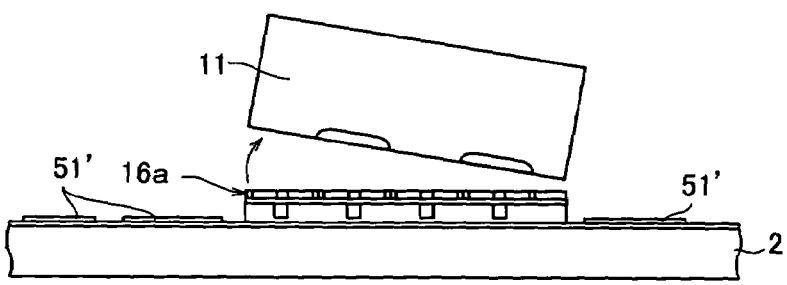
Figure 5:
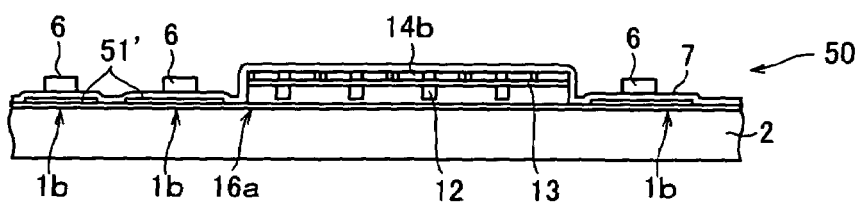

The following will describe yet another arrangement of a single-crystal silicon substrate, a semiconductor device, and a method of manufacturing the same, in accordance with the present invention. FIGS. 5(*a*)-5(*f*) are cross sections illustrating a manufacturing process of the semiconductor device of said yet another arrangement of the present invention. By the way, members having the same functions as those described in Embodiments 1-3 are given the same numbers, so that the descriptions are omitted for the sake of convenience.

A semiconductor device 50 of the present embodiment is identical with the semiconductor device 20 of Embodiment 1 to the extent that a MOS single-crystal silicon thin-film transistor and a MOS non-single-crystal silicon thin-film transistor are formed on one insulating substrate 2. On the contrary, the semiconductor device 50 is different from the semiconductor device 20 to the extent that the semiconductor device 50 adopts a continuous grain silicon as a non-single-crystal silicon thin film.

In this manner, using the continuous grain silicon as the non-single-crystal silicon thin film makes it possible to obtain a non-single-crystal silicon thin-film transistor 1b whose characteristics are better than the characteristics of a non-single-crystal silicon thin-film transistor made of polycrystalline silicon.

In the semiconductor device 50 of the present embodiment, a SiO₂ film 3, a MOS non-single-crystal silicon thin-film transistor 1b, and a MOS single-crystal silicon thin-film transistor 16a are provided on the insulating substrate 2.

In particular, the non-single-crystal silicon thin-film transistor 1b is formed using polycrystalline silicon in which the crystal axis are uniform, i.e. using so-called continuous grain silicon as a non-single-crystal silicon thin film 52'.

Incidentally, while an N-channel TFT formed in the area of a conventional continuous grain silicon has mobility of about 200 $cm^2$/V·sec, an N-channel TFT formed in the area of a single-crystal silicon thin film 14a in an active matrix substrate for liquid crystal displaying, on the active matrix substrate the semiconductor device 50 of the present embodiment being formed, has mobility of about 550 $cm^2$/V·sec. This proves that the present embodiment makes it possible to manufacture an active matrix substrate which can respond quicker than a conventional active matrix substrate.

In this active matrix substrate for liquid crystal displaying, while not only a driver but also devices formed in the area of the non-single-crystal silicon thin film 52' require a signal and power supply voltage of 7-8V, a timing controller which is a device formed in the area of the single-crystal silicon thin film 14a stably operates with the supply of a signal and power-supply voltage of 2.7V.

Now, the manufacturing process of the semiconductor device 50 will be described in reference to FIGS. 5(*a*)-5(*f*).

In the present embodiment, as in the case of Embodiment 1, code 1737 (alkaline-earth alumino-borosilicate glass) of Corning® is adopted as the insulating substrate 2, and as FIG. 5(*a*) shows, on the entire surface of the insulating substrate 2, a SiO₂ film 3 which is about 100 nm thick is deposited by plasma CVD using a gas in which TEOS is mixed with O₂.

Further, as FIG. 5(*b*) shows, on the entire surface of SiO₂ film 3, an amorphous silicon thin film 51 which is about 50 nm thick is deposited by plasma CVD using a $SiH_4$ gas. Then on the entire surface of the film 51, a SiO₂ film 52 which is about 200 nm is deposited by plasma CVD using a gas in which $SiH_4$ is mixed with $N_2O$.

After an opening section is formed in a predetermined area of the SiO₂ film 52 by etching, an oxidized film (SiO₂ film) is formed by thinly oxidizing the surface of the amorphous silicon thin film 51 at the opening section, in order to control the hydrophilicity of the surface. Further, the surface having been thinly oxidized is spin-coated by a nickel acetate aqueous solution.

Next, as a result of solid phase crystallization at a temperature of 580° C. for about 8 hours, polycrystalline silicon in which the crystal axis are uniform, i.e. so-called continuous grain silicon is developed so that a continuous grain silicon thin film 51' is formed.

Further, as FIG. 5(*c*) illustrates, the SiO₂ film 52 on the continuous grain silicon thin film 51' is removed. Subsequently, a predetermined area of the continuous grain silicon thin film 51' is removed by etching.

Here, as in the case of Embodiment 2, the surface is planarized by GCIB (Gas Cluster Ion Beam) using a low-energy (about 3 keV) halide gas, so that the bonding characteristics are improved. As in the case of Embodiment 1, the semiconductor device 50 of the present embodiment is also arranged such that a part which becomes a MOS single-crystal silicon thin-film transistor by being subjected to cleavage and thinning is manufactured in advance so that a single-crystal silicon substrate 10a to which hydrogen ions are implanted by applying predetermined energy is prepared.

Then, as FIG. 5(d) shows, after the insulating substrate 2 on which the continuous grain silicon thin film 51' is formed and the single-crystal silicon substrate 10a are washed using a SC1 liquid and activated, a side of the single-crystal silicon substrate 10a, the side being close to the dense position 15, is aligned with an area on the insulating substrate 2, the area having been subjected to the removal by etching. After performing this alignment at room temperatures, the single-crystal silicon substrate 10a and the insulating substrate 2 are caused to be closely in contact with each other so as to be bonded with each other.

On this occasion, the distance between the continuous grain silicon thin film 51' and the single-crystal silicon substrate 10a is at least 0.3 μm, preferably not less than 0.5 μm. With this arrangement, it is possible to prevent metal elements such as nickel, platinum, tin, and palladium, which are used in the subsequent manufacturing process, from being diffused to the single crystal silicon thin film 14a, thereby stabilizing the characteristics of the single-crystal silicon thin-film transistor.

Subsequently, the temperature of the dense position 15 of the single-crystal silicon substrate 10a is increased to not less than the temperature of hydrogen dissociation from the single-crystal silicon, by applying laser to the interface 15 or by means of lamp annealing in which a peak temperature is not less than 700° C., so that, as FIG. 5(e) shows, an unnecessary part 11 of the single-crystal silicon substrate 10a is subjected to cleavage stripping at the dense position 15 as a border.

Then, a damaged layer of the signal-crystal silicon thin film 10a, which has been left on the insulating substrate 2, is removed by lightly etching the same for about 10 nm, by anisotropic plasma etching or wet etching, in the present case wet etching using buffer hydrofluoric acid.

With this arrangement, it is possible to form the continuous grain silicon thin film 51' and the single-crystal silicon thin film 14a, which are both about 50 nm thick, on the insulating substrate 2.

Subsequently, an unnecessary part of the continuous grain silicon thin film 51' is removed by etching.

Then an opening section is formed on the $SiO_2$ film around the continuous grain silicon thin film 51', and in order to perform the gettering of Ni which has been added for precipitating the development of crystal, using the $SiO_2$ film as a mask, concentrated $P^+$ ions (15 KeV, $5\times10^{15}/cm^2$) are implanted, and heat treatment at temperatures about 800° C. is performed for one minute by RTA.

Note that, although a space is physically provided in order to prevent the diffusion of nickel atoms to the single-crystal silicon thin film 14a, small quantities of the nickel atoms are possibly diffused during the process. Thus, while an active area of the single-crystal silicon thin film 14a is also preferably subjected to the gettering, if the formation of the space takes priority, the gettering can be omitted.

Next, an unnecessary part of the continuous grain silicon thin film 51' and the single-crystal silicon thin film 14a are removed by etching, so that an island-shaped pattern, which becomes an active area of the device, is formed.

Subsequently, a $SiO_2$ film which is about 350 nm thick is deposited by P-CVD using a gas in which TEOS is mixed with oxygen, and after etching the island-shaped pattern with the $SiO_2$ film for about 400 nm by RIE which is anisotropic etching, a $SiO_2$ film 7 as a gate insulating film which is about 60 nm thick is formed by plasma CVD using a gas in which $SiH_4$ is mixed with $N_2O$.

On this occasion, side walls are formed at the respective end portions of the single-crystal silicon thin film 14a and the continuous grain silicon thin film 51'.

The subsequent steps such as the formation of a $SiO_2$ film 8 as an interlayer planarized insulating film, the perforation of a contact hole 21, and the formation of a metal wiring 22 are identical with the steps in Embodiments 1 and 2, and thus omitted here.

As described above, the method of manufacturing the semiconductor device 50 of the present embodiment is arranged such that, after the formation of the polycrystalline silicon as a non-single-crystal silicon thin film, the single-crystal thin-film transistor 16a is formed, and subsequently the $SiO_2$ film 7 as a gate insulating film of the non-single-crystal silicon thin-film transistor 1b. With this arrangement, it is possible to reduce the number of the $SiO_2$ films and hence simplify the manufacturing process.

Embodiment 5

The following will describe still another arrangement of a single-crystal silicon substrate, a semiconductor device, and a method of manufacturing the same, in accordance with the present invention. FIGS. 6(a)-6(h) are cross sections illustrating a manufacturing process of the semiconductor device of said still another arrangement of the present invention. By the way, members having the same functions as those described in Embodiments 1-4 are given the same numbers, so that the descriptions are omitted for the sake of convenience.

A semiconductor device 60 of the present embodiment is identical with the semiconductor device 40 of Embodiment 3 to the extent that a bipolar single-crystal thin-film transistor and a MOS non-single-crystal silicon thin-film transistor are formed on one insulating substrate 2.

On the contrary, the semiconductor device 60 is different from the semiconductor device 40 of Embodiment 3 to the extent that, in the semiconductor device 60, a bottom-gate transistor is formed as a non-single-crystal silicon thin-film transistor.

Until the step of performing cleavage stripping, a manufacturing process of the semiconductor device 60 of the present embodiment is identical with the manufacturing process of the semiconductor device 30 of Embodiment 2. Also, a semiconductor device to be manufactured by the process of the present embodiment is structured so as to be identical with the semiconductor device 30.

Figure 6:
FIG. 6(a) is a cross section indicating a manufacturing process of still another embodiment of a semiconductor device in accordance with the present invention.
FIG. 6(b) is a cross section indicating another manufacturing process of the semiconductor device of FIG. 6(a).
FIG. 6(c) is a cross section indicating a further manufacturing process of the semiconductor device of FIG. 6(a).
FIG. 6(d) is a cross section indicating yet another manufacturing process of the semiconductor device of FIG. 6(a).
FIG. 6(e) is a cross section indicating still another manufacturing process of the semiconductor device of FIG. 6(a).
FIG. 6(f) is a cross section indicating still another manufacturing process of the semiconductor device of FIG. 6(a).
FIG. 6(g) is a cross section indicating still another manufacturing process of the semiconductor device of FIG. 6(a).
FIG. 6(h) is a cross section indicating still another manufacturing process of the semiconductor device of FIG. 6(a).
Figure 6:
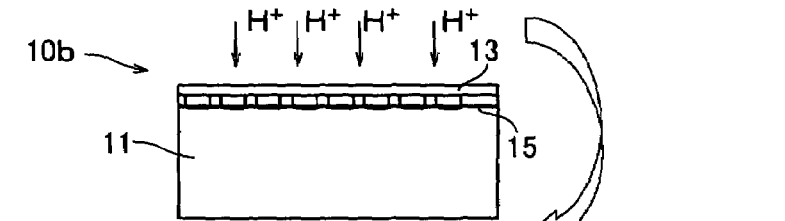
Figure 6:
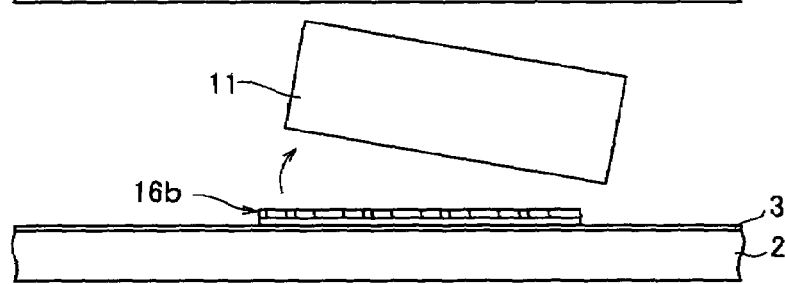
Figure 6:
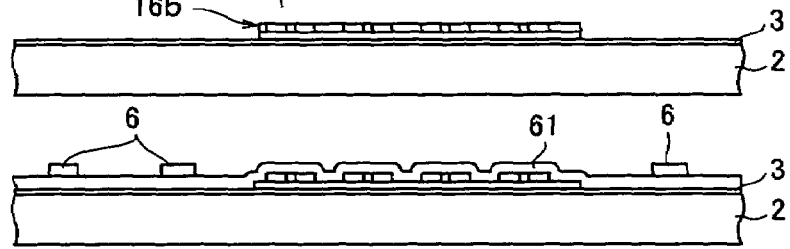
Figure 6:
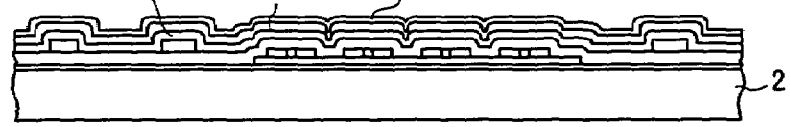
Figure 6:
Figure 6:
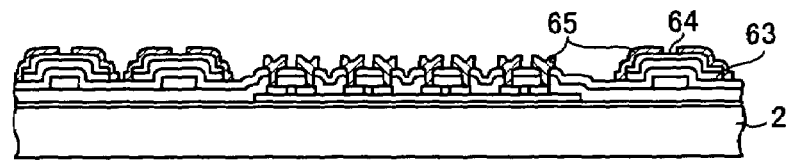
Figure 6:
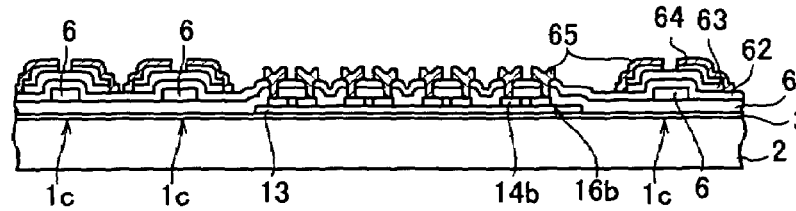

As FIG. 6(i) illustrates, the steps after the step of performing cleavage stripping are arranged as follows: After a part to be a single-crystal device is separated, an interlayer insulating film is formed on the entirety, and gate electrodes 6 for providing an amorphous silicon TFT and circuit are formed thereon. Further, a gate insulating film 62 and a non-dope amorphous silicon 63 are formed thereon in the shape of islands, and moreover a $N^+$ amorphous silicon thin film 64 and a metal wiring 65 for wires of the source and drain are formed.

Incidentally, although not being illustrated, for purposes such as liquid crystal displaying, a protective insulating film, a planarized film, and a transparent conductive film for displaying are further deposited thereon.

The following will describe a method of manufacturing the semiconductor device 60 with reference to FIGS. 6(a)-6(h).

First, as FIG. 6(a) illustrates, code 1737 (alkaline-earth alumino-borosilicate glass) of Corning® is adopted as the insulating substrate 2. Then on the entire surface of the insulating substrate 2, a SiO$_2$ film 3 which is about 50 nm thick is deposited by plasma CVD using a gas in which TEOS is mixed with O$_2$.

Here, as in the case of the semiconductor device 40 of Embodiment 3, the semiconductor device 60 of the present embodiment is also arranged such that a part 16b which becomes a bipolar single-crystal silicon thin-film transistor when being subjected to cleavage and thinning is manufactured in advance so that a single-crystal silicon substrate 10b is prepared, and into this single-crystal silicon substrate 10b, a predetermined concentration of hydrogen ions is implanted by a predetermined energy, and then the single-crystal silicon substrate 10b is reshaped so as to have a predetermined size.

After the insulating substrate 2 and the single-crystal silicon substrate 10b having been cut are washed by a SC1 liquid and activated, as FIG. 6(b) shows, a side of the single-crystal silicon substrate 10b, the side being close to the dense position 15, is aligned with a predetermined position, by a method identical with the method in Embodiment 1. After performing this alignment, the single-crystal silicon substrate 10b and the insulating substrate 2 are caused to be closely in contact with each other so as to be bonded with each other at room temperatures. Although not being illustrated, a metal wiring may be formed on the single-crystal silicon substrate in advance, since this arrangement makes it possible to realize higher level of integration thanks to miniaturization.

Subsequently, heat treatment at temperatures of 400-600° C., in this case at a temperature of about 550° C. is carried out so that the temperature of the dense position 15 of the single-crystal silicon substrate 10b is increased to be not less than the temperature of hydrogen dissociation from the single-crystal silicon, and thus, as FIG. 6(c) shows, the single-crystal silicon substrate 10b is subjected to cleavage stripping at the dense position 15 as a border. When the metal wiring has been formed in advance, a melting point of the metal wiring is higher than the above-described range of temperatures even if the metal wiring is made of aluminum alloy, if hillock formation is neglected, and hence it is unnecessary to change the manufacturing process.

Next, a part of the single-crystal silicon thin film 14b, which is left on the insulating substrate 2, is removed by etching, and hence the single-crystal silicon thin film 14b is manufactured so as to be island-shaped. Then a damaged layer on the surface of the film 14b is lightly etched for about 10 nm by isotropic plasma etching or wet etching, in the present case wet etching using buffered hydrofluoric acid.

On this account, a part of the MOS thin-film transistor made of the single-crystal silicon thin film 14b which is about 50 nm thick is formed on the insulating substrate 2.

Subsequently, as FIG. 6(d) shows, on the entire surface of the insulating substrate 2, a SiO$_2$ film (interlayer insulating film) 61 which is about 200 nm thick is formed by plasma CVD using a gas in which SiH$_4$ is mixed with N$_2$O.

Further, a TaN thin film is deposited on the entirety of the SiO$_2$ film 61 by sputtering, and a predetermined pattern is manufactured therefrom so that a wiring of a gate layer, such as gate electrodes 6 and gate bus lines is formed.

Note that, the wiring of the gate layer does not have to be made of the materials above, and hence various metals such as aluminum and aluminum alloy may be used for manufacturing the wiring, in consideration of electrical resistance, heat resistance, and subsequent manufacturing steps, etc.

Then, as FIG. 6(e) shows, a silicon nitride film 62 which is about 200 nm thick is formed as a gate insulating film, by plasma CVD using a SiH$_4$ gas and a NH$_3$ gas. Subsequently, an amorphous silicon film 63 which is about 50 nm is deposited thereon by plasma CVD using a SiH$_4$ gas, and further a N+ amorphous silicon film 64 which is P-doped by a SiH$_4$ gas and PH$_3$ mixed gas and about 30 nm thick is deposited thereon.

Next, as FIG. 6(f) illustrates, an island-shaped part of an amorphous silicon film which is non-dope as well as P-doped, the part becomes a transistor, is formed by etching, and as FIG. 6(g) shows, a titanium film as a metal film 65 for a source bus wiring is deposited by sputtering, and manufactured so as to be a predetermined pattern.

Note that, the metal film 65 for the source bus wiring is also not necessarily made of titanium, and hence the metal film 65 may be made of various metals such as aluminum and aluminum alloy, in consideration of electrical resistance, heat resistance, and subsequent manufacturing steps, etc.

Then, as FIG. 6(h) shoes, a N$^+$ layer in a predetermined area (to be a channel between the source and drain) of the island-shaped amorphous silicon 63 (and a part of the non-dope layer) is (are) removed by etching so that an amorphous TFT is formed.

Then a silicon nitride film which is about 200 nm thick is deposited thereon as a protective insulating film, by plasma CVD using a SiH$_4$ gas and a NH$_3$ gas.

Subsequently, as in the manufacturing process of an active matrix substrate made of conventional amorphous silicon, for instance, a resin interlayer film and transparent electrodes for displaying are formed so that an active matrix substrate for liquid crystal displaying is finally obtained.

As described above, since the semiconductor device 60 of the present embodiment adopts an amorphous silicon as the non-single-crystal silicon thin film, the manufacturing process of the non-single-crystal silicon film can be simplified and the costs of manufacturing the semiconductor device 60 can be reduced. Further, since the amorphous silicon has a characteristic of low off-current, the semiconductor device 60 can be adopted to devices such as a low-power consumption LCD.

Note that, although the non-single-crystal silicon thin-film transistor 1c adopts an amorphous silicon as the non-single-crystal silicon thin film, a polycrystalline silicon thin film or a continuous grain silicon thin film may be adopted as the non-single-crystal silicon thin film.

Further, since the non-single-crystal silicon thin-film transistor 1c is arranged such that the gate electrodes 6 are provided on the side of the insulating substrate 2, i.e. the non-single-crystal silicon thin-film transistor 1c adopts a bottom-gate structure, it is possible to easily form the amorphous silicon and hence the productivity is improved thanks to the simplification of the manufacturing process, and consequently it is possible to reduce the manufacturing costs of the semiconductor device.

Note that, although the non-single-crystal silicon thin-film transistor 1c of the present embodiment has the bottom-gate structure, the transistor 1c is not necessarily arranged as such, thereby being able to be arranged such that a non-single-crystal silicon, a gate insulating film, and a gate are provided in this order from a substrate.

Figure 7:
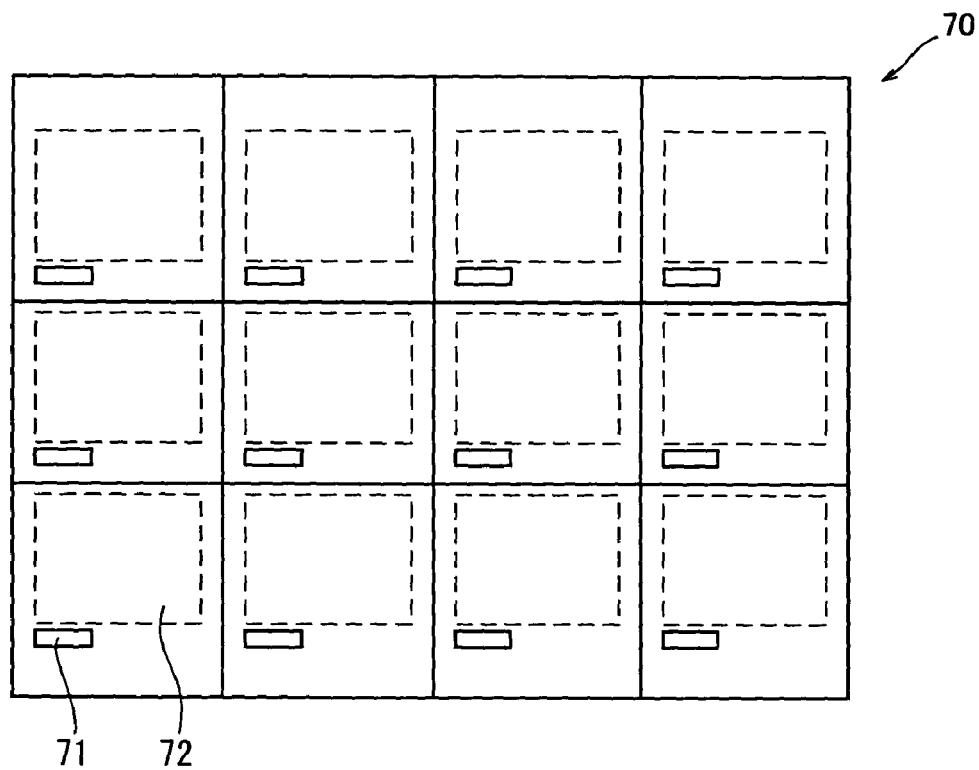
FIG. 7 is a plan view, illustrating an active matrix substrate manufactured using the semiconductor device of the present invention.

As FIG. 7 shows, the respective semiconductor devices having been described in Embodiments 1-5 may be formed as highly-functional circuit section (including a high-speed DAC, a high-speed timing controller, an image processing circuit, etc.) 71 on an active matrix substrate 70 including display sections 72. Further, it is possible to form a display device by adopting the active matrix substrate 70 as a display panel.

Note that, in the single-crystal silicon thin-film transistors 16a and 16b of Embodiments 1-5, a wiring layer made of high melting point metal may be provided above the gate layer.

More specifically, it is possible to adopt the following arrangement: A wiring for a circuit which requires microfabrication is formed using TiW alloy, and after the formation of an interlayer insulating film by CVD or PECVD using TEOS a $SiH_4$ gas and a $N_2O$ gas, planarization is performed by methods such as CMP, and then a predetermined concentration of hydrogen ions is implanted to the planarized film by a predetermined energy.

In this manner, a single-crystal silicon thin-film transistor on which a metal wiring is formed in advance is formed on an insulating substrate and a metal wiring is further formed after the formation of an oxide film, so that a semiconductor device with a double-metal-wiring arrangement can be obtained and a functional circuit in which higher integration is realized can be formed.

Here, the high melting metal for the metal wiring layer can be chosen from materials such as polycrystalline silicon, silicide of various metals, titanium, tungsten, molybdenum, titanium/tungsten, tantalum nitrate, and tantalum, on condition that the heat resistance against the temperature of heat treatment on the occasion of the cleavage stripping of the single-crystal silicon substrate. When the cleavage stripping of the single-crystal silicon substrate is performed using laser light, the heat resistance does not have to be high as above.

Further, the present invention is not limited to the above-described embodiments. Thus, for instance, the method of manufacturing the non-single-crystal silicon, the material and thickness of the interlayer insulating film, etc. may be realized by those means known to persons skilled in the art.

Moreover, the semiconductor device formed by single-crystal silicon is also not limited to the MOS transistor and bipolar transistor, and hence the semiconductor device may be formed by an SIT or diode.

Figure 20:
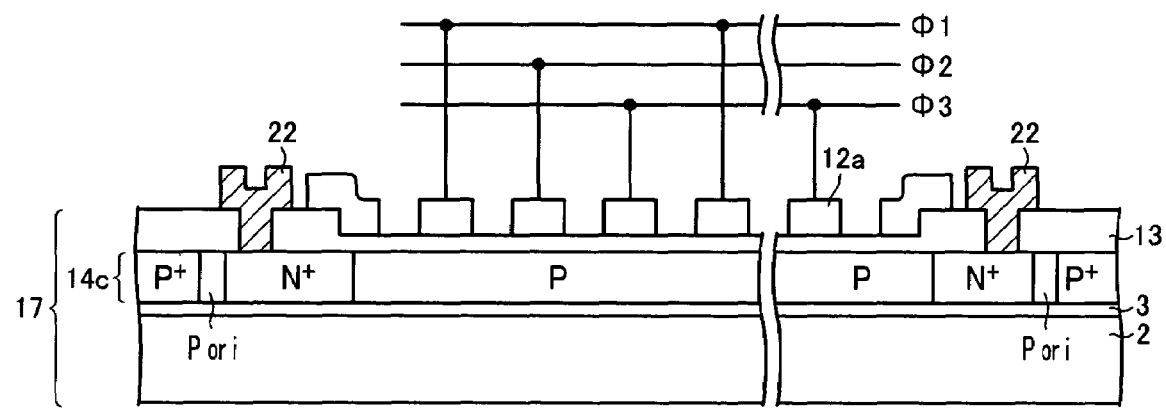
FIG. 20 is a cross section indicating a part of still another manufacturing process of the semiconductor device of the present invention.

For instance, the aforementioned single-crystal silicon thin-film device is preferably provided with a MOS single-crystal silicon thin-film transistor and (i) an image sensor including a Schottky/PN-junction diode or (ii) a CCD image sensor. A cross section in FIG. 20 illustrates an example of such a semiconductor device including a CCD image sensor and a PN-junction diode. In this manner, there is such a possible arrangement that an image sensor 17 is formed by adopting a single-crystal silicon thin film 14c, and this image sensor 17 as well as a MOS single-crystal silicon thin-film transistor (not illustrated) are formed in an insulating substrate 2. Here, a transfer gate 12a is made of materials identical with the materials of the MOS single-crystal silicon thin-film transistor. With this arrangement, it is possible to integrate differently-arranged or differently-structured thin-film devices in different areas, and hence CMOS devices such as an image sensor and devices having structures different from those of the CMOS devices can be integrated with ease, even if the coexistence of these devices has conventionally been extremely difficult, so that highly-functional devices which have not been able to be manufactured can be created.

In this manner, one of the important benefit of the present invention is such that different semiconductor devices having different characteristics can be integrated on a single glass substrate.

Further, although the examples in above-described Embodiments 1-5 relate to two different silicon thin-film transistors having different characteristics, the present invention is not limited to this arrangement so that a semiconductor device of the present invention may be arranged such that 3 or more devices having different characteristics are formed on a single substrate.

Figure 19:
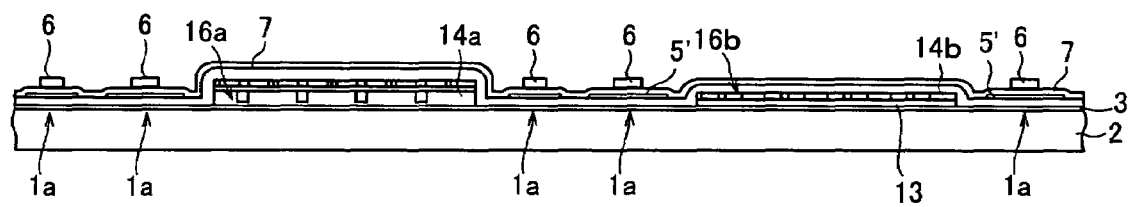
FIG. 19 is a cross section indicating still another manufacturing process of the semiconductor device of the present invention.

For instance, in the case of a semiconductor device in which a MOS transistor and a bipolar transistor are formed as single-crystal silicon thin-film transistors and a MOS transistor is formed as a non-single-crystal silicon thin-film transistor, 3 semiconductor devices having different characteristics can be formed on one substrate, and thus it is possible to obtain a semiconductor device having higher performances and functions. An example of such a semiconductor device is shown in FIG. 19. This figure is equivalent to a cross section illustrating the step in the manufacturing process, shown in FIGS. 1(f) and 3(f).

In such a semiconductor device, a single-crystal silicon thin film of a MOS thin-film transistor made of single-crystal silicon is preferably thinner than a single-crystal silicon thin film of a bipolar thin-film transistor.

This is because, it has been known that generally thinner MOS thin-film transistors have better characteristics, and relatively thicker bipolar thin-film transistors have better characteristics.

Note that, in a MOS thin-film transistor made by a single-crystal silicon thin film, the widths of gate lines are preferably not more than 1 μm. Also, in a bipolar thin-film transistor made by a single-crystal silicon thin film, the base width is preferably not more than 2.5 μm.

More preferably, the base width is not more than 1 μm. This is because, the narrower the base width is, the better the efficiency of diffusion and passage of the minority carriers, and hence time can be saved.

With this arrangement, it is possible to increase the speed of switching the transistor.

Embodiment 6

The following will describe still another arrangement of a single-crystal silicon substrate, a semiconductor device, and a method of manufacturing the same, in accordance with the present invention. By the way, members having the same functions as those described in Embodiments 1-5 are given the same numbers, so that the descriptions are omitted for the sake of convenience.

In the present embodiment, the thickness of the single-crystal silicon substrate before bonding is about 70 μm, while, in Embodiments 1-5, the thickness of the single-crystal silicon substrate before bonding is about 100 μm. Although the present embodiment and Embodiments 1-5 are identically arranged except the thickness of the single-crystal silicon substrate before bonding, the present embodiment excels in the quality of bonding between the glass substrate and silicon substrate, and in particular, the alignment failure at the corners of the substrate is reduced.

Incidentally, in the present embodiment, the thickness is reduced after the implantation of hydrogen ions, by a grinding method used for IC cards. The thinner the thickness of the single-crystal silicon is, the more the bonding quality improves. However, taking the manageability of the single-crystal silicon into consideration, the thickness is preferably within the range of about 50-100 μm.

Further, although all of Embodiments 1-6 describe a MOS transistor, the present invention is not limited to the transistor of this type. Thus, for instance, even if a MIS transistor other than the MOS transistor is adopted, the same effects can be obtained.

Here, the MIS transistor is a transistor which adopts a silicon nitride film as a gate insulating film, and since the electric field effects of this transistor is great due to the high permittivity of the gate insulating film, the transistor can operate at low voltages even if a leak current of the gate increases.

Embodiment 7

The following will describe still another embodiment of the present invention.

In the above-described embodiments, after the formation of a semiconductor device structure on a single-crystal silicon substrate, the single-crystal silicon substrate is separated (separated) so that a single-crystal silicon thin film is formed on an insulating substrate. However, the present invention is not limited to this arrangement. Thus, there is such a possible arrangement that a single-crystal silicon substrate on which a semiconductor device structure is not provided is separated so that a single-crystal silicon thin film is provided on an insulating substrate, and then a semiconductor device structure is formed on the single-crystal silicon thin film.

Figure 10:
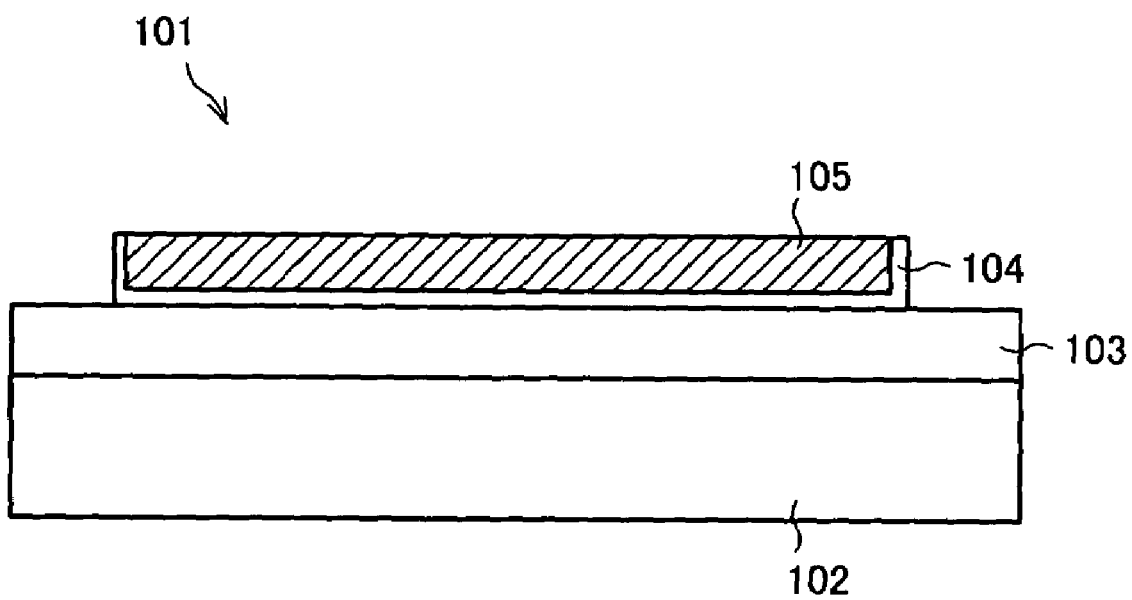
FIG. 10 is a cross section illustrating an embodiment of an SOI substrate of the present invention.

As FIG. 10 illustrates, an SOI (Silicon on Insulator) substrate 101 of the present embodiment is manufactured by bonding a light-transmitting substrate (insulating substrate) 102 with a single-crystal silicon thin film 105.

More specifically, on the light-transmitting substrate 102, an oxidized silicon film (insulating film) 103 is deposited. This light-transmitting substrate 102 is, for instance, a light-transmitting amorphous non-alkali high strain point glass substrate, such as code 1737 (alkaline-earth alumino-borosilicate glass) of Corning®. Further, the single-crystal silicon thin film 105 is covered with an oxidized silicon film (covering film) 104, and then a bonded interface (surface) where the oxidized silicon film 103 is bonded with the oxidized silicon film 104 is formed. The steps for manufacturing the SOI substrate 101 will be described below with reference to FIGS. 11(a)-11(g).

On the light-transmitting substrate 102 shown in FIG. 11(a), the oxidized silicon film 103 is formed. Thus, as FIG. 11(b) shows, the oxidized silicon film 103 is deposited on the light-transmitting substrate 102. The oxidized silicon film 103 is provided in this manner because the water-wettability (hydrophilicity) of the light-transmitting substrate 102 is insufficient without the oxidized silicon film 103.

The thickness of the oxidized silicon film 103 is preferably within the range of about 40-300 nm, and is about 100 nm in this embodiment. The method of forming the film is not particularly limited. For instance, by a TEOS-$O_2$ plasma CVD method, a TEOS (Tetra Ortho Silicate) gas is mixed with an oxygen gas in a vacuum chamber, and then the oxidized silicon film 103 which is about 100 nm thick is formed by plasma discharging at a temperature about 320° C.

Also, since the oxidized silicon film 103 is formed in thermally non-equilibrium states at relatively low temperatures (300-400° C.), the composition ratio of silicon to oxygen is not exactly 1:2, and hence, the composition ratio is, for instance, 1:1.9. Thus, the oxidized silicon film 103 of the present embodiment is a so-called oxidized silicon film, i.e. a $SiO_2$ insulating film. Incidentally, when the oxidization is performed at a temperature about 900° C., the oxidized silicon film 103 is formed in thermally equilibrium states so that the composition ratio of silicon to oxygen is exactly 1:2.

On this occasion, the tangent of the maximum slope of the micro-roughness to the surface of the oxidized silicon film 103 and the flat surface of the substrate is not more than 0.06. More specifically, for instance, in respect of micro-roughness which is not more than 5 nm high and measured in a 1-5 μm square on the surface of the oxidized silicon film 103, the tangent of the maximum slope of the micro-roughness to the surface of the light-transmitting substrate 102 is not more than 0.06. By the way, these micro-roughness on the surface will be discussed later.

Meanwhile, the single-crystal silicon thin film 105 as illustrated in FIG. 10 is manufactured from the single-crystal silicon substrate 106 as shown in FIG. 11(c).

The surface of the single-crystal silicon substrate 106 is subjected to heat treatment, and then covered with the oxidized silicon film 104 as in FIG. 11(d). The thickness of the oxidized silicon film 104 is preferably 5-300 nm, and more preferably 40-300 nm. In the present case, the thickness is about 100 nm.

Next, as FIG. 11(e) illustrates, hydrogen ions indicated by arrows in the figure are implanted into a predetermined interface (dense position of implanted hydrogen ions) of the single-crystal silicon substrate 106. Here, as FIG. 11(e) shows, the dense position 110 is located at a predetermined depth from the surface.

Subsequently, as FIG. 11(f) illustrates, the light-transmitting substrate 102 in FIG. 11(c) is bonded with the single-crystal silicon substrate 106 in FIG. 11(e), after these substrates are washed using a SC1 liquid and dried. Now, the steps of washing and drying will be described as below.

In the present embodiment, the light-transmitting substrate 102 on which the oxidized silicon film 103 is provided as a covering film is bonded with the single-crystal silicon substrate 106 whose surface is oxidized and covered by the oxidized silicon film 104, without using an adhesive. To perform this bonding, the condition, cleanliness, and degree of activity of the respective surfaces of the films are very important factors.

Note that, such bonding without using an adhesive is realized thanks to contributions by van der Waals force, electric dipole, and hydrogen bond. The respective surfaces of the substrates are easily bonded with each other especially when both of the surfaces are similarly arranged in terms of the balance of the above-mentioned contributions.

First, the light-transmitting substrate 102 covered with the oxidized silicon film 103 and the single-crystal silicon substrate 106 whose surface is oxidized and covered with the oxidized silicon film 104 are washed using a SC1 liquid.

The SC1 liquid is made by mixing commercially-available ammonia water ($NH_4OH$: 30% solution), oxygenated water ($H_2O_2$: 30% solution), and pure water ($H_2O$) at a predetermined ratio. For instance, these waters are mixed at a ratio of 5:12:60.

Into this SC1 liquid, the light-transmitting substrate 102 and the single-crystal silicon substrate 106 are immersed for 10 minutes.

Note that, as "Ultra-Clean USLI Technology" (Tadahiro Omi; Baihukan; page 172) describes, the ammonia water slightly etches the surface of oxidized silicon so that the immersion should not take long time.

Subsequently, the light-transmitting substrate 102 and the single-crystal silicon substrate 106 are rinsed by flowing pure water for 10 minutes, so that the washing step is completed. the resistivity of this pure water is, for instance, not less than 10 MΩcm. Then the substrates having been washed are quickly dried using devices such as a spin dryer, and consequently the light-transmitting substrate 102 covered with the oxidized silicon film 103 and the single-crystal silicon substrate 106 whose surface is oxidized and covered with the oxidized silicon film 104 are caused to be in touch with each other and bonded with each other.

Next, in order to form the single-crystal silicon thin film 105 by separating the single-crystal silicon substrate 106, heat treatment by carrying out annealing for 30 minutes by means of an electric furnace or by carrying out lamp annealing. Through this step, as FIG. 11(g) shows, a single-crystal silicon substrate 106a is separated at a dense position 110 of implanted hydrogen ions, so that the SOI substrate 101 including the single-crystal silicon thin film 105 is formed. In the present case, the bonding quality at the bonded interface does not deteriorate.

Note that, the thickness of the single-crystal silicon thin film 105 on the surface of the SOI substrate 101 is preferably 300 nm. Also, the directions of the surface of the single-crystal silicon thin film 105, the surface facing the substrate, are set so as to be (100), (110), and (111). With this arrangement, it is possible to obtain a sufficiently flat mirror surface. In other words, it is possible to manufacture an SOI substrate having a flat silicon film surface which does not require polishing.

Figure 11:
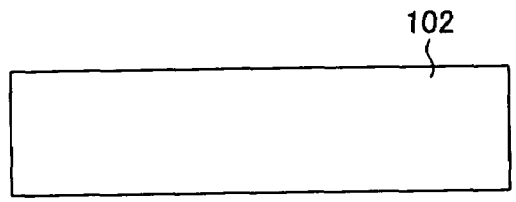
FIG. 11(a) is a cross section of an insulating substrate included in the above-mentioned SOI substrate.
FIG. 11(b) is a cross section illustrating the state of depositing an insulating film on the above-mentioned insulating substrate.
FIG. 11(c) is a cross section of a single-crystal silicon substrate.
FIG. 11(d) is a cross section illustrating the state of covering the single-crystal silicon substrate with a covering film.
FIG. 11(e) is a cross section illustrating the state of implanting hydrogen ions into the single-crystal silicon substrate of FIG. 11(d).
FIG. 11(f) is a cross section illustrating the state of bonding the insulating substrate of FIG. 11(b) to the single-crystal silicon substrate of FIG. 11(e).
FIG. 11(g) is a cross section illustrating the state of manufacturing the above-mentioned SOI substrate by separating and stripping the single-crystal silicon substrate.
Figure 11:
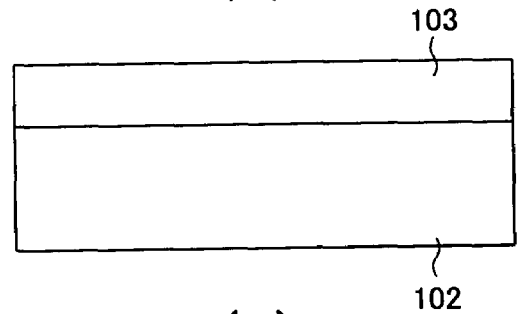
Figure 11:
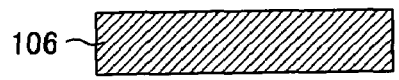
Figure 11:
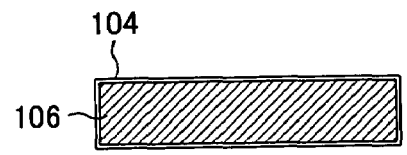
Figure 11:
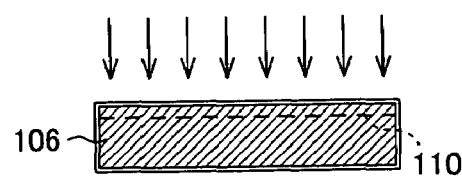
Figure 11:
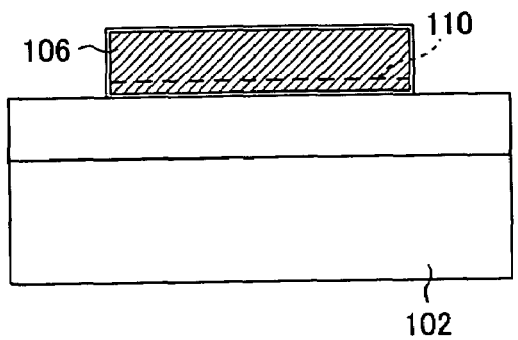
Figure 11:
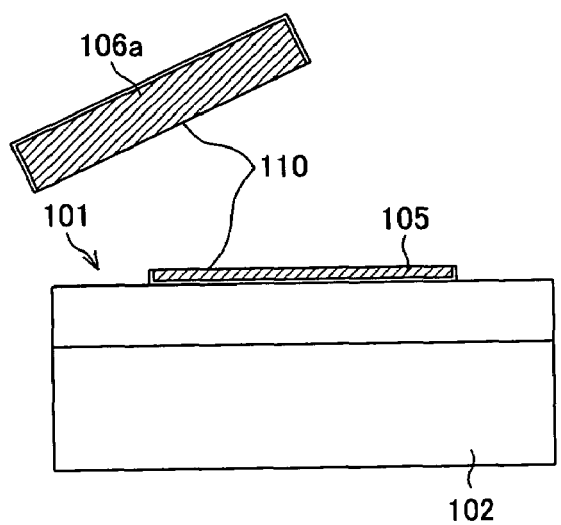

Now, referring to FIG. 12, the condition of the surface of the oxidized silicon film 103 illustrated in FIG. 11(*b*) will be described as below.

Figure 12:
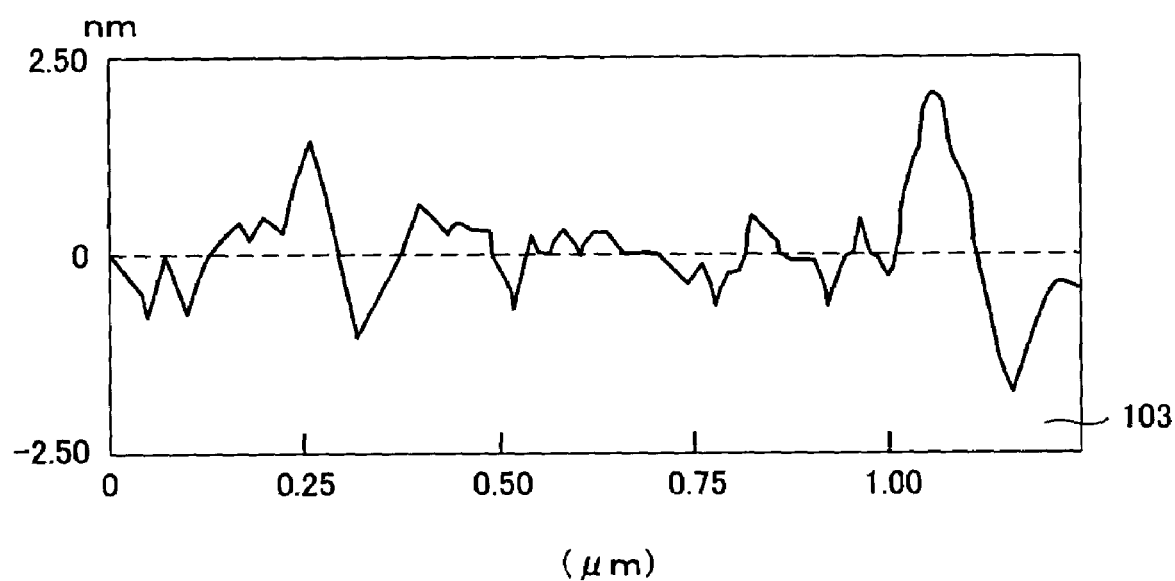
FIG. 12 is a cross section illustrating micro-roughness on the surface of the above-mentioned insulating film deposited on the above-mentioned insulating substrate.

As FIG. 12 shows, the surface of the oxidized silicon film 103 on the light-transmitting substrate 102 has micro-roughness. The image of the surface in FIG. 12 indicates the data of the micro-roughness along a particular line, the data being extracted from an AFM (Atomic Force Microscope) image of the surface of the oxidized silicon film 103.

In the oxidized silicon film 103 of the present embodiment, the maximum slope of the micro-roughness on the surface of the substrate 103 to the surface of the substrate 103 is not more than 0.04. Here, the surface of the light-transmitting substrate 102 is in parallel with a dotted line in FIG. 12, which indicates zero-height.

When the oxidized silicon film 103 formed as above and the single-crystal silicon substrate 106 covered with the oxidized silicon film 104 are washed using the SC1 liquid, rinsed by pure water, dried and then caused to be in touch with each other, the oxidized silicon film 103 is bonded with the oxidized silicon film 104 by exerting little strength. On the occasion of the bonding, after exerting initial strength, the films start to be autonomously bonded with each other. Hereinafter, this autonomous bonding will be termed autonomous bonding ability.

Figure 16:
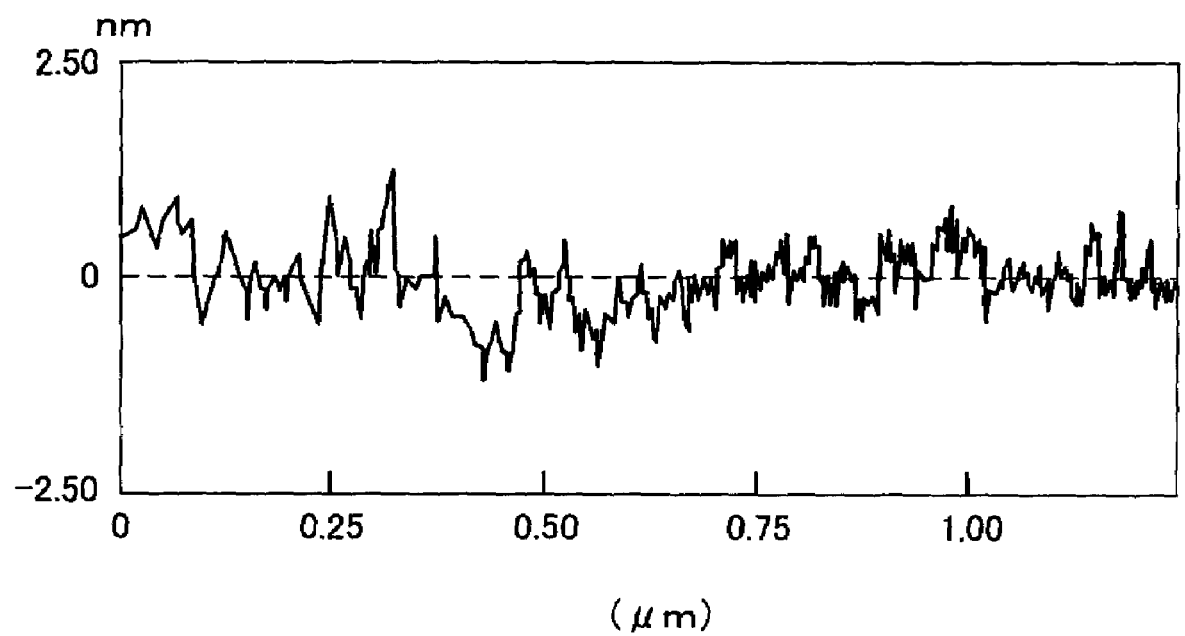
FIG. 16 is a cross section illustrating the state of micro-roughness of the surface of an oxidized silicon film deposited on a substrate, in the case of a conventional arrangement.

Now, an example of a cross section of a conventionally-arranged oxidized silicon film on a substrate is shown in FIG. 16. In this example, an oxidized silicon film which is not less than 500 nm thick is formed on a substrate. As the figure illustrates, the tangent of the maximum slope of the micro-roughness to the surface and the surface of the substrate is not less than 0.06. Note that, in the present example, an absolute value (vertical variation with respect to the surface of the substrate) of the micro-roughness on the surface of the conventional oxidized silicon film is about not more than an absolute value of the micro-roughness on the surface of the oxidized silicon film 103 of the present embodiment, which is shown in FIG. 12.

In the present example, when the substrate on which the oxidized silicon film is deposited as in FIG. 16 is caused to be in touch with a piece of single-crystal silicon, these members cannot properly be bonded with each other. That is to say, when the tangent of the maximum slope of the micro-roughness on the surface to the surface of the substrate is not less than 0.06, the substrate and the piece of single-crystal silicon do not exert the autonomous bonding ability.

Note that, the oxidized silicon film 104 on the single-crystal silicon substrate 106 is formed in such a manner that a thermally-oxidized film is formed on a flat single-crystal silicon substrate in thermally equilibrium states. That is to say, for instance, since commercially-available single-crystal silicon substrates 106 are generally flat, the flatness when a covering film having a predetermined thickness can be expected to some degree. The oxidized silicon film 104 is flat to some extent, on condition that the thickness thereof is about not more than 500 nm.

In this manner, even if measures against the deterioration of the bonding characteristics due to the micro-roughness on the surface, such as the improvement of the condition of the washing before the bonding, are taken, it is not possible to obtain sufficient bonding characteristics. For this reason, problems such as peeling of the single-crystal silicon thin film on the occasion of the separation cannot be avoided. That is to say, in some cases, only performing the improvement of the condition of the washing is not sufficient to prevent the occurrence of the problems.

Next, with respect to the substrate on which the oxidized silicon film in which the tangent of the maximum slope of the micro-roughness is not less than 0.06 is formed, surface polishing by means of a CMP (Chemical Mechanical Polishing) method is conducted. This causes the tangent of the maximum slope of the micro-roughness on the oxidized silicon film having been covered to the surface of the substrate to be not more than 0.06, preferably not more than 0.04. In this case, the substrate on which the oxidized silicon film is deposited and the piece of single-crystal silicon can be caused to be in touch with each other and then bonded, without any problem.

Figure 13:
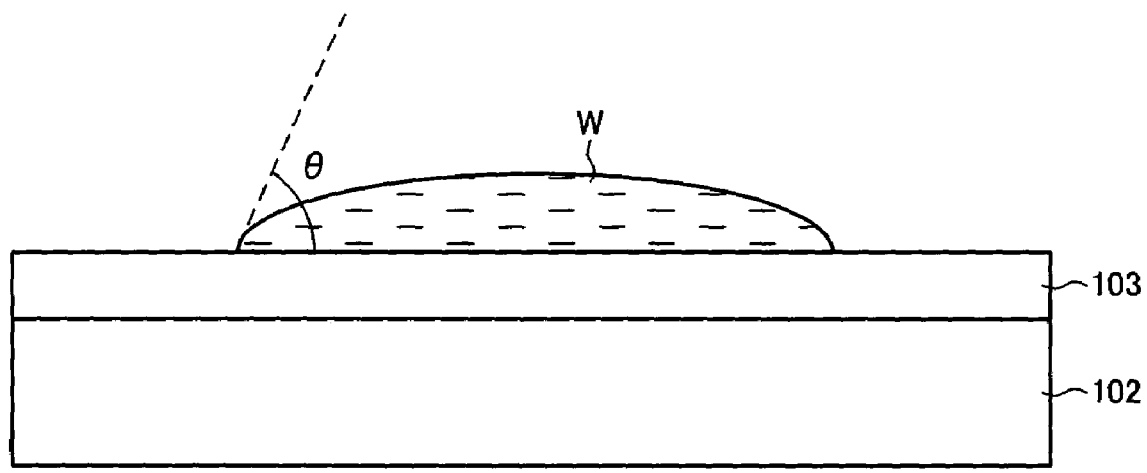
FIG. 13 is a cross section, indicating water-wettability of the surface of the above-mentioned insulating substrate deposited on the above-mentioned insulating film.

Now, the water wettability of the light-transmitting substrate 102 covered with the oxidized silicon film 103 of the present embodiment is measured after the washing using the SC1 liquid. More specifically, as FIG. 13 illustrates, a contact angle θ with respect to water W is measured using a contact angle measuring device.

Using the contact angle measuring device, an image of the water W at the instant of the contact with the surface of the oxidized silicon film 103 is taken for a cross-sectional observation. Here, an angle between a tangent line (dotted line) along the end portion of the dropped water W being in touch with the surface of the oxidized silicon film 103 and the surface of the light-transmitting substrate 102 is set as the contact angle θ.

The light-transmitting substrate 102 and the dropped water W are at a temperature of 25° C. The contact angle θ is measured from the image taken immediately after the water W is in contact with the surface of the oxidized silicon film 103. An amount of the dropped water W is 1 microliter, and as the water W, "Water for Injections" made by made by Otsuka Pharmaceutical Co., Ltd is adopted.

In the case of the light-transmitting substrate 102 which has the micro-roughness thereon as illustrated in FIG. 12 and covered with the oxidized silicon film 103 of the present embodiment, the contact angle θ with respect to the water W is not more than 10° after the washing using the SC1 liquid, and as described above, the tangent of the oxidized silicon film 103 to the maximum slope of the micro-roughness on the light-transmitting substrate 102 is not more than 0.04.

Further, the wettability of the single-crystal silicon substrate 106 which is oxidized and covered with the oxidized silicon film 104 is also measured in a similar manner to the light-transmitting substrate 102. Also in this case, the contact angle θ with respect to the water W is not more than 10° after the washing using the SC1 liquid.

Then, as in the foregoing description, after the oxidized silicon film 103 and the oxidized silicon film 104 are dried and caused to be in contact with each other, these films are autonomously bonded with each other, after exerting little force thereto.

Here, the adhesive strength (adhesive power) after the bonding can be estimated in the following manner: The adhesive strength can be evaluated by a test of peeling a bonded thin film from its end portion. According to "Theory of Elasticity", E. M. Lifshitz and L. D. Landau (translated by Tsunezo Sato; Tokyo Tosho), when a thin film whose thickness is h is peeled off from an object by exerting an external force on the object against its surface tractive force, an adhesive strength α per a unit length is expressed by the following equation.

$$\alpha = \{Eh^3/24(1-\sigma^2)\}(\partial^2\zeta/\partial x^2)^2$$

Figure 17:
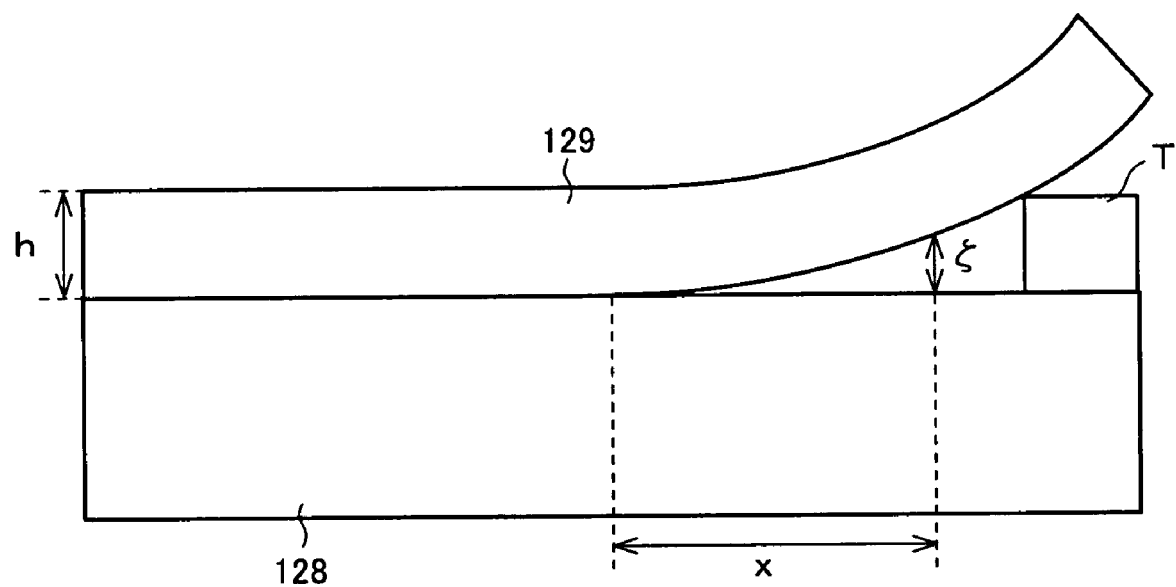
FIG. 17 is a schematic cross section, illustrating an appraisal method of bonding power.

Here, E is Young's modulus of the thin film, σ is Poisson's ratio of the thin film, h is the thickness of the thin film, x is a lateral axis of a plane to which the thin film is adhered, and ζ is a displacement of a film to be peeled off in the direction of the normal of the thin film. A schematic cross section of this arrangement is shown in FIG. 17. As in this figure, the thickness of a space at coordinates which are away from the end portion (x=0) of a contact face for a distance x in the lateral direction is ζ, and ζ and x are variables. In FIG. 17, a tape T functions to exert a force of peeling a thin film 29 off from an object 28. That is to say, when the thin film 29 is peeled off from the object 28 using the tape T, the differential equation of second order of the variable ζ from the bonding surface of the thin film 29 contributes to the adhesive strength. In this manner, it is possible to obtain the adhesive strength α by figuring out a coefficient of the partial differential equation of second order of the variable ζ in the normal direction, with respect to the x-axis.

As FIG. 11(f) shows, provided that the light-transmitting substrate 102 in which the tangent of the maximum slope of the micro-roughness on the surface of the substrate to the surface is not more than 0.06 is bonded with the single-crystal silicon substrate 106, the adhesive strength measured by means of the above-described method is large, i.e. not less than 0.6 N/m.

In the meantime, when the tangent the maximum slope of the micro-roughness on the surface of the substrate to the surface of the substrate is not less than 0.06, the autonomous bonding ability is not observed so that the adhesive strength is only about 0.2 N/m.

Note that, the evaluation of the adhesive strength is carried out after the bonding and before the enhancement of the adhesive strength by methods such as heat treatment. Thus, by conducting heat treatment after the evaluation, it is possible to improve the adhesive strength for about 10-1000 times. In this manner, the SOI substrate 101 of the present embodiment is arranged so that the adhesive strength thereof is not less than 0.6 N/m, when measured before the bonding of the oxidized silicon film 103 with the oxidized silicon film 104 and after the enhancement of the adhesive strength by means of methods such as heat treatment. Thus, comparing to the case when heat treatment is performed with respect to an SOI substrate whose adhesive strength is about 0.2 N/m after the bonding, the SOI substrate 101 of the present embodiment after the heat treatment has a greater adhesive strength.

Further, as in the foregoing description, the oxidized silicon film 103 which is the covering film of the light-transmitting substrate 102 is made at a temperature about 320° C. by a plasma chemical vapor deposition method using a gas in which a TEOS gas is mixed with an oxygen gas. That is to say, the oxidized silicon film 103 made by the plasma CVD method is easily bonded with the oxidized silicon film 104 which is also a covering film.

In contrast, provided that the above-mentioned covering film is formed by applying an argon gas and an oxygen gas to a target oxidized silicon, i.e. formed by a RF reactive sputtering, the tangent of the micro-roughness is not less than 0.06, and the contact angle θ with respect to water W is not less than 10°. In this case, when a substrate on which the covering film is deposited is caused to be in touch with a piece of single-crystal silicon, the film and the piece are not bonded with each other by the autonomous bonding ability.

As described above, the SOI substrate 101 of the present embodiment is arranged such that the oxidized silicon film 103 in which the tangent of the maximum slope of the micro-roughness on the surface of the oxidized silicon film 103 to the surface of the light-transmitting substrate 102 is not more than 0.06 is bonded with the oxidized silicon film 104 which is a covering film.

Further, in the SOI substrate 101, the respective contact angles θ with respect to water W are not less than 10° on the surface of the oxidized silicon film 103 and on the surface of the oxidized silicon film 104.

Moreover, in the SOI substrate 101, the oxidized silicon film 103 is formed by a plasma CVD method using a gas in which a TEOS gas is mixed with an oxygen gas.

With these arrangements, it is possible to set the adhesive strength between the oxidized silicon films 103 and 104 to be not less than 0.6 N/m. Since the adhesive strength in the SOI substrate 101 is enhanced in this manner, the peeling of the film does not occur, and this elimination of the peeling makes it possible to improve the yield and reduce costs.

When bonding the oxidized silicon film 103 with the oxidized film 104, the conditions of the respective films, the cleanliness of the surfaces, and the degree of activity of the surfaces are important factors. Also, the bonding is realized thanks to contributions by van der Waals force, electric dipole, and hydrogen bond. The surfaces are easily bonded with each other especially when the surfaces are similarly arranged in terms of the balance of the above-mentioned contributions, and the arrangement above makes it possible to cause the balances of the contributions of the respective surfaces to be similar. On this account, it is possible to improve the adhesive strength as above.

Now, the following will describe an example of an SOI substrate in which a polycrystalline silicon film as well as a single-crystal silicon thin film are provided on an insulating substrate.

FIGS. 14(a)-14(h) are cross sections showing an example of the steps for manufacturing the SOI substrate. To manufacture the SOI substrate, first, on a light-transmitting substrate 102 in FIG. 14(a), an oxidized silicon film 113 as an insulating film is deposited as illustrated in FIG. 14(b).

Then, as FIG. 14(c) shows, an amorphous silicon film 114 is formed by applying a monosilane gas, on the ground of plasma CVD.

Then, after performing dehydrogenation annealing, a part where a polycrystalline silicon TFT will be formed is melted by methods such as the application of excimer laser as indicated by arrows in FIG. 14(d). Subsequently, the part having been melted is poly-crystallized so that a polysilicon film 114a is formed as in FIG. 14(e).

Next, be means of photolithography, the silicon film is etched in order to form a part where a piece of single-crystal silicon is placed, so that a polysilicon film 114b is removed. The remaining polysilicon film 114a is now regarded as a polysilicon area 112, as illustrated in FIG. 14(f). After being subjected to washing using a SC1 liquid and rinsing, the substrate is dried.

In the meantime, the surface of a single-crystal silicon substrate 106 is oxidized so that an oxidized silicon film 104 is formed thereon. Subsequently, hydrogen ions are implanted, washing by the SC1 liquid and rinsing are carried out, and then drying is performed. Subsequently, as FIG.

14(g) shows, the oxidized silicon film 104 of the single-crystal silicon substrate 106 is bonded with the oxidized silicon film 113.

Subsequently, as in the above-mentioned embodiments, heat treatment using devices such as an electric furnace or lamp furnace is carried out, and then, as FIG. 14(h) shows, the single-crystal silicon substrate 106 is stripped and separated at a dense position 110 of implanted hydrogen ions as a border, so that a single-crystal silicon thin film 105 is obtained.

Here, setting the thickness of the single-crystal silicon thin film 105 to be identical with the thickness of the polysilicon area 112 is greatly helpful for a process of manufacturing a TFT using the polysilicon area 112 and the single-crystal silicon film 5.

In the present case, since the SOI substrate 111 manufactured as above is a light-transmitting substrate, the SOI substrate 111 can be easily adopted to display devices. For instance, a thin-film transistor is manufactured using the single-crystal silicon thin film 105, and this thin-film transistor can be adopted to display devices such as a TFT liquid crystal display (LCD) device and a TFT organic electroluminescence (OLED: Organic Light Emitting Diode) display device.

An example of such display devices will be described in reference to FIG. 18.

Figure 18:
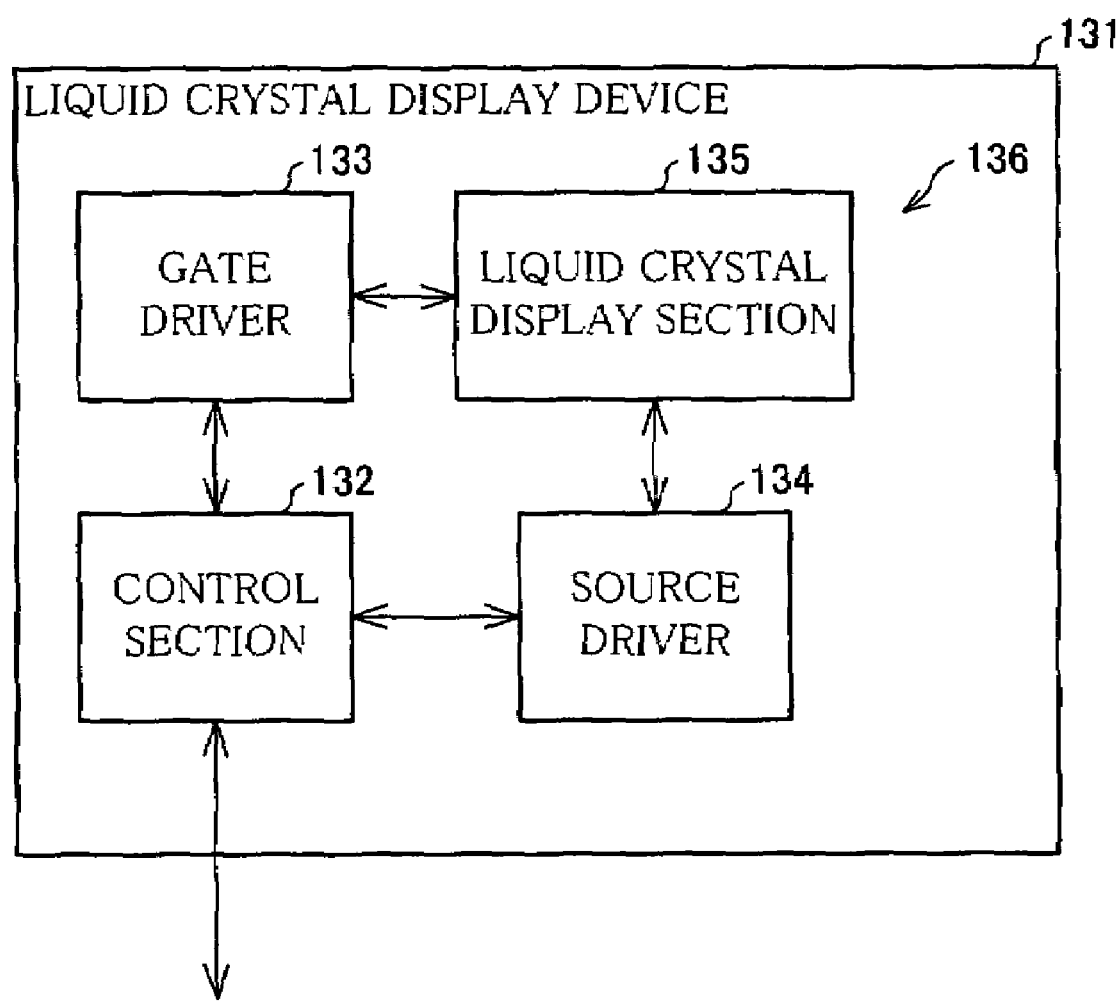
FIG. 18 is a block diagram, illustrating an example of a display device adopting the semiconductor device of the present invention.

As FIG. 18 shows, a liquid crystal display device 131 includes a control section 132, a gate driver 133, a source driver 134, a liquid crystal display panel 136 including a liquid crystal display section 135. In this example, the liquid crystal display panel 136 is an active matrix substrate (semiconductor device) manufactured by adopting the above-mentioned SOI substrate 111.

In accordance with an image input signal supplied from the outside of the liquid crystal display device 131, the control section 132 transfers the image signal, control signal, and clock signal to the gate driver 133 and the source driver 134. The gate driver 133 outputs a gate drive signal to the liquid crystal display panel 136. The source driver 134 outputs signals of source bus lines to the liquid crystal display panel 136.

In this manner, using the SOI substrate 111 as a display panel driven in an active matrix manner makes it possible to cause the characteristics of a transistor to be uniform, stabilized, and improved. Further, the arrangement above allows systems such as active matrix drivers, a peripheral driver, and a timing controller to be further integrated.

Note that, the process of manufacturing a thin-film transistor (TFT) by adopting the SOI substrate 111 is identical with a conventional TFT process.

Figure 15:
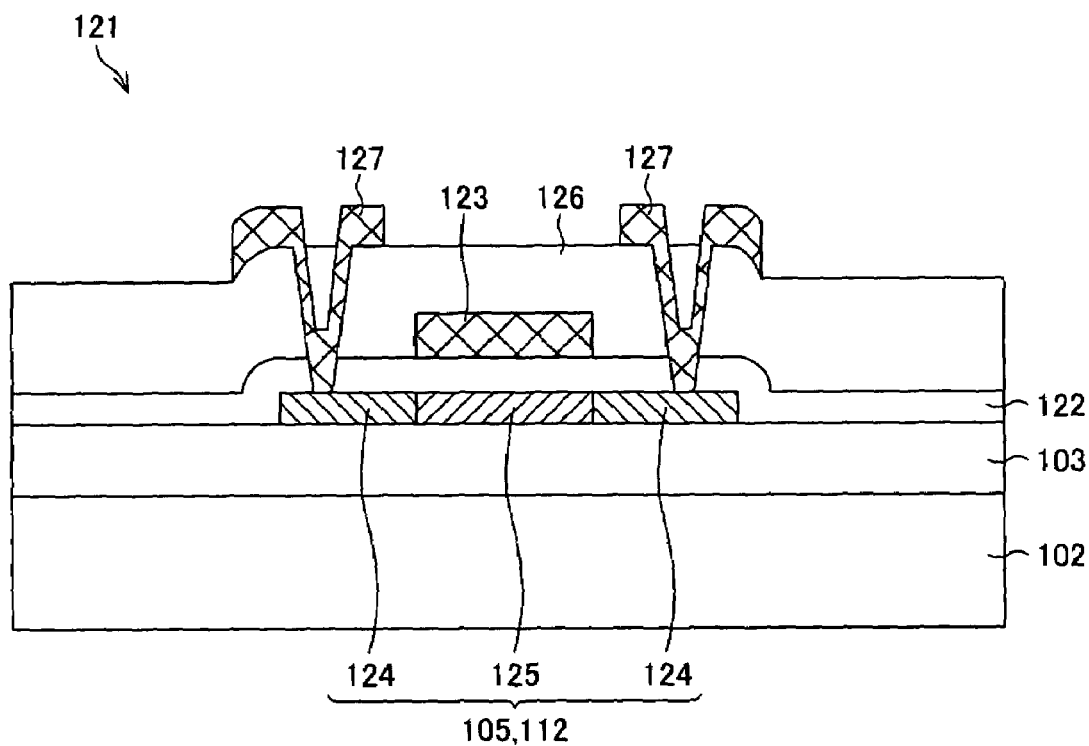
FIG. 15 is a cross section illustrating an example of a thin-film transistor which is manufactured using the above-mentioned SOI substrate.

For instance, to manufacture a coplanar transistor, a silicon film of the SOI substrate 111 is caused to be island-shaped, and as FIG. 15 shows, a gate insulating film 122 which is a $SiO_2$ insulating film is formed.

Then, after forming and patterning a gate electrode film 123, ion implantation of phosphorus and boron is carried out so that a part of a low-resistance silicon film ($n^+$ or $p^+$ silicon film) 124 is obtained. After performing activation annealing by heat, an interlayer insulating film 126 which is a $SiO_2$ insulating film is formed. A part which is masked by the gate electrode film 123 is regarded as a channel area 125.

After forming a contact hole through the interlayer insulating film 126, a source/drain metal film 127 is formed and patterned.

In this manner, as FIG. 15 shows, it is possible to manufacture a single-crystal silicon TFT or a partly-single-crystal silicon TFT, which is a thin-film transistor 121.

In addition to the above, it is possible to provide a non-single-crystal device in the above-mentioned polysilicon area 112. By the way, instead of the polysilicon area 112, an amorphous silicon thin film or a continuous grain silicon thin film may be provided as a non-single-crystal thin film.

Further, after forming a semiconductor device structure as a non-single-crystal silicon device in the polysilicon area 112, a single-crystal silicon thin film 105 may be provided so as to form a single-crystal silicon device. Alternatively, after the formation of the single-crystal silicon thin film 105 on the substrate 102, a non-single-crystal thin film may be further provided on the substrate 102.

It is needless to say that one can appropriately combine the present embodiment with any one of Embodiments 1-6. That is to say, for instance, the arrangement for improving the adhesive strength between the insulating substrate and the single-crystal silicon thin film, which has been discussed in the present embodiment, may be combined with any one of the above-mentioned arrangements of Embodiments 1-6.

As discussed above, among silicon semiconductors used for manufacturing ICs and thin-film transistors, and among transistor devices manufactured from the silicon semiconductors, the present invention relates to materials for manufacturing a transistor element in which (i) a single-crystal silicon thin film or (ii) a single-crystal silicon thin film and a non-single-crystal silicon thin film is/are adopted, more particularly relates to an SOI substrate, a display device, and a method of manufacturing the SOI substrate.

An integrated circuit element technology for forming and integrating elements such as a transistor on a substrate has been developed in line with the diffusion of computers.

According to the technology, for instance, a single-crystal silicon substrate is manufactured so that several hundred million transistors are formed on a substrate. More specifically, a commercially-available single-crystal silicon wafer which is less than 1 mm thick and about 200 mm in diameter is processed so that a great number of transistors are formed thereon.

Since an SOI substrate is adopted in the field of manufacturing ICs for dramatically improving the performances of a semiconductor element by manufacturing good transistors, it is out of consideration whether or not the substrate is transparent and whether or not the substrate is crystalline, as long as the substrate is an insulating layer. In the field, when a transistor is manufactured using the SOI substrate, an element is completely separated so that the operations of the transistor are rarely limited and characteristics and performances thereof are good.

In the meantime, when the SOI substrate is adopted to the display device of the present invention, it is, as described above, preferable that the SOI substrate is light-transmitting.

According to the arrangement of Japanese Laid-Open Patent Application No. 2000-30996, when a single-crystal silicon film is formed on a light-transmitting substrate by the steps of bonding, separating, and stripping, the size of a piece of single-crystal silicon is not always identical with the size of the glass substrate, and hence, in the present arrangement, the maximum diameter of the piece of single-crystal silicon is 12 inches (300 mm). Thus, according to this arrangement, it is not possible to form a single-crystal silicon thin film on the entire surface of the substrate.

In contrast, in the SOI substrate of the present invention, as in the case of the above-described SOI substrate 1, it is possible to form a single-crystal silicon thin film on a substantially entire surface of a substrate.

Note that, the use of the semiconductor device and its manufacturing method in accordance with the present invention is not limited to a liquid crystal display device, and thus, it is needless to say that the semiconductor device and its manufacturing method in accordance with the present invention can be adopted to other devices such as an organic EL device. Further, the semiconductor device of the present invention may be generally used as a highly-functional integrated circuit.

As described above, the single-crystal silicon substrate of the present invention comprises an oxidized film, a gate pattern, and an impurity ion implanted interface on a surface of the single-crystal silicon substrate, and the surface is planarized after forming the oxidized film, the gate pattern, and the impurity ion implanted interface, and a dense position of implanted hydrogen ions, to which a predetermined concentration of hydrogen ions is implanted for a predetermined depth.

According to this arrangement, the side of the single-crystal silicon substrate, where the oxidized film is formed, is bonded with a member such as the insulating substrate, and owing to the heat treatment, the substrates are bonded with siloxane bond so that the substrates become tightly bonded, and also, since the cleavage stripping at the dense position is conducted by heating, it is possible to obtain a MOS single-crystal silicon thin-film transistor with ease, even if an adhesive is not used.

That is to say, the single-crystal silicon substrate of the present invention is arranged so that, on the surface thereof, the oxidized film, gate pattern, and impurity ion implanted interface are formed as parts of the MOS single-crystal silicon thin-film transistor, and the dense position is provided at a predetermined depth from the surface of the substrate.

Further, the single-crystal silicon substrate of the present invention comprises: an impurity ion implanted/diffused area in which a PNP junction structure or an NPN junction structure, to which impurity ions are implanted, is provided near a surface of the single-crystal silicon substrate; and an oxidized film formed on the impurity ion implanted/diffused area.

With this arrangement, it is possible to obtain a bipolar thin-film transistor made by a single-crystal silicon thin film which can be easily formed on another insulating substrate.

Thus, for instance, on the insulating substrate on which a non-single-crystal (e.g. polycrystalline) silicon thin film is formed, the single-crystal silicon substrate of the present invention is bonded so that a bipolar single-crystal silicon thin-film transistor is formed, and hence it is possible to easily obtain a semiconductor device in which a transistor made from non-single-crystal silicon and a transistor made from a single-crystal silicon are formed on different areas of one substrate.

Further, according to the arrangement above, it is preferable that the single-crystal silicon substrate of the present invention further comprises a dense position of implanted hydrogen ions to which a predetermined concentration of hydrogen ions is implanted for a predetermined depth.

With this arrangement, a side of a single-crystal silicon substrate, the side to which an oxidized film is deposited, is bonded with a member such as an insulating substrate, and then the bonded substrates are subjected to cleavage stripping, so that a bipolar single-crystal silicon thin-film transistor can be easily obtained without using an adhesive.

That is to say, the single-crystal silicon substrate of the present invention is arranged such that an oxidized film and an impurity ion implanted interface, which are for forming a bipolar single-crystal silicon thin-film transistor, are formed thereon, and a dense position of implanted hydrogen ions is provided at a predetermined depth from a part where the junction is formed.

Thus, the single-crystal silicon thin-film transistor is bonded with the insulating substrate and then heating is carried out so that a temperature is increased to be not less than the temperature of hydrogen dissociation from silicon, and hence the adhesive strength between the single-crystal silicon thin-film transistor and the insulating substrate is enhanced, and since the cleavage stripping is performed at the dense position formed around the impurity ion implanted interface, it is possible to easily form an SOI bipolar single-crystal silicon thin-film transistor, without using an adhesive.

Then the single-crystal silicon substrate of the present invention is bonded with the insulating substrate on which the non-single-crystal (e.g. polycrystalline) silicon thin film is formed, so that the single-crystal silicon thin-film transistor is formed. With this arrangement, it is possible to easily obtain a semiconductor device in which a thin-film transistor made from non-single-crystal silicon and a thin-film transistor made from single-crystal silicon are formed in different areas on one substrate.

Further, according to the arrangement above, the single-crystal silicon substrate of the present invention is preferably arranged such that a thickness of the oxidized film is not less than 200 nm.

Basically, the thicker the oxidized film such as a $SiO_2$ film is, the more the degradation of the characteristics and the variation due to a surface charge, etc. are reduced. However, taking the efficiency (the time required for oxidization) in the step of forming the $SiO_2$ film and the unevenness into consideration, an appropriate thickness is about 200-400 nm. The thickness is preferably not less than 400 nm when the reduction of the variation is emphasized. In the meantime, the thickness is substantially within the range of 200-400 nm, more preferably 250-350 nm when the elimination of the unevenness or the efficiency is emphasized. This is because the contamination of the interface between the single-crystal silicon substrate and the insulating substrate such as a glass substrate and the influence of a fixed electric charge caused by the distortion or incompleteness of the lattice are relieved.

Thus, according to the present invention, the variation of the threshold is restrained in the case of a MOS transistor made from single-crystal silicon and the variation of the characteristics and the ON-voltage are restrained in the case of a bipolar TFT made from single-crystal silicon, so that a single-crystal silicon substrate in which the efficiency of the step of forming a $SiO_2$ film and the balance of the unevenness are proper can be obtained.

Further, the SOI substrate of the present invention, in which a single-crystal thin film is provided on an insulating substrate, comprises: a bonded interface at which an insulating film formed on the insulating substrate is bonded with a covering film with which the single-crystal silicon substrate is covered, the single-crystal silicon substrate being separated at the depth at which hydrogen ion is implanted so that the single-crystal silicon thin film is formed, the insulating substrate being a light-transmitting substrate, and the single-crystal silicon substrate being separated by means of heat treatment.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture transistors which can meet strict demands for the variation and performance.

Also, since the insulating substrate is a light-transmitting substrate, the SOI substrate can be adopted as an active matrix substrate of a display device.

Also, since hydrogen ions which are much lighter than oxygen ions are implanted, the implantation does not significantly change the crystalline on the entire surface of the single-crystal silicon substrate, and hence the degradation of the crystalline of the silicon due to the implantation of hydrogen ions does not occur.

Also, by the heat treatment, the condition of the crystalline of the single-crystal silicon thin film is recovered to be the level before the implantation of the hydrogen ions. The heat treatment is carried out at a temperature about, for instance, 600° C. This treatment does not deteriorate the bonding characteristics at the bonded interface.

Further, the SOI substrate of the present invention, in which a single-crystal silicon thin film is provided on an insulating substrate, comprising: a bonded interface at which an insulating film formed on the insulating substrate is bonded with a covering film with which a single-crystal silicon substrate is covered, the single-crystal silicon thin film being formed by separating the single-crystal silicon substrate at a dense position of implanted hydrogen ions by means of heat treatment, and at the bonded interface, the insulating film is arranged to satisfy that a tan θ is not more than 0.06, where θ is the angle between (i) a maximum slope curve of micro-roughness, the micro-roughness being measured in a 1-5 μm square and not more than 5 nm in height, and (ii) an average surface plane.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture a transistor which can meet strict demands for the variation and performance.

Note that, the tangent in the present case is an absolute value of the tangent. For this reason, in the arrangement above, the absolute value of the tangent is not less than 0 and not more than 0.06. The foregoing insulating film has micro-roughness on its surface, and the tangent of the maximum slope of these micro-roughness to the surface of the insulating substrate is not more than 0.06. More specifically, for instance, the tangent of the maximum slope of micro-roughness measured in a 1-5 μm square on the surface of the insulating film to the surface of the insulating substrate is not more than 0.06, the micro-roughness being not more than 5 nm in height.

By restraining the micro-roughness to be small as above, it is possible to enhance the adhesive strength between the insulating film and the covering film with which the single-crystal silicon substrate is covered.

Further, the tangent is more preferably not more than 0.04. This arrangement makes it possible to further enhance the adhesive strength between the insulating film and the covering film with which the single-crystal silicon substrate is covered.

Thus, it is possible to solve such a problem that the bonding characteristics between a light-transmitting substrate and a single-crystal silicon substrate are degraded due to the micro-roughness on the surface of the light-transmitting substrate.

Note that, in the SOI substrate, the condition of the surface of the insulating film used for bonding the insulating substrate with the single-crystal silicon substrate can be evaluated by performing an AFM method with respect to, for instance, the micro-roughness of the surface which is caused by the separation of the insulating substrate from the single-crystal silicon substrate.

Further, the SOI substrate of the present invention, in which a single-crystal silicon thin film is provided on an insulating substrate, comprises: a bonded interface at which an insulating film formed on the insulating substrate is bonded with a covering film with which a single-crystal silicon substrate is covered, the single-crystal silicon thin film being formed by separating the single-crystal silicon substrate, and contact angles of a surface of the insulating film and a surface of the covering film with respect to water being not more than 10°.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture a transistor which can meet strict demands for the variation and performance.

Here, the insulating film is, for instance, an oxidized silicon film with which the insulating substrate is covered, and the covering film is, for instance, an oxidized silicon film formed by oxidizing the single-crystal silicon substrate. The water may be pure water or distilled water. Also, since the contact angle is always more than 0° (because complete wetting is indicated when the contact angle is 0°). the arrangement above is equivalent to state that the contact angle is not less than 0° and not more than 10°.

The insulating film and the covering film have good water wettability, because the contact angle with respect to the water is not more than 10°. Since surfaces having good water wettability are suitably bonded with each other, even if, for instance, the insulating film and the covering film are bonded with each other and then the single-crystal silicon substrate is stripped and separated by heat treatment, the single-crystal silicon thin film bonded with the insulating substrate does not peeled off. On this account, the present arrangement makes it possible to provide a high-quality SOI substrate.

More specifically, it is possible to bond the insulating film with the covering film, for instance, without using an adhesive. In this case, the condition, cleanliness, and degree of activity of the respective surfaces of the films are important factors. The bonding without using an adhesive is realized thanks to contributions by van der Waals force, electric dipole, and hydrogen bond. The respective surfaces of the substrates are easily bonded with each other especially when both of the surfaces are similarly arranged in terms of the balance of the above-mentioned contributions. According to the foregoing arrangement, since the surfaces both having good water wettability are bonded with each other, the surfaces are similarly arranged in terms of the balance of the above-mentioned contributions so that the bonding characteristics are good.

Although only the contact angles of the respective films with respect to the water are described above, the contact angle with respect to ethylene glycol or methylene iodide liquid may be measured.

Incidentally, the insulating film and the covering film may be washed using a washing liquid made by diluting ammonia and hydrogen peroxide by de-ionized water. By performing the washing in this manner, it is possible to remove particles from the respective surfaces of the insulating film and the covering film before the bonding, and hence clean surfaces can be certainly obtained. With this arrangement, it is possible to restrain the contact angle with respect to the water on the surface to be not more than 10°, with more certainty.

Further, the SOI substrate of the present invention, in which a single-crystal silicon thin film is provided on an insulating substrate, comprises: a bonded interface at which an insulating film formed on the insulating substrate is bonded with a covering film with which a single-crystal silicon substrate is covered, the single-crystal silicon thin film being formed by separating the single-crystal silicon substrate, and the insulating film being an oxidized silicon film formed by a plasma chemical vapor deposition method using a gas mixture of a TEOS gas and an oxygen gas.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture a transistor which can meet strict demands for the variation and performance.

Here, the TEOS gas is a Tetra Ethyl Ortho Silicate gas.

When the formation of the film is performed by a plasma chemical vapor deposition method using a gas in which a TEOS gas and an oxygen gas as above, the obtained insulating film can be easily bonded with the covering film. In contrast, the insulating film formed by a sputtering method cannot easily be bonded with the covering film.

Further, the SOI substrate of the present invention, in which a single-crystal silicon thin film is provided on an insulating substrate, comprises: a bonded interface at which an insulating film formed on the insulating substrate is bonded with a covering film with which a single-crystal silicon substrate is covered, the single-crystal silicon thin film being formed by separating the single-crystal silicon substrate, and at the bonded interface, the insulating film which is made of oxidized silicon and 5-300 nm thick being bonded.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture a transistor which can meet strict demands for the variation and performance.

The insulating film is an oxidized silicon film whose thickness is within the range of 5-300 nm. This insulating film is bonded so that the bonded interface is formed. According to this arrangement, since the oxidized silicon film is thick, the influence of a fixed electric charge on the surface of the light-transmitting substrate is restrained so that the characteristics of the transistor formed on the single-crystal silicon thin film of the SOI substrate can be improved. More specifically, even if a fixed electric charge is generated on the interface between the silicon and insulating substrate, the single-crystal silicon thin film is not influenced by the fixed electric charge so that the threshold voltage of the thin-film transistor can be suitably controlled and hence a desired threshold voltage can be obtained.

The thickness of the insulating film is more preferably within the range of 40-300 nm. With this arrangement, it is possible to certainly restrain the influence of the fixed electric charge on the surface of the light-transmitting substrate and improve the characteristics of the transistor.

Further, the SOI substrate of the present invention, in which a single-crystal silicon thin film is provided on an insulating substrate, comprises: a bonded interface at which an insulating film formed on the insulating substrate is bonded with a covering film with which a single-crystal silicon substrate is covered, the single-crystal silicon thin film being formed by separating the single-crystal silicon substrate, and an adhesive strength at the bonded interface being not less than 0.6 N/m.

In this SOI substrate, the single-crystal silicon substrate is bonded with the insulating substrate, and this single-crystal silicon substrate is separated and stripped at the implanted interface so that the single-crystal silicon thin film is obtained. With this arrangement, it is possible to form a single-crystal silicon thin film in which the crystal axis in the silicon film are uniform. Further, the above-described arrangement makes it possible to obtain transistors which are uniform and high-performance. That is to say, the variation of the characteristics (threshold voltage and mobility) between the transistors is restrained and the improvement of the performance, such as the improvement of the mobility, is realized so that it is possible to manufacture a transistor which can meet strict demands for the variation and performance.

Here, the adhesive strength is a strength per a unit length, which is required for peeling a thin film off from an object, against its surface tractive force.

Improving the adhesive strength as above makes it possible to prevent the peeling-off of the thin film. In a conventional arrangement, the adhesive strength at a bonded interface is about 0.2 N/m. In contrast, according to the present invention, the adhesive strength is not less than 0.6 N/m and hence the peeling-off can be prevented.

Note that, in the present arrangement, the evaluation of the adhesive strength is carried out before improving the adhesive strength by methods such as heat treatment. Thus, by conducting heat treatment after the evaluation, it is possible to improve the adhesive strength for about 10-1000 times.

Further, according to the arrangement above, the SOI substrate of the present invention may be arranged in such a manner that a single-crystal thin-film device is formed on the single-crystal silicon substrate, and the single-crystal thin-film contains the single-crystal thin-film device being formed by separating the single-crystal silicon substrate.

Also by this arrangement, it is possible to realize an SOI substrate on which the single-crystal silicon thin film is provided with the single-crystal thin-film device.

Further, the SOI substrate of the present invention may comprise: a single-crystal silicon thin-film device manufactured from the single-crystal silicon thin film; and a non-single-crystal silicon thin-film device which is manufactured from a non-single-crystal silicon thin film, and the non-single-crystal silicon thin film is provided in an area on the insulating substrate, the area being different from an area where the single-crystal silicon thin film is provided.

Also by this arrangement, it is possible to realize the SOI substrate on which the single-crystal silicon thin film is provided with the single-crystal thin-film device and the non-single-crystal silicon thin film provided with the non-single-crystal thin-film device.

Further, the semiconductor device of the present invention comprises: a non-single-crystal silicon thin-film device manufactured from a non-single-crystal silicon thin film and a single-crystal silicon thin-film device manufactured from a single-crystal silicon thin film, wherein the non-single-crystal silicon thin-film device and the single-crystal silicon thin-film device are provided in different areas of an insulating substrate.

According to the above, for instance, a single-crystal silicon thin-film device such as a single-crystal silicon thin-film transistor is adopted to devices which have to be highly functional, such as a timing controller, while a non-single-crystal silicon thin-film device such as a non-single-crystal silicon thin-film transistor is adopted to other devices. With this arrangement, it is possible to obtain a semiconductor device in which high-performance and highly-functional circuit systems are integrated.

That is to say, by adopting a single-crystal silicon thin-film device, devices such as a fast and low-power-consumption logic circuit and timing generator and a fast DAC (current buffer) from which variation has to be eliminated can be formed. Meanwhile, although the performance and characteristics of a non-single-crystal silicon (e.g. polycrystalline silicon) thin-film device are inferior to the performance and characteristics of the single-crystal silicon thin-film device, it is possible to form a large and cheap semiconductor device by adopting the non-single-crystal silicon thin-film device.

Thus, according to the present invention, it is possible to form a semiconductor device having the advantages of the both silicon thin-film devices, on a single substrate.

On this account, high-performance and highly-functional circuit systems which can be realized only by adopting single-crystal silicon can be integrated on a single substrate. For instance, a semiconductor device for a display device in which high-performance systems are integrated, such as a liquid crystal panel and an organic EL panel, can be manufactured with significantly lower costs, compared to a case when all devices are made by single-crystal silicon.

The shape of the single-crystal silicon substrate by which the single-crystal silicon thin film of the semiconductor device of the present invention is formed has to be a disk which is sized 6, 8, or 12 inch in diameter. Note that, the disk which is sized 6, 8, or 12 inch in diameter is a typical wafer for manufacturing LSI. However, since the non-single-crystal silicon thin-film device and the single-crystal silicon thin-film device coexist on the insulating substrate of the semiconductor device of the present invention, it is possible to manufacture, for instance, a large semiconductor device which can be adopted to a large liquid crystal display panel and a large organic EL panel.

Further, according to the arrangement above, the semiconductor device of the present invention is preferably arranged in such a manner that the single-crystal silicon thin-film device is bonded with the insulating substrate via an inorganic insulating film interposed therebetween.

With this arrangement, it is possible to form a device such as a single-crystal silicon thin-film transistor on the insulating substrate without using an adhesive, and hence the contamination of the single-crystal silicon can be prevented. Further, after carrying out the bonding, the formation of a metal wiring and inorganic insulating film and etching can be easily performed. Since the metal wiring, etc. are formed simultaneously with a TFT process on a large substrate, it is possible to manufacture the device with low costs.

Further, according to the arrangement above, the semiconductor device of the present invention is preferably arranged in such a manner that each of the non-single-crystal silicon thin-film device and the single-crystal silicon thin-film device is either a MOS thin-film transistor or a MIS thin-film transistor.

With this arrangement, when, for instance, a CMOS structure is adopted, it is possible to manufacture a semiconductor device in which the power consumption is reduced, an output voltage can swing up to the power-supply voltage, and the logic of low power consumption is suitably adopted.

Further, according to the arrangement above, the semiconductor device of the present invention is preferably arranged in such a manner that, in the MOS thin-film transistor, a gate, a gate insulating film, and a silicon are formed on the insulating substrate in this order.

With this arrangement, the MOS single-crystal silicon thin-film transistor is formed so that the gate of the transistor is provided on the side of the insulating substrate, and hence it is possible to obtain a semiconductor device in which an upended MOS single-crystal silicon thin-film transistor is provided on an insulating substrate. Thus, a self-aligning process in which the source and drain of the single-crystal silicon substrate are formed by masking by the gate can be adopted, the influence of a fixed electric charge on the surface of the glass substrate can be restrained, the influence of a fixed electric charge which tends to occur at the bonded interface between the single-crystal silicon and the glass substrate can be restrained thanks to the shielding effect of the gate, and an established process of carrying out the impurity ion implantation to the source and drain of the single-crystal silicon can be adopted using the gate as a mask. For these reasons, the production yields can be improved.

Further, according to the arrangement above, the semiconductor device of the present invention is preferably arranged in such a manner that, a thickness of a silicon thin film of the MOS thin-film transistor is about not more than 600 nm.

According to this arrangement, in the semiconductor device, a thickness d of the single-crystal silicon thin film is small in consideration of the margin of the variation with respect to the maximum depletion length Wn which is determined by an impurity concentration Ni, and hence the thickness d is about not more than 600 nm, even if the impurity concentration is $10^{15}$ cm$^{-3}$ which is the lower practical limit.

In this case, $Wm=[4\epsilon_s kT\ln(Ni/ni)q^2 Ni]^{1/2}$, where ni is an intrinsic carrier concentration, k is a Boltzmann constant, T is an absolute temperature, $\epsilon_s$ is a permittivity of silicon, q is an electric charge, and Ni is an impurity concentration.

According to the arrangement above, since the thickness of the single-crystal silicon thin film is about not more than 600 nm, an S-value (subthreshold coefficient) of the semiconductor device can be set to be small and the OFF-current can be reduced. Thus, the MOS single-crystal silicon thin-film transistor can exercise its full potential.

More preferably, the thickness of the single-crystal silicon thin film of the MOS thin-film transistor is about not more than 100 nm.

According to this arrangement, the S-value (subthreshold coefficient) of the semiconductor device can be further set to be small and the OFF-current can be reduced. Thus, the MOS single-crystal silicon thin-film transistor can exercise its full potential.

In particular, to restrain the degradation of the TFT characteristics due to the quantum effect caused in a short-channel TFT in which the gate length is in the range of 0.1-0.2 μm or less, the thickness is preferably about not more than 20 nm. Provided that the gate length is about not more than 200 nm, when the single-crystal silicon is thicker than 20 nm, the mobility increases but the variation of the threshold value also increases. Since the restraint of the variation of the threshold value is more important for the device, the thickness above is generally practical.

Further, according to the arrangement above, the semiconductor device of the present invention is preferably arranged in such a manner that, a metal pattern of the MOS single-crystal silicon thin-film transistor is formed under a wiring rule which is more relaxed than a wiring rule of a gate pattern of the MOS single-crystal silicon thin-film transistor. Also, the wiring rule of the metal pattern of the MOS single-crystal silicon thin-film transistor is preferably as strict as or more relaxed than the wiring rule of a metal pattern on a large substrate. Further, the wiring rule of the metal pattern of the MOS single-crystal silicon thin-film transistor is preferably either (i) as strict as the wiring rule of the metal pattern equivalent to the gate of the TFT, or (ii) as strict as or more relaxed than the wiring rule of the metal pattern on a large substrate constituted by a plurality of different wiring layers.

With this arrangement, at least a part of the metal wiring pattern of the semiconductor device on which the MOS single-crystal silicon thin-film transistor is provided can correspond to micro-fabrication equivalent to the micro-fabrication for the gate and can be processed simultaneously with the metal wiring pattern on the large substrate, and hence the costs can be reduced and the processing power can be improved. Further, since the connection to other circuit blocks and a TFT array becomes easy, the drop of the production yields due to alignment failure can be restrained.

Note that, when a wiring rule is relaxed, a design rule for forming a wiring is not strict and a permissible range on the occasion of forming the wiring is broad.

Further, according to the arrangement above, the semiconductor device of the present invention is preferably arranged in such a manner that, the non-single-crystal silicon thin-film device is either a MOS non-single-crystal silicon thin-film transistor or a MIS non-single-crystal silicon thin-film transistor, and the single-crystal silicon thin-film device is a bipolar single-crystal silicon thin-film transistor.

According to this arrangement, in addition to the MOS or MIS non-single-crystal silicon thin-film transistor, the bipolar single-crystal silicon thin-film transistor is formed so that a semiconductor device having various functions can be obtained.

That is to say, since the bipolar single-crystal silicon thin-film transistor is formed in addition to the MOS or MIS non-single-crystal silicon thin-film transistor, it is possible to obtain a semiconductor device having advantages of a bipolar thin-film transistor, that is to say, the linear signal processing can be performed, the structure is simple because of the omission of the gate so that the production yields are good, the linearity in a saturation area is good, and suitability for an analog amplifier, current buffer, and power supply amplifier is obtained.

Further, according to the arrangement above, the semiconductor device of the present invention is preferably arranged in such a manner that, the non-single-crystal silicon thin-film device is either a MOS non-single-crystal silicon thin-film transistor or a MIS non-single-crystal silicon thin-film transistor, and the single-crystal silicon thin-film device includes at least either one of a MOS single-crystal silicon thin-film transistor and a bipolar single-crystal silicon thin-film transistor.

With this arrangement, it is possible to form a semiconductor device having the characteristics of three transistors, namely the MOS or MIS non-single-crystal silicon thin-film transistor, the single-crystal silicon thin-film transistor, and the bipolar single-crystal silicon thin-film transistor, on a single substrate.

Thus, it is possible to obtain a semiconductor device which has higher performance and is more functional.

Further, according to the arrangement above, the semiconductor device of the present invention is preferably arranged in such a manner that, the non-single-crystal silicon thin-film device is either a MOS non-single-crystal silicon thin-film transistor or a MIS non-single-crystal silicon thin-film transistor, and the single-crystal silicon thin-film device includes a MOS single-crystal silicon thin-film transistor, and an image sensor including a Schottky or PN-junction diode or a CCD image sensor.

With this arrangement, differently-arranged or differently-structured thin-film devices provided can be integrated in different areas, and hence CMOS devices such as an image sensor and devices having structures different from those of the CMOS devices can be integrated with ease, even if the coexistence of these devices has conventionally been extremely difficult, so that highly-functional devices which have not been able to be manufactured can be created.

Further, according to the arrangement above, the semiconductor device of the present invention is preferably arranged in such a manner that, a thickness of a single-crystal silicon thin-film of the MOS single-crystal silicon thin-film transistor is thinner than a thickness of a single-crystal silicon thin film of the bipolar single-crystal silicon thin-film transistor.

It has been well-known that, in the case of the MOS thin-film transistor, generally the thinner the film is, the better the characteristics are, and in the case of the bipolar thin-film transistor, good characteristics (i.e. variation is small and ON-resistance is low) can be obtained when the film is relatively thick.

Thus, according to the present invention, the thicknesses of the MOS silicon thin film and the bipolar silicon thin film are compared with each other so as to be determined, and hence a semiconductor device which can utilize the characteristics of the both MOS and bipolar transistors can be obtained.

Further, according to the arrangement above, the semiconductor device of the present invention is preferably arranged in such a manner that, the bipolar single-crystal silicon thin-film transistor has such a structure that a base area, a collector area, and an emitter area are formed and provided in one plane.

According to this arrangement, unlike the MOS thin-film transistor, the bipolar transistor is a planarized, i.e. laterally-structured transistor which has no gates, and hence a silicon substrate whose surface is completely flat can be formed only by forming an oxidized film on the surface of silicon, performing implantation of P-impurities and N-impurities to a predetermined pattern (area), and performing activation annealing. Thus, it is possible to easily bond the single-crystal silicon substrate with the insulating substrate, without carrying out a planarizing process by CMP.

For this reason, compared with a conventional MOS transistor or a bipolar transistor in which the bonding is performed in the direction orthogonal to its surface, the manufacturing process can be simplified.

Further, according to the arrangement above, the semiconductor device of the present invention is preferably arranged in such a manner that, a metal wiring and a contact pattern of the bipolar single-crystal silicon thin-film transistor include respective parts each being formed in accordance with a wiring rule which is more relaxed than a wiring rule of a base pattern of the bipolar single-crystal silicon thin-film transistor. Further, it is more preferable that the metal pattern and the contact pattern of the bipolar single-crystal silicon thin-film transistor are formed in accordance with a wiring rule which is as strict as or more relaxed than the design rule of a metal wiring pattern on a large substrate.

With this arrangement, at least a part of the metal wiring can be processed simultaneously with the metal wiring on the large substrate, and hence the costs can be reduced and the processing power can be improved. Further, since a semiconductor device on which the bipolar single-crystal silicon thin-film transistor is formed can be easily connected to members such as other circuit blocks or a TFT array, it is possible to prevent the degradation of the production yields due to the alignment failure.

Further, according to the arrangement above, the semiconductor device of the present invention is preferably arranged in such a manner that, a thickness of the single-crystal silicon thin film of the bipolar single-crystal silicon thin-film transistor is about not more than 800 nm.

With this arrangement, it is possible to manufacture a bipolar single-crystal silicon thin-film transistor in which the variation of the characteristics is small and the ON-resistance is low.

Further, according to the arrangement above, the semiconductor device of the present invention is preferably arranged in such a manner that, the non-single-crystal silicon thin film is either a polycrystalline silicon thin film or a continuous grain silicon thin film, and a MOS thin-film transistor manufactured from the non-single-crystal silicon thin film includes a non-single-crystal silicon, a gate insulating film, and a gate on the insulating substrate in this order.

According to this arrangement, by forming a MOS thin-film transistor in which a gate is provided at the furthest from the insulating substrate, a self-aligning process using a conventional gate as a mask can be adopted, and hence a polycrystalline silicon thin film or a continuous grain silicon thin film can be easily manufactured and the production yields can be improved.

Further, according to the arrangement above, the semiconductor device of the present invention is preferably arranged in such a manner that, the non-single-crystal silicon thin film is either one of a polycrystalline silicon thin film or a continuous grain silicon thin film, and a MOS thin-film transistor manufactured from the non-single-crystal silicon thin film includes a gate, a gate insulating film, and a non-single-crystal silicon on the insulating substrate in this order.

With this arrangement, the MOS non-single-crystal silicon thin-film transistor is provided in an upend manner so that the influence of a fixed electric charge around the surface of the glass substrate can be avoided, and the characteristics can be stabilized. Further, the doping profile of the channel section can be arranged more freely, since micro-fabrication and doping can be performed in the manufacturing process of VLSI. Thus, taking countermeasures against the hot electron degradation becomes easy. Further, a thin, high-quality thermally-oxidized $SiO_2$ can be adopted, it is possible to obtain a gate oxidized film which is thinner and has better quality than an oxidized film formed at low temperatures by methods such as CVD, so that a TFT which excels in short-channel characteristics can be obtained. On this account, it is possible to increase the number of variations of arrangements for obtaining effects similar to the above.

Further, according to the arrangement above, the semiconductor device of the present invention is preferably arranged in such a manner that, the non-single-crystal silicon thin film is either one of a polycrystalline silicon thin film or a continuous grain silicon thin film, and a MOS thin-film transistor manufactured from the non-single-crystal silicon thin film includes a gate, a gate insulating film, and a non-single-crystal silicon on the insulating substrate in this order.

With this arrangement, by manufacturing a bottom-gate MOS or MIS thin-film transistor in which a gate is provided so as to be closest to the insulating substrate, it is possible to adopt conventionally known manufacturing processes, and hence the process of manufacturing an amorphous silicon thin film can be simplified, the costs for the process is reduced, and the productivity is improved. Also, in an active matrix LCD, the shading property regarding a backlight is improved so that a liquid crystal display device which can perform high-luminance displaying can be formed.

Moreover, since the amorphous silicon has low-OFF-current characteristics, it is possible to obtain a semiconductor device which can be adopted to a low-power-consumption LCD.

Further, according to the arrangement above, the semiconductor device of the present invention is preferably arranged in such a manner that, the non-single-crystal silicon thin film is an amorphous silicon thin film, and a MOS thin-film transistor or a MIS thin-film transistor, which is manufactured from the non-single-crystal silicon thin film, includes a non-single-crystal silicon, a gate insulating film, and a gate on the insulating substrate in this order.

With this arrangement, even if a MOS or MIS non-single-crystal silicon thin-film transistor is arranged in an upend manner with respect to a substrate, it is possible to increase the number of variations of arrangements for obtaining effects similar to the above, so that the degree of freedom for process designing increases.

Further, according to the arrangement above, the semiconductor device of the present invention is preferably arranged in such a manner that, a difference of linear expansion between a single-crystal silicon constituting the single-crystal silicon thin-film device and the insulating substrate is about not more than 250 ppm, within a temperature range from a substantially room temperature and 600° C.

With this arrangement, the difference of linear expansion between the insulating substrate and the single-crystal silicon thin film on the occasion of great temperature rise is reduced. Thus, in the step of forming the single-crystal silicon thin film on the insulating substrate, it is possible to certainly prevent (i) the crack of the insulating substrate caused by the difference of linear expansion coefficients, when cleavage stripping occurs at the dense position of implanted hydrogen ions in silicon to which hydrogen ions are implanted, (ii) the peeling-off from the bonded interface, and (iii) the crystal defect, thereby improving the heat adhesive strength.

Note that, the linear expansion is a standard of the variation of a length due to temperature variation.

Further, according to the arrangement above, the semiconductor device of the present invention is preferably arranged in such a manner that, the insulating substrate is a high strain point glass including an alkaline-earth alumino-borosilicate glass, and a SiO2 film is formed at least in an area on a surface of the insulating substrate, where the single-crystal silicon thin-film device is to be formed.

With this arrangement, since it is unnecessary to use a crystalline glass whose composition is modified in order to correspond to the bonding with the single-crystal silicon substrate, it is possible to make an insulating substrate from a high strain point glass typically used for an active matrix liquid crystal display panel, and hence a semiconductor device can be manufactured at low costs.

Further, according to the arrangement above, the semiconductor device of the present invention is preferably arranged in such a manner that, the insulating substrate is manufactured from at least one glass selected from the group consisting of a barium-borosilicate glass, a barium-alumino-borosilicate glass, an alkaline-earth alumino-borosilicate glass, a borosilicate glass, an alkaline-earth zinc-lead-alumino-borosilicate glass, and an alkaline-earth zinc-alumino-borosilicate glass.

According to this arrangement, since the insulating substrate is made from the above-described high strain point glass typically used for an active matrix liquid crystal display panel, it is possible to manufacture a semiconductor device suitable for an active matrix substrate, at low costs.

Further, according to the arrangement above, the semiconductor device of the present invention is preferably arranged in such a manner that, a margin of alignment of at least a part of a pattern on the single-crystal silicon is fine so as to be smaller than a margin of alignment of patterns on any one of an entire surface of a mother board, a display area, and an entirety of the non-single-crystal silicon thin-film device and the single-crystal silicon thin-film device.

With this arrangement, when, for instance, a metal wiring pattern which is equivalent to the pattern in the non-single-crystal silicon area is formed, it is possible to cause a part of the pattern to be aligned with a high-definition pattern in an area of the single-crystal silicon, using a high-definition exposure system.

Thus, with good production yields, it is possible to easily and efficiently connect a single-crystal silicon area with a high-definition pattern with a non-single-crystal area with a low-definition pattern, using a metal wiring pattern, etc.

Further, according to the arrangement above, the semiconductor device of the present invention is preferably arranged in such a manner that, an aligning mark formed on the single-crystal silicon is detected using visible light or light whose wavelength is shorter than the visible light, through a transparent substrate, and has a form which allows the aligning mark to be aligned with an aligning mark formed on the transparent substrate.

With this arrangement, since the aligning mark can be detected through the glass substrate, the optical resolution can be improved so that the alignment can be carried out more precisely than a conventional arrangement.

Further, to achieve the foregoing objectives, the semiconductor device of the present invention includes any one of the above-described SOI substrates each including a semiconductor device structure formed thereon. Here, the above-mentioned SOI substrates are semiconductor devices each including a semiconductor device structure formed thereon.

Further, to achieve the foregoing objectives, the display device of the present invention includes any one of the above-described semiconductor device, uses the semiconductor device as an active matrix substrate of a display panel.

Since, in the SOI substrate, the insulating substrate is a light-transmitting substrate, forming a semiconductor device structure on this insulating substrate allows the SOI substrate to be suitably used as an active matrix substrate for a display panel.

Moreover, since high-performance transistors with no variations can be obtained by adopting the foregoing SOI substrate, it is possible to provide a high-performance display device using this transistor.

In this manner, the characteristics of the transistor can be caused to be uniform, stabilized, and high-performance by adopting the single-crystal silicon, and hence it is possible to manufacture, for instance, a high-performance MOS field effect transistor device. On this account, using this transistor device, it is possible to manufacture a high-performance TFT-LCD display device and TFT-OLEDL display device.

Note that, the semiconductor device structure is, for instance, a structure as a switching device for displaying. Also, it is possible to manufacture an image processor by forming a semiconductor device structure on an SOI substrate.

To put it another way, for instance, the display device includes a switching element for displaying and an image processor which are manufactured using an insulating substrate partly having an SOI structure thereon, the insulating substrate being manufactured in such a manner that a light-transmitting substrate whose surface is covered with an oxidized silicon film is bonded with a single-crystal silicon substrate whose surface is oxidized, and then the single-crystal silicon substrate is separated at a predetermined interface by heat treatment.

Further, a method of manufacturing the semiconductor device of the present invention, in which a single-crystal silicon thin-film device manufactured from a single-crystal silicon thin film and a non-single-crystal silicon thin film are formed on an insulating substrate, is arranged in such a manner that, after a circuit including the single-crystal silicon thin-film device is formed on the insulating substrate, the non-single-crystal silicon thin film is formed.

According to this method, a single-crystal silicon thin-film device is formed on a flat insulating substrate, and then a non-single-crystal silicon thin film is formed. Thus, the defection due to alignment failure can be restrained so that a semiconductor device can be manufactured with good productive yields.

Further, according to the arrangement above, the method of manufacturing the semiconductor device of the present invention is preferably arranged in such a manner that, on the single-crystal silicon thin-film device, a protective interlayer insulating film, a contact hole, and a metal wiring are formed.

According to this method, since the single-crystal silicon thin-film device which is formed prior to the formation of the non-single-crystal silicon thin film has a metal wiring, microfabrication can be carried out so that the degree of density of circuit integration on the single-crystal silicon thin film can be greatly increased. Moreover, by an identical process, a metal wiring is also formed on the non-single-crystal silicon thin film which is formed after the formation of the single-crystal silicon thin-film device on the glass substrate, so that a semiconductor device with a double-metal-wiring arrangement can be efficiently manufactured by a simple process.

Further, according to the arrangement above, the method of manufacturing the semiconductor device of the present invention is preferably arranged in such a manner that, after the single-crystal silicon thin-film device is formed, an interlayer insulating film is formed, and then the non-single-crystal silicon thin film is formed.

According to this method, since the interlayer insulating film is formed between the single-crystal silicon thin-film device and the non-single-crystal silicon thin film, it is possible to certainly prevent the contamination of the single-crystal silicon of the single-crystal silicon thin film.

A method of manufacturing the semiconductor device of the present invention, in which a single-crystal silicon thin-film device manufactured from a single-crystal silicon thin film and a non-single-crystal silicon thin film are formed on an insulating substrate, is arranged such that, after the non-single-crystal silicon thin film is formed on the insulating substrate, the single-crystal silicon thin-film device is formed.

According to this method, since the non-single-crystal silicon thin film is formed prior to the formation of the single-crystal silicon thin-film device, the contamination and damage of the single-crystal silicon thin film are prevented, compared to a case that the non-single-crystal silicon thin film is formed after the formation of the single-crystal silicon thin-film device.

In a method of manufacturing a semiconductor device in which a single-crystal silicon thin-film device and a non-single-crystal silicon thin-film are formed on an insulating substrate, when the single-crystal silicon thin-film device is formed after the formation of the non-single-crystal silicon thin film on the insulating substrate, the surface of the insulating substrate, from which the non-single-crystal silicon is removed and to which the single-crystal silicon is to be bonded, is roughened up so that the micro-roughness increases and hence the adhesive strength deteriorates.

To solve this problem, in the method of manufacturing the semiconductor device of the present invention, at least the area to which the single-crystal silicon is to be bonded is planarized in advance by GCIB (Gas Cluster Ion Beam) using low-energy (about 3 Kev) halide (such as $CF_4$). When, further on this area, a $SiO_2$ film which is about 10 nm thick is formed by PECVD using TEOS or TMCTS (Tetramethylcyclotetrasiloxane), the bonding characteristics are further improved.

Further, according to the arrangement above, the method of manufacturing the semiconductor device of the present invention is preferably arranged in such a manner that, the single-crystal silicon thin-film device is a MOS single-crystal silicon thin-film transistor.

With this arrangement, for instance, when, for instance, a CMOS structure is adopted, it is possible to manufacture a semiconductor device in which the power consumption is reduced, an output voltage can swing up to the power-supply voltage, and the logic of low power consumption is adopted.

Further, according to the arrangement above, the method of manufacturing the semiconductor device of the present invention is preferably arranged in such a manner that, the single-crystal silicon thin-film device is a bipolar single-crystal silicon thin-film transistor.

With this arrangement, forming the bipolar transistor on the insulating substrate makes it possible to cause the arrangement of the single-crystal silicon thin film to be simpler than the arrangement in the case of a MOS transistor, and this enables the single-crystal silicon thin film to be bonded with the insulating film, without being subjected to planarization.

Further, according to the arrangement above, the method of manufacturing the semiconductor device of the present invention is preferably arranged in such a manner that, with respect to a single-crystal silicon substrate for manufacturing the single-crystal silicon thin-film device, a predetermined concentration of hydrogen ions is implanted for a predetermined depth.

With this arrangement, it is possible to easily form the single-crystal silicon thin-film device on the insulating substrate, without using an adhesive.

That is to say, when the single-crystal silicon thin-film device is formed on the insulating substrate, the dense position to which the hydrogen ions are implanted is formed and hence the adhesive strength with respect to the insulating substrate can be increased by increasing the temperature to be not less than the temperature of hydrogen dissociation from silicon. Then, by performing cleavage stripping at the dense position, it is possible to easily manufacture the bipolar single-crystal silicon thin-film transistor.

Note that, the above-mentioned predetermined depth is determined in accordance with a desired thickness of the single-crystal silicon thin film to be formed.

Further, according to the arrangement above, the method of manufacturing the semiconductor device of the present invention is preferably arranged in such a manner that, an energy for implanting the hydrogen ions is arranged so that an energy after subtracting an energy corresponding to a projection range of the hydrogen ions in a gate electrode material for a gate electrode thickness from an incident energy of the hydrogen ions is no more than an energy corresponding to a projection range of the heaviest ions of gate constituent materials for a gate oxide thickness.

With this arrangement, for instance, it is possible to prevent the occurrence of the following problem: In the MOS single-crystal silicon thin-film transistor, the hydrogen ions applied to the single-crystal silicon substrate collide with the materials of gate electrodes and atoms constituting the materials of the metal wiring, so that the atoms constituting the materials of the gate electrodes, which are knocked on due to the collision, pass through the oxidized film, and consequently reach the single-crystal silicon and contaminate the same.

Further, according to the arrangement above, the method of manufacturing the semiconductor device of the present invention is preferably arranged in such a manner that, a thickness of the single-crystal silicon substrate including the dense position is about not more than 100 µm.

With this arrangement, it is possible to cause the thickness of the single-crystal silicon layer to be about $1/10$ of the substrate, and since the flexural rigidity of the silicon substrate reduces, the surface of the substrate becomes able to deform in accordance with micro-roughness produced due to the roughness of the surface facing the glass substrate and particles on the surface, even if the bonding energy is identical, and hence the substrate is hardly influenced by the micro-roughness.

Thus, when the thickness is set as above, it is possible to significantly decrease the occurrence of alignment failure due to the roughness of the surface facing the glass substrate and the particles on the surface, without greatly undermining the handiness of a small and thin silicon substrate which has been separated.

Incidentally, the above-mentioned thickness is preferably about not more than 70 µm, and more preferably not more than 50 µm.

Further, according to the arrangement above, the method of manufacturing the semiconductor device of the present invention is preferably arranged in such a manner that, after the non-single-crystal silicon thin film is formed on the insulating substrate, at least a surface area from which the single-crystal silicon is removed and to which a single-crystal silicon is to be bonded is planarized in advance by performing a GCIB (Gas Cluster Ion Beam) using halide in approximately 3 keV.

With this arrangement, the surface of silicon or $SiO_2$ is lightly etched when low-energy (about 3 kev) GCIB of oxygen or halide is applied thereto, so that the micro-roughness on the surface is reduced.

For this reason, the success rate of the bonding is significantly improved, compared to the bonding of a conventional silicon substrate.

To achieve the foregoing objectives, a method of manufacturing the semiconductor device of the present invention, comprising the step of: (a) bonding an insulating film formed on an insulating substrate with a covering film with which a single-crystal silicon substrate is covered, is characterized by further comprising the step of: (b) before the step (a), regulating a tangent of a maximum slope of micro-roughness on a surface of the insulating film to a surface plane of the insulating substrate, measured in a 1-5 μm square, is not more than 0.06, the micro-roughness being not more than 5 nm in height.

The SOI substrate is manufactured in such a manner that, after the bonding step, the single-crystal silicon substrate is separated and stripped at the dense position and thus the single-crystal silicon thin film is formed. That is to say, the above-described manufacturing method is also a method of manufacturing an SOI substrate. That is to say, according to the manufacturing method, a semiconductor device is manufactured either by forming a semiconductor device structure on a single-crystal silicon thin film on the SOI substrate, or manufacturing a single-crystal silicon thin film from a single-crystal silicon substrate in which a semiconductor device structure is formed.

According to the manufacturing method, after the micro-roughness on the surface of the insulating film is arranged so that the tangent of the maximum slope of micro-roughness on a surface of the insulating film to a surface plane of the insulating substrate, measured in a 1-5 μm square, is not more than 0.06, the insulating film is bonded with the covering film with which the single-crystal silicon substrate is covered. With this arrangement, the bonding characteristics are good so that the adhesive strength is improved. Thus, the peeling of the film does not occur when the single-crystal silicon substrate is separated and stripped in order to form the single-crystal silicon thin film, after the bonding step.

In contrast, when the above-mentioned tangent is not less than 0.06, the adhesive strength at the bonded interface between the films is not more than 0.2 N/m. In this case, the peeling of a part of the film is observed after the stripping, separation, and annealing are performed.

Incidentally, in the regulating step, it is preferable to, for instance, appropriately set the thickness of the insulating film on the insulating substrate and the condition of the formation of the film. When these factors are properly set, it is possible to certainly cause the tangent of the insulating film to the surface of the insulating substrate to be not more than 0.06. Note that, the insulating film is preferably not too thick. For instance, when the thickness of an oxidized silicon film as an insulating film is not less than 500 nm, it is preferable that the oxidized silicon film is polished after the formation thereof. The thickness of the oxidized film is, for instance, preferably about 100 nm.

Moreover, the tangent of the insulating film to the surface of the insulating substrate is preferably not more than 0.04. This arrangement makes it possible to prevent the peeling of the film with more certainty.

Further, in the arrangement above, it is preferable that a step of arranging the contact angles of the insulating film and the covering film with respect to water is not more than 10° is included.

With this arrangement, the bonding characteristics between the insulating film and the covering film is improved and the adhesive strength is certainly enhanced, so that a method of manufacturing an SOI substrate in which the film peeling is further restrained can be realized.

The method of manufacturing the SOI substrate can be seen as a method of manufacturing the SOI substrate, including such a step that a temperature of the dense position of implanted hydrogen ions of the single-crystal silicon substrate is raised to be not less than the temperature of hydrogen dissociation from silicon, by applying light including laser light, and the single-crystal silicon substrate is separated along the dense position.

According to this arrangement, since the temperature of the dense position of the single-crystal silicon substrate is increased by applying light including laser light, only the temperature around the dense position can be increased so that the destruction of the single-crystal silicon can be restrained.

Further, the method of manufacturing the SOI substrate can be seen as a method of manufacturing the SOI substrate, which includes a step of separating the single-crystal silicon substrate along the dense position, by performing lamp annealing in which the maximum temperature is about not less than 850° C.

After the above-described arrangement, lamp annealing which is rapid thermal annealing (RTA) in which the maximum temperature is about not less than 850° C. is carried out and the single-crystal silicon substrate is exfoliated at the depth at which hydrogen ions are implanted. With this arrangement, the bonding strength is further enhanced, and since the damage due to the hydrogen ion implantation on the peeling interface and inside the single-crystal silicon thin film, the characteristics of the transistor are improved.

Incidentally, the higher the maximum temperature of the lamp annealing is, the more the characteristics of the transistor are improved. However, the higher the maximum temperature of the lamp annealing is, the more the warpage, expansion and contraction of the insulating substrate become serious. Thus, when, for instance, the size of the substrate is about 300 mm per side, the annealing is carried out for about 5 minutes at a temperature about 700° C.

Further, the method of manufacturing the SOI substrate can be seen as a method of manufacturing the SOI substrate arranged such that by implanting hydrogen ions which are much lighter than oxygen ions, the crystalline on the entire surface of the single-crystal silicon substrate is not significantly changed even after the implantation.

According to the arrangement above, by performing heat treatment at a temperature about 600° C. in the TFT manufacturing step after the stripping, the condition of the crystalline of the single-crystal silicon thin film is recovered to be the level before the implantation of the hydrogen ions. Unlike the case of implanting oxygen ions, this treatment does not cause the degradation of the crystalline of the silicon.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
a non-single-crystal silicon thin-film device manufactured from a non-single-crystal silicon thin film and
a single-crystal silicon thin-film device manufactured from a single-crystal silicon thin film, wherein the non-single-crystal silicon thin-film device and the single-crystal silicon thin-film device are provided in different areas of an insulating substrate, wherein the non-single-crystal silicon thin-film is the first non-single-crystal silicon thin-film layer above the insulating substrate, and wherein the non-single-crystal silicon thin-film and the single-crystal silicon thin-film are each vertically separated from the insulating substrate by a space, or at least one other layer, such that a surface of the non-single-crystal silicon thin-film that is nearest to the insulating substrate and a surface of the single-crystal silicon thin-film that is nearest to the insulating substrate are at different heights above the insulating substrate.

2. The semiconductor device as defined in claim 1, wherein, each of the non-single-crystal silicon thin-film device and the single-crystal silicon thin-film device is either a MOS thin-film transistor or a MIS thin-film transistor.

3. The semiconductor device as defined in claim 2, wherein, in the MOS thin-film transistor, a gate, a gate insulating film, and a silicon film are formed on the insulating substrate in this order.

4. The semiconductor device as defined in claim 2, wherein, a thickness of a silicon thin film of the MOS thin-film transistor is about not more than 600 nm.

5. The semiconductor device as defined in claim 2, wherein, a thickness of a single-crystal silicon thin film of the MOS thin-film transistor is about not more than 100 nm.

6. The semiconductor device as defined in claim 2, wherein, a metal pattern of the MOS single-crystal silicon thin-film transistor is formed under a wiring rule which is more relaxed than a wiring rule of a gate pattern of the MOS single-crystal silicon thin-film transistor.

7. The semiconductor device as defined in claim 1, wherein the single-crystal silicon thin-film device is bonded with the insulating substrate via an intervening inorganic insulating film.

8. The semiconductor device as defined in claim 7, wherein the bond between the single-crystal silicon thin-film device and the intervening inorganic insulating film is a siloxane bond.

9. The semiconductor device as defined in claim 7, wherein, the non-single-crystal silicon thin-film device is either a MOS non-single-crystal silicon thin-film transistor or a MIS non-single-crystal silicon thin-film transistor, and the single-crystal silicon thin-film device is a bipolar single-crystal silicon thin-film transistor.

10. The semiconductor device as defined in claim 7, wherein, the non-single-crystal silicon thin-film device is either a MOS non-single-crystal silicon thin-film transistor or a MIS non-single-crystal silicon thin-film transistor, and the single-crystal silicon thin-film device includes at least either one of a MOS single-crystal silicon thin-film transistor and a bipolar single-crystal silicon thin-film transistor.

11. The semiconductor device as defined in claim 7, wherein, the non-single-crystal silicon thin-film device is either a MOS non-single-crystal silicon thin-film transistor or a MIS non-single-crystal silicon thin-film transistor, and the single-crystal silicon thin-film device includes a MOS single-crystal silicon thin-film transistor, and an image sensor including a Schottky or PN-junction diode or a CCD image sensor.

12. The semiconductor device as defined in claim 10, wherein, a thickness of a single-crystal silicon thin-film of the MOS single-crystal silicon thin-film transistor is thinner than a thickness of a single-crystal silicon thin film of the bipolar single-crystal silicon thin-film transistor.

13. The semiconductor device as defined in claim 9, wherein, the bipolar single-crystal silicon thin-film transistor has such a structure that a base area, a collector area, and an emitter area are formed and provided in one plane.

14. The semiconductor device as defined in claim 9, wherein, a thickness of the single-crystal silicon thin film of the bipolar single-crystal silicon thin-film transistor is about not more than 800 nm.

15. The semiconductor device as defined in claim 1, wherein, the non-single-crystal silicon thin film is either a polycrystalline silicon thin film or a continuous grain silicon thin film, and a MOS thin-film transistor manufactured from the non-single-crystal silicon thin film includes a non-single-crystal silicon film, a gate insulating film, and a gate on the insulating substrate in this order.

16. The semiconductor device as defined in claim 1, wherein, the non-single-crystal silicon thin film is either one of a polycrystalline silicon thin film or a continuous grain silicon thin film, and a MOS thin-film transistor manufactured from the non-single-crystal silicon thin film includes a gate, a gate insulating film, and a non-single-crystal silicon film on the insulating substrate in this order.

17. The semiconductor device as defined in claim 1, wherein, the non-single-crystal silicon thin film is an amorphous silicon thin film, and a MOS thin-film transistor or a MIS thin-film transistor, which is manufactured from the non-single-crystal silicon thin film, includes a gate, a gate insulating film, and a non-single-crystal silicon film on the insulating substrate in this order.

18. The semiconductor device as defined in claim 1, wherein, the non-single-crystal silicon thin film is an amorphous silicon thin film, and a MOS thin-film transistor or a MIS thin-film transistor, which is manufactured from the non-single-crystal silicon thin film, includes a non-single-crystal silicon film, a gate insulating film, and a gate on the insulating substrate in this order.

19. The semiconductor device as defined in claim 1, wherein, a difference of linear expansion between a single-crystal silicon constituting the single-crystal silicon thin-film device and the insulating substrate is about not more than 250 ppm, within a temperature range from a substantially room temperature to 600° C.

20. The semiconductor device as defined in claim 1, wherein, the insulating substrate is a high strain point glass including an alkaline-earth alumino-borosilicate glass, and a SiO2 film is formed at least in an area on a surface of the insulating substrate, where the single-crystal silicon thin-film device is to be formed.

21. The semiconductor device as defined in claim 1, wherein, the insulating substrate is manufactured from at least one glass selected from the group consisting of a barium-borosilicate glass, a barium-alumino-borosilicate glass, an alkaline-earth alumino-borosilicate glass, a borosilicate glass, an alkaline-earth zinc-lead-alumino-borosilicate glass, and an alkaline-earth zinc-alumino-borosilicate glass.

22. The semiconductor device as defined in claim 1, wherein, an aligning mark formed on the single-crystal silicon is detected using visible light or light whose wavelength is shorter than the visible light, through a transparent substrate, and has a form which allows the aligning mark to be aligned with an aligning mark formed on the transparent substrate.

23. A semiconductor device, comprising; a non-single-crystal silicon thin-film device manufactured from a non-single-crystal silicon thin film and a single-crystal silicon thin-film device manufactured from a single-crystal silicon thin film, wherein the non-single-crystal silicon thin-film device and the single-crystal silicon thin-film device are provided in different areas of an insulating substrate, wherein the single-crystal silicon thin-film device is bonded with the insulating substrate via an intervening inorganic insulating film, wherein, the non-single-crystal silicon thin-film device is either a MOS non-single-crystal silicon thin-film transistor or a MIS non-single-crystal silicon thin-film transistor, and the single-crystal silicon thin-film device is a bipolar single-crystal silicon thin-film transistor, and wherein, a metal wiring and a contact pattern of the bipolar single-crystal silicon thin-film transistor include respective parts each being formed in accordance with a wiring rule which is more relaxed than a wiring rule of a base pattern of the bipolar single-crystal silicon thin-film transistor.

24. A semiconductor device, comprising: a non-single-crystal silicon thin-film device manufactured from a non-single-crystal silicon thin film and a single-crystal silicon thin-film device manufactured from a single-crystal silicon thin film, wherein the non-single-crystal silicon thin-film device and the single-crystal silicon thin-film device are provided in different areas of an insulating substrate, and wherein, a margin of alignment of at least a part of a pattern on the single-crystal silicon is fine so as to be smaller than a margin of alignment of patterns on any one of an entire surface of a mother board, a display area, and an entirety of the non-single-crystal silicon thin-film device and the single-crystal silicon thin-film device.

* * * * *